US010011769B2

(12) United States Patent
Hong et al.

(10) Patent No.: US 10,011,769 B2
(45) **Date of Patent: *Jul. 3, 2018**

(54) SEMICONDUCTOR LIGHT EMITTING DEVICE, BACKLIGHT, COLOR IMAGE DISPLAY DEVICE AND PHOSPHOR TO BE USED FOR THEM

(71) Applicant: MITSUBISHI CHEMICAL CORPORATION, Chiyoda-ku (JP)

(72) Inventors: Byungchul Hong, Yokohama (JP); Naoki Sako, Yokohama (JP); Naoto Kijima, Yokohama (JP); Masahiko Yoshino, Yokohama (JP); Takashi Hase, Yokohama (JP); Fumiko Yoyasu, Yokoshima (JP); Kentarou Horibe, Ushiku (JP)

(73) Assignee: Mitsubishi Chemical Corporation, Chiyoda-ku (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/357,507

(22) Filed: Nov. 21, 2016

(65) Prior Publication Data

US 2017/0158957 A1 Jun. 8, 2017

Related U.S. Application Data

(60) Continuation of application No. 13/913,602, filed on Jun. 10, 2013, now Pat. No. 9,541,238, which is a (Continued)

(30) Foreign Application Priority Data

Feb. 7, 2008 (JP) ................................ 2008-027506
Sep. 5, 2008 (JP) ................................ 2008-227990

(51) Int. Cl.
*C09K 11/61* (2006.01)
*C09K 11/77* (2006.01)
(Continued)

(52) U.S. Cl.
CPC ...... *C09K 11/7739* (2013.01); *C09K 11/0883* (2013.01); *C09K 11/675* (2013.01);
(Continued)

(58) Field of Classification Search
CPC ..................................................... C09K 11/61
(Continued)

(56) References Cited

U.S. PATENT DOCUMENTS 3,576,756 A 4/1971 Russo
6,809,781 B2 10/2004 Setlur et al.
(Continued)

FOREIGN PATENT DOCUMENTS

CN 101158777 A 4/2008
JP 2002-171000 6/2002
(Continued)

OTHER PUBLICATIONS

Akihiro Mori, Monthly Display, pp. 42-46 (Apr. 2003).
(Continued)

*Primary Examiner* — Christopher Raabe
(74) *Attorney, Agent, or Firm* — Oblon, McClelland, Maier & Neustadt, L.L.P.

(57) ABSTRACT

To provide a semiconductor light emitting device which is capable of accomplishing a broad color reproducibility for an entire image without losing brightness of the entire image.
A light source provided on a backlight for a color image display device has a semiconductor light emitting device comprising a solid light emitting device to emit light in a blue or deep blue region or in an ultraviolet region and
(Continued)

phosphors, in combination. The phosphors comprise a green emitting phosphor and a red emitting phosphor. The green emitting phosphor and the red emitting phosphor are ones, of which the rate of change of the emission peak intensity at 100° C. to the emission intensity at 25° C., when the wavelength of the excitation light is 400 nm or 455 nm, is at most 40%.

13 Claims, 21 Drawing Sheets

Related U.S. Application Data division of application No. 12/601,829, filed as application No. PCT/JP2009/052099 on Feb. 6, 2009, now Pat. No. 8,491,816.

(51) Int. Cl.

| | |
|---|---|
| ***H01L 33/50*** | (2010.01) |
| ***C09K 11/67*** | (2006.01) |
| ***C09K 11/08*** | (2006.01) |
| *G02F 1/1335* | (2006.01) |
| *G02F 1/1368* | (2006.01) |
| *F21V 8/00* | (2006.01) |
| *F21V 3/04* | (2018.01) |
| *F21Y 115/10* | (2016.01) |
| *F21V 3/06* | (2018.01) |

(52) U.S. Cl.

CPC ........ *C09K 11/7734* (2013.01); *H01L 33/502* (2013.01); *F21V 3/0436* (2013.01); *F21V 3/062* (2018.02); *F21Y 2115/10* (2016.08); *G02B 6/0043* (2013.01); *G02B 6/0053* (2013.01); *G02B 6/0073* (2013.01); *G02F 1/1368* (2013.01); *G02F 1/133514* (2013.01); *G02F 1/133528* (2013.01)

(58) Field of Classification Search

USPC .................................... 252/301.4 R, 301.4 F

See application file for complete search history.

(56) References Cited

U.S. PATENT DOCUMENTS

| | | | | |
|---|---|---|---|---|
| 7,271,423 | B2 | 9/2007 | Hanamoto et al. | |
| 7,497,973 | B2 | 3/2009 | Radkov et al. | |
| 9,541,238 | B2 * | 1/2017 | Hong | C09K 11/616 |
| 2002/0009536 | A1 | 1/2002 | Iguchi et al. | |
| 2002/0113226 | A1 | 8/2002 | Takehara et al. | |
| 2004/0218115 | A1 | 11/2004 | Kawana et al. | |
| 2006/0001352 | A1 | 1/2006 | Maruta et al. | |
| 2006/0071589 | A1 | 4/2006 | Radkov | |
| 2006/0097245 | A1 | 5/2006 | Aanegola et al. | |
| 2006/0169998 | A1 | 8/2006 | Radkov et al. | |
| 2007/0114562 | A1 | 5/2007 | Radkov et al. | |
| 2007/0205712 | A1 | 9/2007 | Radkov et al. | |
| 2007/0241657 | A1 | 10/2007 | Radkov et al. | |
| 2008/0042156 | A1 | 2/2008 | Hanamoto et al. | |
| 2008/0212305 | A1 | 9/2008 | Kawana et al. | |
| 2008/0272688 | A1 | 11/2008 | Yoshimura | |
| 2009/0140630 | A1 | 6/2009 | Kijima et al. | |
| 2009/0322990 | A1 | 12/2009 | Kawana et al. | |

FOREIGN PATENT DOCUMENTS

| | | |
|---|---|---|
| JP | 2003-167113 | 6/2003 |
| JP | 2004-163902 | 6/2004 |
| JP | 2005-82788 | 3/2005 |
| JP | 2006-47975 | 2/2006 |
| JP | 2006-184427 | 7/2006 |
| JP | 2006-309209 | 11/2006 |
| JP | 2006-310131 | 11/2006 |
| JP | 2006-310817 | 11/2006 |
| JP | 2007-5781 | 1/2007 |
| JP | 2007-25657 | 2/2007 |
| JP | 2007-277277 | 10/2007 |
| JP | 2007-312374 | 11/2007 |
| JP | 2008-21868 | 1/2008 |
| JP | 2008-120938 | 5/2008 |
| JP | 2008-137865 | 6/2008 |
| JP | 2008-189700 | 8/2008 |
| JP | 2009-65145 | 3/2009 |
| JP | 2009-528429 | 8/2009 |
| WO | WO 2005/111707 A1 | 11/2005 |
| WO | WO 2009/005035 A1 | 1/2009 |
| WO | WO 2009/101578 A1 | 8/2009 |
| WO | WO 2009/107056 A2 | 9/2009 |
| WO | WO 2009/110285 A1 | 9/2009 |
| WO | WO 2009/119486 A1 | 10/2009 |

OTHER PUBLICATIONS

Sadao Adachi, et al, "Direct Synthesis of $K_2SiF_6$:$Mn^{4+}$Red Phosphor from Crushed Quartz Schist by Wet Chemical Etching", Electrochemical and Solid State Letters, vol. 12, No. 2, pp. J20-J23 (2009).

Toru Takahashi, et al. "Synthesis of $K_2SiF_6$:$Mn^{4+}$Red Phosphor from Silica Glasses by Wet Chemical Etching in HF/$KMnO_4$ Solution", Electrochemical and Solid State Letters, vol. 12, No. 8,pp. J69-J71 (2009).

Office Action dated Nov. 13, 2012 in European Patent Application No. 09 709 175.5.

Office Action dated Aug. 28, 2012, in Chinese Patent Application No. 200980104345.9 (with English language translation).

Extended European Search Report dated Feb. 2, 2012, in European Patent Application No. 09709175.5.

Paulusz, A.G., "Efficient Mn(IV) Emission in Fluorine Coordination", J. Electrochem. Soc.: Solid-State Science and Technology, vol. 120, No. 7, pp. 942-947 (Jul. 1073).

Takahashi, T., et al., "$Mn^{4+}$—Activated Red Photoluminescence in $K_2SiF_6$ Phosphor", Journal of Electrochemical Society, vol. 155, No. 12, pp. E183-E188 (Oct. 13, 2008).

Adachi, S., et al., "Direct Synthesis and Properties of $K_2SiF_6$:$Mn^{4+}$Phosphor by Wet Chemical Etching of Si Wafer", Journal of Applied Physics, vol. 104, pp. 023512-1-023512-3 (Jul. 18, 2008).

Japanese Office Action dated Apr. 16, 2013, in Japan Patent Application No. 2009-026153 (with English translation).

Office Action dated Dec. 29, 2014 in the corresponding Korean Patent Application No. 2010-7016473 (with English Translation).

Office Action dated May 7, 2015 in Korean Patent Application No. 10-2015-7005353 (with English language translation).

MSDS of Potassium Hexafluorosilicate.

Notice of Reasons for Refusal in corresponding Japanese Application No. 2015-222075, dated Oct. 18, 2016. (w/English translation).

Office Action dated Mar. 18, 2014 in Japanese Patent Application No. 2009-204785 (with English translation).

Extended European Search Report dated Jun. 2, 2016 in Patent Application No. 16159186.2.

Third Party submission (Information Statement) dated Sep. 7, 2016, corresponding to Japanese Application No. 2015-222075. (w/English translation).

* cited by examiner

Comparative Example II-1-1

(a) Example II-1-1

(b) Example II-1-2

(c) Example II-1-9

(a) Comparative Example II-1-1

SEMICONDUCTOR LIGHT EMITTING DEVICE, BACKLIGHT, COLOR IMAGE DISPLAY DEVICE AND PHOSPHOR TO BE USED FOR THEM

CONTINUING APPLICATION INFORMATION

This application is a continuation of U.S. application Ser. No. 13/913,602, filed on Jun. 10, 2013, now U.S. Pat. No. 9,541,238, which is a divisional of U.S. application Ser. No. 12/601,829, filed on Nov. 25, 2009, now U.S. Pat. No. 8,491,816, which is a National Stage of PCT/JP2009/052099 filed on Feb. 6, 2009, each of which are incorporated herein by reference. This application also claims the benefit of JP 2008-027506 filed on Feb. 7, 2008, and JP 2008-227990 filed on Sep. 5, 2008.

TECHNICAL FIELD

The present invention relates to a semiconductor light emitting device useful for a color image display device to realize an image with a high color purity, and a backlight employing it. Further, the present invention relates to a color image display device to realize an image with a high color purity to meet with the emission wavelength of an improved backlight, a novel phosphor suitable for such a semiconductor light emitting device and a process for its production.

BACKGROUND ART

In recent years, liquid crystal display devices are used not only in the conventional application to personal computer monitors but also in application to ordinary color televisions. The color reproduction range of the color liquid crystal display devices is determined by colors of light emitted from the red, green and blue pixels and, where chromaticity points of the respective color pixels in the CIE XYZ colorimetric system are represented by $(x_R, y_R)$, $(x_G, y_G)$ and $(x_B, y_B)$, the color reproduction range is represented by an area of a triangle defined by these three points on an x-y chromaticity diagram. Namely, the larger the area of this triangle, the more vivid color image the display devices reproduce. The area of this triangle is normally expressed by a ratio of the area of the triangle to an area of a reference triangle formed by three points of the three primary colors, red (0.67, 0.33), green (0.21, 0.71) and blue (0.14, 0.08), in the standard system defined by U.S. National Television System Committee (NTSC) (in unit of %, which will be referred to hereinafter as "NTSC ratio"). The ordinary notebook computers have the values of approximately 40 to 50%, the desktop computer monitors the values of 50 to 60%, and the existing liquid crystal TVs the values of approximately 70%.

A color image display device utilizing such a color liquid crystal display device is constituted mainly by light shutters utilizing liquid crystal, a color filter having red, green and blue pixels, and a backlight for transmissive illumination, and the colors of lights emitted from the red, green and blue pixels are determined by the emission wavelength of the backlight and the spectroscopic curve of the color filter.

In the color liquid crystal display devices, the color filter extracts only wavelengths in necessary regions from the emission distribution of the backlight, to provide the red, green and blue pixels.

Methods for production of this color filter proposed heretofore include such methods as dyeing, pigment dispersion, electrodeposition, printing, ink jetting and so on. The colorants for coloring used to be dyes, but are now pigments in view of reliability and durability as liquid crystal display devices. Accordingly, at present, the pigment dispersion is most commonly used as a method for production of the color filter from the viewpoint of productivity and performance. In general, when the same colorants are used, the NTSC ratio and the brightness are in a trade-off relation, and the colorants are suitably selected for use depending on the particular application. Namely, if it is attempted to increase the NTSC ratio by adjusting the color filter in order to reproduce a vivid color image, the screen tends to be dark. Inversely, if the brightness is increased, the NTSC ratio tends to be low, and it tends to be difficult to reproduce a vivid image.

On the other hand, as a backlight, it has been common to employ one using as a light source a cold-cathode tube with emission wavelengths in the red, green and blue wavelength regions and using an optical waveguide plate for converting light emitted from this cold-cathode tube, to a white surface light source. In recent years, a light emitting diode (LED) has been used, since it has a longer operating life, requires no inverter, presents high brightness, is mercury free, etc.

Here, in a backlight employing conventional LED, blue light-emitting LED is used in such a manner that part of light emitted from this LED is converted to yellow light by a yellow-emitting phosphor, and white light obtained by color mixing of the blue light and the yellow light is used as a surface light source by means of an optical waveguide.

However, in the above light source, the yellow emitting phosphor was used, whereby emission with wavelengths unnecessary from the viewpoint of the color purity of red and green was substantial, and it was difficult to obtain a display with high color reproducibility (High Gamut). Here, it is possible, at least in principle, to increase the color purity of red and green by cutting off light with unnecessary wavelengths by means of a color filter, but as mentioned above, if it is attempted to increase the NTSC ratio by adjusting the color filter in order to reproduce the vivid color image, the majority of emission of the backlight will be cut off, whereby there has been a problem that the brightness decreases substantially. Especially, by this method, emission of red decreases substantially, whereby it has been practically impossible to reproduce a strongly reddish color.

In order to overcome this problem, a method of combining red-, green- and blue-emitting LEDs (Non-Patent Document 1) has been proposed, and by this method, a display having an extremely high color reproducibility has been prepared on a trial basis. However, in such a color image display device, LED chips independent for red, green and blue, respectively, are combined, whereby there have been problems such that 1) it takes time and labor to mount them, 2) since the respective LED chips for red, green and blue are disposed at finite distances, it is required to take the distance of an optical waveguide to be long to sufficiently mix emitted lights from the respective LED chips, and 3) since the white chromaticity is adjusted by combining the integral multiple of the respective LED chips, adjustment of the white balance can not be continuously carried out.

Further, Patent Document 1 discloses a color image display device having an NTSC ratio of at least 60%, which is constituted by a combination of a blue or deep blue emitting LED and a phosphor. With this color image display device, a broad color reproducibility may be attained as compared with the above mentioned yellow emitting phosphor, but emitted lights with wavelengths which are unnecessary from the viewpoint of the color purity of red and green, are substantial, and a still broader color reproducibility has been desired.

Further, Patent Documents 2 and 3 disclose semiconductor light emitting devices having specific phosphors combined, which is useful, for example, as a light source for backlight for e.g. liquid crystal displays. However, in a case where such semiconductor light emitting devices are practically combined with color filters to constitute color image display devices for e.g. liquid crystal displays, there have been cases where the emission of backlight tends to be inadequate, or chromaticity deviation is likely to occur.

On the other hand, WO2004/25359 (Patent Document 4) discloses that an image display device having a high NTSC ratio is obtainable by a combination of a light source for backlight satisfying specific conditions with a color filter. However, with respect to the demand for high performance in recent years, the specifically disclosed light emitting device employing the $3.5MgO.0.5MgF_2.GeO_2:Mn^{4+}$ type, $Y_2O_3:Eu$ type and $YVO_4:Eu^{3+}$ type phosphors, is inadequate from the viewpoint of the emission efficiency, etc., and it is desired to develop one having higher performance.

Further, in recent years, a light emitting device employing $K_2TiF_6:Mn$ has been known as a red emitting phosphor (Patent Documents 5 to 7). However, by a study by the present inventors, it has been found that such a light emitting device undergoes substantial deterioration of the properties and is not practically durable for a reason assumed to be such that hydrogen fluoride is generated by the reaction with moisture in air, and it has been desired to develop one having a higher performance.

Further, with a view to suppressing deterioration of phosphors, it is known to cover the surface of water-soluble phosphor particles with a coating of e.g. a metal oxide (Patent Document 8), but such a method requires a special apparatus and is inadequate from the viewpoint of the types of the useful phosphors, etc.

Non-Patent Document 1: Monthly display, April 2003 issue (p 42-46)
Patent Document 1: WO2005/111707
Patent Document 2: JP-A-2002-171000
Patent Document 3: U.S. Pat. No. 6,809,781
Patent Document 4: WO2004/025359
Patent Document 5: U.S. Patent Application Publication No. 2006/0071589
Patent Document 6: U.S. Patent Application Publication No. US 2006/0169998
Patent Document 7: U.S. Patent Application Publication No. US 2007/0205712
Patent Document 8: JP-A-2005-82788

DISCLOSURE OF THE INVENTION

Technical Problem

The present invention has been made in view of the above-described situation and has an object to provide a semiconductor light emitting device which, particularly when used as a backlight for a color image display device, is capable of accomplishing broad color reproducibility as an entire image by adjustment with a color filter, without impairing brightness of the image, and at the same time, by carrying out the red, green and blue emissions by one chip, is free from impairing the productivity in its mounting and which further facilitates adjustment of the white balance. Further, the present invention has an object to provide a backlight and color image display device employing such a semiconductor light emitting device. In addition, the present invention has an object to provide a narrow band red emitting phosphor which may be preferably used for such a semiconductor light emitting device and a process for its production.

Solution to Problem

As a result of an extensive study, the present inventors have found that the cause of the inadequate emission of a backlight for a color image display device or of the chromaticity deviation, is attributable to the characteristics of phosphors and can be solved by improvement of the phosphors. Further, it has been found it possible to closely relate the NTSC ratio and the light use efficiency to represent the performance of the entire color image display device. Heretofore, as described above, the NTSC ratio and the light use efficiency were in a trade-off relation, and in a case where the performance of a color image display device is to be improved, the primary emphasis was placed on either improvement of the NTSC ratio at the sacrifice of the light use efficiency or improvement of the light use efficiency at the sacrifice of NTSC ratio.

The present inventors have found a light emitting device whereby it is possible to set the light emission efficiency to be higher than ever by combining a plurality of phosphors having improved emission wavelengths and light emission (excitation) can be efficiently carried out by a light emitting device having specific emission wavelengths. In addition, they have found it possible to realize a semiconductor light emitting device having high durability by adopting a specific construction of the device. Further, they have found it possible to realize a semiconductor light emitting device with higher luminance when specific phosphors are selectively employed among them.

Further, they have found it possible to realize a color image display device which is capable of realizing an image display having high color purity i.e. which has a light use efficiency higher than ever even at a high NTSC ratio, by using such a semiconductor light emitting device as a backlight and combining such a backlight with a color filter most suitable for the emission wavelengths of the backlight.

The present invention has been made on the basis of such discoveries and provides the following.

1. A semiconductor light emitting device comprising a solid light emitting device to emit light in a blue or deep blue region or in an ultraviolet region and phosphors, in combination, wherein said phosphors comprise a green emitting phosphor having at least one emission peak in a wavelength region of from 515 to 550 nm and a red emitting phosphor having at least one emission peak with a half-value width of at most 10 nm in a wavelength region of from 610 to 650 nm, having substantially no excitation spectrum in the emission wavelength region of said green emitting phosphor and containing $Mn^{4+}$ as an activated element, and said green emitting phosphor and said red emitting phosphor are ones, of which the variation rate of the emission peak intensity at 100° C. to the emission intensity at 25° C., when the wavelength of the excitation light is 400 nm or 455 nm, is at most 40%.

2. The semiconductor light emitting device according to the above 1, wherein the green emitting phosphor contains at least one compound selected from the group consisting of an aluminate phosphor, a sialon phosphor and an oxynitride phosphor.

3. The semiconductor light emitting device according to the above 1, wherein the red emitting phosphor is one, of which the variation rate of the emission peak intensity at 100° C. to the emission peak intensity at 25° C., when the wavelength of the excitation light is 455 nm, is at most 18%.

4. The semiconductor light emitting device according to the above 1, wherein the red emitting phosphor has a main emission peak with a half-value width of at most 10 nm in a wavelength region of from 610 to 650 nm.

5. The semiconductor light emitting device according to the above 1, wherein the red emitting phosphor is a fluoride complex phosphor, and said solid light emitting device is formed on an electrically conductive substrate.

6. The semiconductor light emitting device according to the above 5, wherein the red emitting phosphor is one, of which the thermally decomposed fluorine amount per 1 g of the phosphor at 200° C. is at least 0.01 μg/min.

7. The semiconductor light emitting device according to the above 6, wherein the red emitting phosphor is one, of which the solubility in 100 g of water at 20° C. is at least 0.005 g and at most 7 g.

8. The semiconductor light emitting device according to the above 1, wherein the red emitting phosphor is a fluoride complex phosphor, and the semiconductor light emitting device is provided with a layer containing said red emitting phosphor and has at least one of the following structures (a) to (c):

(a) a layer of a material not containing said red emitting phosphor is present between the solid light emitting device and the layer containing said red emitting phosphor, (b) part or whole of the surface of the light emitting device is covered by a layer of a material not containing said red emitting phosphor, and (c) the layer containing said red emitting phosphor is covered by a layer of a material not containing said red emitting phosphor.

9. The semiconductor light emitting device according to the above 8, wherein the red emitting phosphor is one, of which the thermally decomposed fluorine amount per 1 g of the phosphor at 200° C. is at least 0.01 μg/min.

10. The semiconductor light emitting device according to the above 9, wherein the red emitting phosphor is one, of which the solubility in 100 g of water at 20° C. is at least 0.005 g and at most 7 g.

11. The semiconductor light emitting device according to any one of the above 1 to 10, wherein the red emitting phosphor contains a crystal phase having a chemical composition represented by any one of the following formulae (1) to (8):

$$M^{I}_2[M^{IV}_{1-x}R_xF_6] \quad (1)$$

$$M^{I}_3[M^{III}_{1-x}R_xF_6] \quad (2)$$

$$M^{II}[M^{IV}_{1-x}R_xF_6] \quad (3)$$

$$M^{I}_3[M^{IV}_{1-x}R_xF_7] \quad (4)$$

$$M^{I}_2[M^{III}_{1-x}R_xF_5] \quad (5)$$

$$Zn_2[M^{III}_{1-x}R_xF_7] \quad (6)$$

$$M^{I}[M^{III}_{2-2x}R_{2x}F_7] \quad (7)$$

$$Ba_{0.85}Zr_{0.35}F_{2.70}:Mn^{4+} \quad (8)$$

In the formulae (1) to (8), $M^I$ is at least one monovalent group selected from the group consisting of Li, Na, K, Rb, Cs and $NH_4$, $M^{II}$ is an alkaline earth metal element, $M^{III}$ is at least one metal element selected from the group consisting of Groups 3 and 13 of the Periodic Table, $M^{IV}$ is at least one metal element selected from the group consisting of Groups 4 and 14 of the Periodic Table, R is an activated element containing at least Mn, and x is a numerical value of 0<x<1.

12. The semiconductor light emitting device according to any one of the above 1 to 10, wherein the red emitting phosphor contains a crystal phase having a chemical composition represented by the following formula (1'), wherein the proportion of Mn based on the total cools of $M^{IV'}$ and Mn is at least 0.1 mol % and at most 40 mol %, and the specific surface area is at most 1.3 $m^2/g$:

$$M^{I'}_2M^{IV'}F_6:R \quad (1')$$

In the formula (1'), $M^{I'}$ is at least one element selected from the group consisting of K and Na, $M^{IV'}$ is at least one metal element selected from the group consisting of Groups 4 and 14 of the Periodic Table containing at least Si, and R is an activated element containing at least Mn.

13. A backlight having the semiconductor light emitting device as defined in any one of the above 1 to 12 as a light source.

14. A color image display device comprising light shutters, a color filter having at least trichromatic color elements of red, green and blue corresponding to the light shutters and the backlight as defined in the above 13, in combination, wherein the relationship between the light use efficiency Y and the NTSC ratio W representing the color reproduction range of the color image display device is represented by the following formula:

$$Y \geq 0.4W+64 \text{ (where } W \geq 85)$$

$$X = \frac{\int_{380}^{780} \bar{x}(\lambda)S(\lambda)T(\lambda)\,d\lambda}{\int_{380}^{780} \bar{y}(\lambda)S(\lambda)\,d\lambda} \qquad x = \frac{X}{X+Y+Z}$$

$$Y = \frac{\int_{380}^{780} \bar{y}(\lambda)S(\lambda)T(\lambda)\,d\lambda}{\int_{380}^{780} \bar{y}(\lambda)S(\lambda)\,d\lambda} \qquad y = \frac{Y}{X+Y+Z}$$

$$Z = \frac{\int_{380}^{780} \bar{z}(\lambda)S(\lambda)T(\lambda)\,d\lambda}{\int_{380}^{780} \bar{y}(\lambda)S(\lambda)\,d\lambda}$$

wherein the definitions of the respective symbols are as follows:

x(λ), y(λ), z(λ): color matching functions of XYZ colorimetric system

S(λ): relative emission spectrum of the backlight

T(λ): transmittance of the color filter

15. The color image display device according to the above 14, wherein the green pixel of the color filter contains a zinc phthalocyanine bromide pigment.

16. The color image display device according to the above 14 or 15, wherein each pixel of the color filter has a film thickness of at least 0.5 μm and at most 3.5 μm.

17. A phosphor containing a crystal phase having a chemical composition represented by the following formula (1'), wherein the proportion of Mn based on the total mols of $M^{IV'}$ and Mn is at least 0.1 mol % and at most 40 mol %, and the specific surface area is at most 1.3 $m^2/g$:

$$M^{I'}_2M^{IV'}F_6:R \quad (1')$$

In the formula (1'), $M^{I'}$ is at least one element selected from the group consisting of K and Na, $M^{IV'}$ is at least one metal element selected from the group consisting of Groups 4 and 14 of the Periodic Table containing at least Si, and R is an activated element containing at least Mn.

18. The phosphor according to the above 17, wherein the particle size distribution of said red emitting phosphor has one peak value.

19. The phosphor according to the above 17 or 18, wherein the quantile deviation of the particle size distribution is at most 0.6.

20. A process for producing the phosphor as defined in any one of the above 17 to 19, which has a step of reacting a solution containing at least Si and F with a solution containing at least K, Mn and F to obtain a compound represented by the above formula (1').

21. A process for producing a phosphor containing a crystal phase having a chemical composition represented by the following formula (1'), which has a step of mixing at least two types of solutions each containing at least one element selected from the group consisting of K, Na, Si, Mn and F:

$$M^{I'}_2M^{IV'}F_6:R \quad (1')$$

In the formula (1'), $M^{I'}$ is at least one element selected from the group consisting of K and Na, $M^{IV'}$ is at least one metal element selected from the group consisting of Groups 4 and 14 of the Periodic Table containing at least Si, and R is an activated element containing at least Mn.

22. A phosphor-containing composition comprising the phosphor as defined in any one of the above 17 to 19 and a liquid medium.

Advantageous Effects of Invention

According to the present invention, it is possible to obtain a light emitting device capable of accomplishing broad color reproducibility by a light emitting device comprising a light emitting device to emit light with a specific wavelength and phosphors having specific characteristics in combination, and it is further possible to obtain a light emitting device which is excellent in luminance and emission efficiency and has high durability. Further, by using such a light emitting device as a light source and properly prescribing the relation between the NTSC ratio and the light use efficiency, it is possible to realize reproduction of deep red and green without impairing brightness of the image thereby to accomplish broad color reproducibility as the entire image. Further, red, green and blue emissions can be carried out by one chip, whereby it is possible to provide a color image display device without impairing the productivity in its mounting and whereby adjustment of the white balance is easy.

DESCRIPTION OF REFERENCE SYMBOLS

Figure 1:
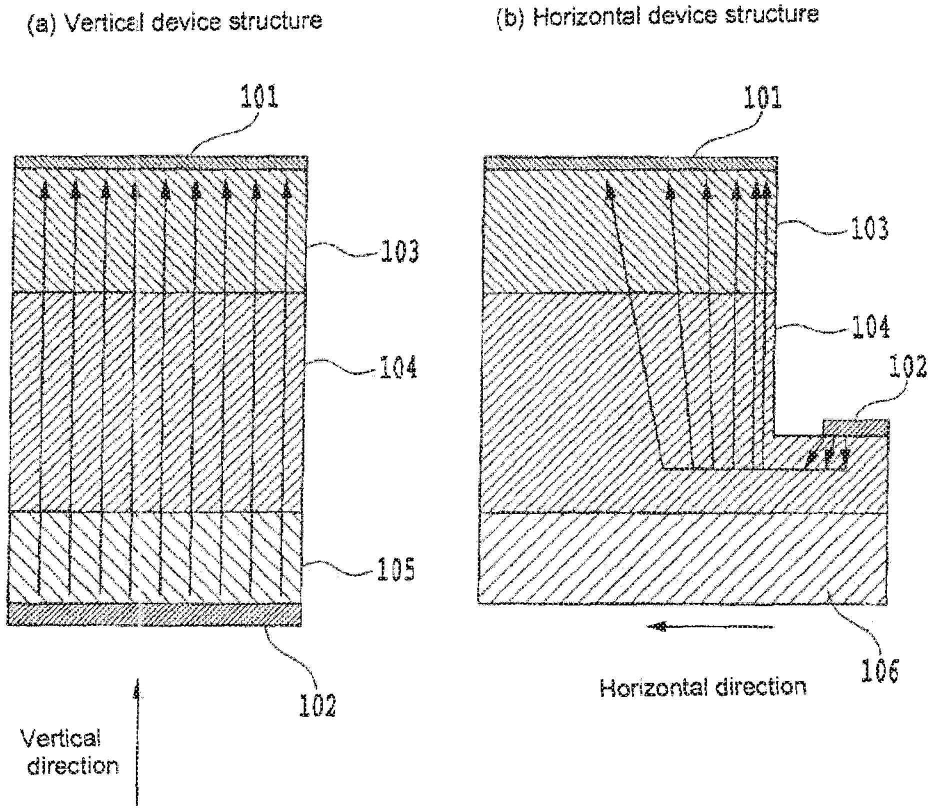
In FIG. 1, FIG. 1(*a*) is a cross sectional view of a vertical semiconductor light emitting device, and FIG. 1(*b*) is a cross sectional view of a horizontal semiconductor light emitting device.

1: Phosphor-containing portion (second emitter)
2: Excitation light source (first emitter) (LD)
3: Substrate
4: Light emitting device
5: Mount lead

6: Inner lead
7: Excitation light source (first emitter)
8: Phosphor-containing portion
9: Electrically conductive wire
10: Mold component
11: Surface-emitting illuminating device
12: Holding case
13: Light emitting device
14: Diffusion plate
15: Frame
16: Electrically conductive wire
17: Electrode
18: Electrode
20: Semiconductor light emitting device
21: Substrate
22: Buffer layer
23: Contact layer
24: First electroconductive clad layer
25: Active layer structure
26: Second electroconductive clad layer
27: Second electroconductive lateral electrode
28: First electroconductive lateral electrode
29: Second current injection region
31: Light source
32: Optical waveguide
33: Light diffusion sheet
34, 40: Polarizer
35, 38: Glass substrate
36: TFT
37: Liquid crystal
39: Color filter
41: Light guide
41*a*: One side edge surface of light guide
41*b*: One plate surface of light guide (light emitting surface)
41*c*: Plate surface of light guide opposite to the light emitting surface
42: Array
43: Light control sheet
44, 44': Light extracting mechanism
44*a*: Dots
44*b*: Roughened surface pattern
45: Reflecting sheet
101: p-type electrode
102: n-type electrode
103: p-type layer
104: n-type layer
105: Electrically conductive substrate
106: Insulating substrate
110: Semiconductor light emitting device A
111: Material layer B (fluoride complex phosphor-containing layer)
112: Material layer C
113: Material layer D
114: Material layer E

DESCRIPTION OF EMBODIMENTS

Now, the present invention will be described in detail with reference to its embodiments, but it should be understood that the present invention is by no means restricted to such embodiments and may be practiced in various modifications within its scope.

In the present invention, "a color image display device" means an entire construction including not only light shutters, a color filter and a backlight but also their driving circuits, control circuits, etc., which is capable of displaying a color image in a state controlled in accordance with input signals.

Further, "a color image display element" means a construction to emit light from the backlight through the light shutters and color filter, having a construction to control the driving of the optical shutters and backlight excluded from the "color image display device".

Further, in the present specification, a numerical value range represented by to "means a range containing the numerical values given before and after" to "as the lower limit value and the upper limit value.

Further, with respect to compositional formulae of phosphors in this specification, adjacent compositional formulae are delimited by a comma ",". Further, a plurality of elements being delimited by commas "," means that one or more of such comma-delimited elements may be contained in an optional combination or composition. For example, a compositional formula of "$(Ca,Sr,Ba)Al_2O_4$:Eu" comprehensively represents all of "$CaAl_2O_4$:Eu", "$SrAl_2O_4$:Eu", "$BaAl_2O_4$:Eu", "$Ca_{1-x-y}Sr_xAl_2O_4$:Eu", "$Sr_{1-x}Ba_xAl_2O_4$:Eu", "$Ca_{1-x}Ba_xAl_2O_4$:Eu" and "$Ca_{1-x-y}Sr_x Ba_yAl_2O_4$:Eu" (provided that in the above formulae, $0<x<1$, $0<y<1$, and $0<x+y<1$).

1. Solid Light Emitting Device

The emission wavelength of the solid light emitting device is not particularly limited so long as it overlaps with absorption wavelengths of the phosphors, and it is possible to use illuminants in a wide emission wavelength range, but its emission wavelength is usually preferably at least 200 nm. In a case where blue light is used as excitation light, it is preferred to use an illuminant having an emission peak wavelength of usually at least 420 nm, preferably at least 430 nm, more preferably at least 440 nm, further preferably at least 450 nm and usually at most 490 nm, preferably at most 480 nm, more preferably at most 470 nm, further preferably at most 460 nm. On the other hand, in a case where deep blue light (hereinafter sometimes referred to as near ultraviolet light) or ultraviolet light is used as excitation light, it is preferred to use an illuminant having an emission peak wavelength of usually at most 420 nm, preferably at most 410 nm, more preferably at most 400 nm. A red emitting phosphor preferably used in the present invention, is excited usually by blue light. Accordingly, in a case where near ultraviolet light or ultraviolet light is used, the red emitting phosphor is usually excited (indirectly excited) by blue light emitted from a blue-emitting phosphor excited by such light, and it is preferred to select excitation light having a wavelength to match the excitation band and the blue-emitting phosphor.

The solid light emitting device may, for example, be an organic electroluminescence light emitting device, an inorganic electroluminescence light emitting device or a semiconductor light emitting device. However, a semiconductor light emitting device is preferably employed, and for example, preferred is an InGaN type, GaAlN type, InGaAlN type or ZnSeS type semiconductor light emitting device crystal-grown by e.g. a MOCVD method on a substrate of e.g. silicon carbide, sapphire or gallium nitride. In order to obtain a high output power, the light source size may be enlarged, or the number of light sources may be increased. Further, it may be an edge face emission type or surface emission type laser diode. A blue or deep blue-emitting LED is preferably employed, since it has a wavelength capable of efficiently exciting phosphors, and it is accordingly possible to obtain a light source having a large light quantity.

Among them, as a first illuminant, a GaN type LED or LD (laser diode) using a GaN type compound semiconductor, is preferred, because as compared with a SiC type LED or the like which emits light in this region, the GaN type LED or LD has a remarkably large emission output power or external quantum efficiency, and by combining it with the above phosphors, it is possible to obtain a very bright emission with a low electric power. For example, to a current load of 20 mA, the GaN type LED or LD usually has an emission intensity of at least 100 times as compared with a SiC type. The GaN type LED or LD is preferably one having an $Al_XGa_YN$ emission layer, a GaN emission layer or an $In_xGa_YN$ emission layer. Among them, as the GaN type LED, one having an $In_xGa_YN$ emission layer is particularly preferred, since the emission intensity is very high, and one having a multiple quantum well structure comprising an $I_xGa_YN$ layer and a GaN layer, is further preferred.

In the above, "x+Y" is usually a value within a range of from 0.8 to 1.2. In the GaN type LED, one having Zn or Si doped on such an emission layer or one having no dopant is preferred in order to adjust the emission characteristics.

The GaN type LED is one comprising such an emission layer, a p-layer, a n-layer, electrodes and a substrate, as fundamental constituting elements. One having a hetero structure wherein the emission layer is sandwiched by n-type and p-type $Al_XGa_YN$ layers, GaN layers or $In_x$ $Ga_YN$ layers, is preferred, since the emission efficiency is high. More preferred is one wherein the hetero structure is in the form of a multiple quantum well structure, since the emission efficiency is higher.

As the first phosphor, one phosphor may be used alone or two or more phosphors may be used in optional combination and ratio.

LED chips as the above-mentioned semiconductor light emitting devices include one having a vertical device structure and one having a horizontal device structure as shown in FIGS. 1(*a*) and 1(*b*). In a case where a LED chip having a vertical device structure, formed on an electrically conductive substrate, is used, it is preferred to employ a fluoride complex phosphor as the red emitting phosphor with a view to improvement of the durability of the light emitting device, specifically from such a viewpoint that deterioration with time of the light emitting device at a temperature of 85° C. under a humidity of 85% can be suppressed.

Here, the vertical type device structure is a structure of a so-called vertically conductive (vertical) light emitting device, wherein a desired light emitting device structure is expitaxially grown on an electrically conductive substrate, and one electrode is formed on the substrate and the other electrode is further formed on the expitaxially grown layer, so that a current is conducted in the expitaxial growth direction.

Preparation of a semiconductor light emitting device by using a p-n junction type element will be described with reference to the drawings. FIG. 1(*a*) shows a vertical device structure and its current distribution, and FIG. 1(*b*) shows a horizontal device structure and its current distribution.

The vertical device structure shown in FIG. 1(*a*) is a structure wherein a n-type layer (104) and a p-type layer (103) are deposited on an electrically conductive substrate (105), and a p-type electrode (101) is formed on the p-type layer (103) and a n-type electrode (102) is formed on the electrically conductive substrate (105). In this case, when the direction perpendicular to the interface between the respective layers is taken as a longitudinal direction, the current flows only in the longitudinal direction in the electrically conductive substrate (105), n-type layer (104) and p-type layer (103).

The horizontal device structure shown in FIG. 1(*b*) is a structure adopted in a case where a device is formed on an insulating substrate made of e.g. sapphire. It is a structure wherein a n-type layer (104) and a p-type layer (103) are deposited on an insulating substrate (106), a p-type electrode (101) is formed on the p-type layer (103), and a n-type electrode (102) is formed on the n-type layer (104) exposed by e.g. dry etching. In this case, when the direction horizontal to the interfaces between the respective layers is taken as a horizontal direction, the current flows in the horizontal direction in the n-type layer (104), whereby the device resistance increases, and the electric field tends to be concentrated on the n-type electrode (102) side, and the current distribution tends to be non-uniform.

Now, a typical example of the vertical device structure will be described.

Figure 2:
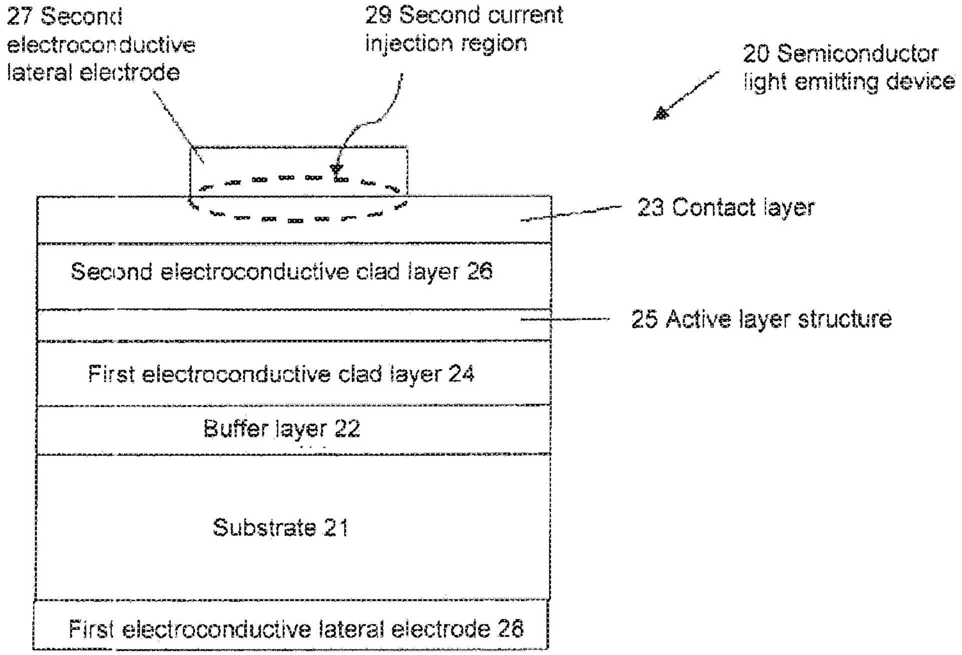
FIG. 2 is a cross sectional view of a light emitting device according to the first embodiment (vertical construction) of the present invention.

As shown in FIG. 2, a semiconductor light emitting device (20) according to the embodiment of the present invention has a substrate (21) and a compound semiconductor thin film crystal layer (hereinafter sometimes referred to simply as a thin film crystal layer) deposited on one side of the substrate (21). The thin film crystal layer is constituted by, for example, a first electroconductive semiconductor layer comprising a buffer layer (22) and a first electroconductive clad layer (24), a second electroconductive semiconductor layer comprising an active layer structure (25) and a second electroconductive clad layer (26), and a contact layer (23), deposited in this order from the substrate (21) side.

On a portion of the surface of the contact layer (23), a second electroconductive lateral electrode (27) for current injection is disposed, and the portion where the contact layer (23) and the second electroconductive lateral electrode (27) are in contact, constitutes a second current injection region (29) to inject a current to the second electroconductive semiconductor layer.

Further, a first electroconductive lateral electrode (28) is disposed on the rear side i.e. the side of the substrate (21) opposite to the thin film crystal layer.

By the disposition of the second electroconductive lateral electrode (27) and the first electroconductive lateral electrode (28) as described above, the two are disposed on the opposite sides with the substrate (21) interposed, and the semiconductor light emitting device (20) is constituted as a so-called vertical semiconductor light emitting device.

As the substrate (21), an electrically conductive substrate or one having an electrically conductive material packed through a part of an insulating substrate, may be used. In a case where an electrically conductive substrate is to be used, a GaN substrate or a ZnO substrate may, for example, be mentioned in addition to a SiC substrate. A SiC substrate and a GaN substrate are particularly preferred, since the electrical resistance can be suppressed to be low, and the electrical conductivity can be made high.

The reason as to why a vertical device structure is preferred for a semiconductor light emitting device to be used for a light emitting device containing a $Mn^{4+}$-activated fluoride complex phosphor, is not clearly understood. However, it has been observed that as compared with a horizontal device structure, a color change of the electrode surface of a LED chip having a vertical device structure is less by microscopic observation of the electrode surface after the durability test.

It is considered when applying current to a semiconductor light emitting device, a corrosive substance (containing F) will be formed from the $Mn^{4+}$-activated fluoride complex phosphor and will damage a wire, whereby the damaged wire will have a large resistance. As compared with a horizontal device structure, a semiconductor light emitting device having a vertical device structure has only one electrode on the upper side, whereby it is considered that the damage to the wire or electrode is little, and the change in the electrical conductivity is little, such being desirable.

Further, it is considered that the corrosive substance to be formed from the $Mn^{4+}$-activated fluoride complex phosphor when applying current, may contain an ion conductive substance. With one having a horizontal device structure, the possibility tends to be high such that leak current flows between the electrodes since the distance between the two electrodes is short Whereas, with the semiconductor light emitting device having a vertical device structure, the distance between the two electrodes is long, and such a possibility is considered to be low.

2. Phosphors

The light emitting device of the present invention is provided with phosphors which are directly or indirectly excited by light emitted from the above-described solid light emitting device, thereby to emit lights. The phosphors are characterized in that they comprise a green emitting phosphor and a red emitting phosphor having the following characteristics.

(2-1) Temperature Dependency of the Emission Peak Intensity

The green emitting phosphor and the red emitting phosphor to be used in the present invention are ones, of which the variation rate of the emission peak intensity at 100° C. to the emission peak intensity at 25° C., when the wavelength of the excitation light is 400 nm or 455 nm, is at most 40%, preferably at most 30%, more preferably at most 25%, further preferably at most 22%, still further preferably at most 18%, particularly preferably at most 15%.

The light emitted from the solid light emitting device is absorbed by the phosphors and the binder which maintains the phosphors. The binder is thereby heated to heat the phosphors. Further, the phosphors themselves are heated by absorption of the light emitted from the solid light emitting device. Further, at the time of applying current to the solid light emitting device for emission, the light emitting device is heated by the electrical resistance in the interior of the solid light emitting device, and as the temperature rises, the phosphors are heated by heat conduction. By such heating effects, the temperature of the phosphors will reach a level of 100° C. The emission peak intensity of the phosphors depends on the temperature, and as the temperature of the phosphors becomes high, the emission peak intensity tends to decrease. Accordingly, in order to ensure that even in a state where light is continuously emitted from the solid light emitting device, the color tone will not change as a whole, it is important to ensure that even where the emission peak intensities of the respective phosphors are changed by an increase of the temperature, the balance will not substantially collapse.

In the present invention, the green emitting phosphor and the red emitting phosphor are adjusted by e.g. the compositions so that when the wavelength of the excitation light is 400 nm or 455 nm, the variation rate of the emission peak intensity at 100° C. to the emission peak intensity at 25° C. is within the above-mentioned range. Thus, even if the emission peak intensities of the respective phosphors are changed by an increase of the temperature of the respective phosphors, such changes will be relatively small among the respective phosphors, and the color of light emitted from the emitting device is not substantially changed as a whole.

Here, the temperature dependency of phosphors may specifically be measured, for example, as follows.

Example for Measurement of Temperature Dependency

The measurement of the temperature dependency is carded out by the following procedure by using, for example, MCPD7000 multichannel spectrum measuring apparatus manufactured by Otsuka Electrics Co., Ltd. as an emission spectrum measuring apparatus, for example, Color Luminance Meter BMSA as a luminance measuring apparatus, and an apparatus having a stage provided with a cooling mechanism by a Peltier element and a heating mechanism by a heater, and a 150 W xenon lamp as a light source.

A cell containing a sample of a phosphor is placed on the stage, the temperature is changed at 25° C. and at 100° C. whereby the surface temperature of the phosphor is confirmed, and then the phosphors are excited by light having a wavelength of 400 nm or 455 nm spectroscopically taken out by a diffraction grating from a light source, whereby the luminance value and the emission spectrum are measured. From the measured emission spectrum, the emission peak intensity is determined. Here, as the measured value of the surface temperature of the phosphor on the side irradiated with the excitation light, a value corrected by using the temperature values measured by a radiation thermometer and a thermocouple, is used.

(2-2) Types of Phosphors

Now, the red emitting phosphor and the green emitting phosphor suitably used in the present invention will be described in detail.

(2-2-1) Red-Emitting Phosphor

The red emitting phosphor to be combined with the solid light emitting device in the semiconductor light emitting device of the present invention is a phosphor which has, in addition to the temperature dependency of the emission peak intensity as described above, at least one emission peak with a half-value width of at most 10 nm in a wavelength region of from 610 to 650 nm, has substantially no excitation spectrum in the emission wavelength region of the after-described green emitting phosphor and contains $Mn^{4+}$ as an activated element.

As it has an emission peak in the above-mentioned wavelength region, the color purity of red increases, whereby a high NTSC ratio can be realized.

Especially, the red emitting phosphor to be used in the present invention is preferably one having the main emission peak with a half-value width of at most 10 nm in a wavelength region of from 610 to 650 nm, and the half-value width is preferably at most 8 nm, more preferably at most 7 nm.

Further, the red emitting phosphor to be used in the present invention is characterized in that it is not substantially excited in the emission wavelength region of the after-mentioned green emitting phosphor. Accordingly, the emission of the green emitting phosphor will not be used for the emission of the red emitting phosphor, whereby the emission of the green emitting phosphor can be utilized efficiently, and the amount of the green emitting phosphor can be reduced. Further, the heat generation is thereby reduced, and it is possible to suppress the variation rate of the emission peak intensity by the temperature of the phosphor, and besides, it is also possible to suppress deterioration of the material at the mold portion molded by the after-mentioned curable material or therearound. Here, "substantially not excited" means that the wavelength corresponding to 1/10 of the maximum excitation intensity of the excitation spectrum of the red emitting phosphor is usually at most 535 nm, preferably at most 530 nm, more preferably at most 520 nm, further preferably at most 515 nm, although such may depends also on the type of the green emitting phosphor to be combined. For example, in a case where the after-mentioned BSON is used as the green emitting phosphor, it is preferred to use a red emitting phosphor having a wavelength corresponding to 1/10 of the maximum excitation intensity of the excitation spectrum in a range of at most 520 nm.

The red emitting phosphor having such characteristics may preferably be a phosphor containing at least one element selected from the group consisting of alkali metal elements, alkaline earth metal elements and Zn, at least one element selected from the group consisting of Si, Ti, Zr, Hf, Sn, Al, Ga and In, and at least one member selected from halogen elements.

More preferably, phosphors represented by the following formulae (1) to (8) may be mentioned.

$$M^{I}_2[M^{IV}_{1-x}R_xF_6] \quad (1)$$

$$M^{I}_3[M^{III}_{1-x}R_xF_6] \quad (2)$$

$$M^{II}[M^{IV}_{1-x}R_xF_6] \quad (3)$$

$$M^{I}_3[M^{IV}_{1-x}R_xF_7] \quad (4)$$

$$M^{I}_2[M^{III}_{1-x}R_xF_5] \quad (5)$$

$$Zn_2[M^{III}_{1-x}R_xF_7] \quad (6)$$

$$M^{I}[M^{III}_{2-2x}R_{2x}F_7] \quad (7)$$

$$Ba_{0.65}Zr_{0.35}F_{2.70}:Mn^{4+} \quad (8)$$

In the formulae (1) to (8), M' is at least one monovalent group selected from the group consisting of Li, Na, K, Rb, Cs and $NH_4$, $M^{II}$ is an alkaline earth metal element, $M^{III}$ is at least one metal element selected from the group consisting of Groups 3 and 13 of the Periodic Table (hereinafter mention of the Periodic Table may sometimes be omitted), $M^{IV}$ is at least one metal element selected from the group consisting of Groups 4 and 14, R is an activated element containing at least Mn, and x is a numerical value of 0<x<1.

$M^{I}$ particularly preferably contains at least one element selected from the group consisting of K and Na.

$M^{II}$ preferably contains at least Ba and particularly preferably is Ba.

A preferred specific example of $M^{III}$ may be at least one metal element selected from the group consisting of Al, Ga, In, Y and Sc. Among them, at least one metal element selected from the group consisting of Al, Ga and In is preferred. Further, it more preferably contains at least Al and particularly preferably is Al.

A preferred specific example of $M^{IV}$ may be at least one metal element selected from the group consisting of Si, Ge, Sn, Ti and Zr. Among them, Si, Ge, Ti or Zr is preferred. Further, it preferably contains at least Si and particularly preferably is Si.

x is preferably at least 0.004, more preferably at least 0.010, particularly preferably at least 0.020, and preferably at most 0.30, more preferably at most 0.25, further preferably at most 0.08, particularly preferably at most 0.06.

Preferred specific examples of the compounds represented by the above formulae (1) to (8) may be $K_2[AlF_5]:Mn^{4+}$, $K_3[AlF_6]:Mn^{4+}$, $K_3[GaF_6]:Mn^{4+}$, $Zn_2[AlF_7]:Mn^{4+}$, $K[In_2F_7]$; $Mn^{4+}$, $K_2[SiF_6]:Mn^{4+}$, $Na_2[SiF_6]:Mn^{4+}$, $K_2[TiF_6]:Mn^{4+}$, $K_3[ZrF_7]:Mn^{4+}$, $Ba[TiF_6]:Mn^{4+}$, $K_2[SnF_6]:Mn^{4+}$, $Na_2[TiF_6]:Mn^{4+}$, $Na_2[ZrF_5]:Mn^{4+}$, $KRb[TiF_6]:Mn^{4+}$ and $K_2[Si_{0.5}Ge_{0.5}F_6]:Mn^{4+}$.

Among the above, it is preferred from the viewpoint of the luminance of the light emitting device to use one which contains a crystal phase having a chemical composition represented by the following formula (1'), wherein the proportion of Mn based on the total mols of $M^{IV'}$ and Mn is at least 0.1 mol % and at most 40 mol %, and the specific surface area is at most 1.3 $m^2/g$:

$$M^{I'}_2M^{IV'}F_6:R \quad (1')$$

In the formula (1'), $M^{I'}$ is at least one element selected from the group consisting of K and Na, $M^{IV'}$ is at least one metal element selected from the group consisting of Groups 4 and 14 of the Periodic Table containing at least Si, and R is an activated element containing at least Mn.

(2-2-2) Red-Emitting Phosphor Represented by $M^{I'}_2M^{IV'}F_6$:R

A particularly preferred phosphor among the above is a novel compound, which will be described in detail as follows.

(2-2-2-1) Composition of Phosphor

The phosphor of the present invention is a phosphor which contains a crystal phase having a chemical composition represented by the following formula (1'), wherein the proportion of Mn based on the total mols of $M^{IV'}$ and Mn is at least 0.1 mol and at most 40 mols, and the specific surface area is at most 1.3 $m^2/g$:

$$M^{I'}_2M^{IV'}F_6:R \quad (1')$$

In the formula (1'), $M^{I'}$ is at least one element selected from the group consisting of K and Na, $M^{IV'}$ is at least one metal element selected from the group consisting of Groups 4 and 14 of the Periodic Table containing at least Si, and R is an activated element containing at least Mn.

In the above formula (1'), $M^{I'}$ contains at least one element selected from the group consisting of K and Na. It may contain either one of these elements alone or it may contain both of them in an optional ratio. Further, in addition to the above, it may partially contain an alkali metal element such as Li, Rb or Cs, or $(NH_4)$, so long as no influence is given to the performance. The content of Li, Rb, Cs or $(NH_4)$ is usually at most 10 mol % usually based on the total $M^{I'}$ amount.

Especially, $M^{I'}$ preferably contains at least K. Usually, based on the entire amount of $M^{I'}$, K is at least 90 mol %, preferably at least 97 mol %, more preferably at least 98 mol %, further preferably at least 99 mol %. It is particularly preferred to use only K.

In the above formula (1'), $M^{IV'}$ contains at least Si. Usually, based on the total amount of $M^{IV'}$, Si is at least 90 mol %, preferably at least 97 mol %, more preferably at least 98 mol %, further preferably at least 99 mol %. It is particularly preferred to use only Si. That is, it particularly preferably contains a crystal phase having a chemical composition represented by the following formula (1"):

$$M^{I'}_2SiF_6:R \quad (1")$$

In the above formula (1"), $M^{I'}$ and R are as defined in the above formula (1').

R is an activated element containing at least Mn, and one or more selected from the group consisting of Cr, Fe, Co, Ni, Cu, Ru and Ag may be mentioned as the activated element which may be contained as R other than Mn.

R preferably contains Mn usually at least 90 mol %, more preferably at least 95 mol %, particularly preferably at least 98 mol %, based on the total amount of R, and it is particularly preferred that R contains only Mn.

The phosphor of the present invention is characterized in that the proportion of Mn based on the total mols of $M^{IV'}$ and Mn (in the present invention, this proportion will hereinafter be referred to as "Mn concentration") is at least 0.1 mol % and at most 40 mol %. If such a Mn concentration is too low, the absorption efficiency of excitation light by the phosphor becomes small, whereby the luminance tends to decrease, and if it is too high, the internal quantum efficiency and luminance tend to decrease due to concentration quenching, although the absorption efficiency becomes high. The Mn concentration is more preferably at least 0.4 mol %, further preferably at least 1 mol %, particularly preferably at least 2 mol % and at most 30 mol %, preferably at most 25 mol %, further preferably at most 8 mol %, particularly preferably at most 6 mol %.

The phosphor of the present invention is preferably produced by a method disclosed in the after-mentioned process for producing a phosphor. However, in the process for producing the phosphor, there will be a certain difference between the charged composition of the raw material of the phosphor and the composition of the phosphor thereby obtained. The phosphor of the present invention is characterized in that it contains the above-mentioned specific composition as the composition of the obtained phosphor i.e. not the charged composition of the raw materials at the time of the production of the phosphor.

Here, the ionic radius (0.53 Å) of $Mn^{4+}$ is larger than the ionic radius (0.4 Å) of $Si^{4+}$, and $Mn^{4+}$ will not be totally solid-solubilized but partially solid-solubilized in $K_2SiF_6$, whereby in the phosphor of the present invention, as compared with the charged composition, the $Mn^{4+}$ concentration substantially activated is limited and becomes small. However, for example, by slowly dropwise adding a poor solvent in the after-described poor solvent precipitation method, even if the concentration of $Mn^{4+}$ contained in the phosphor becomes low, the particle growth is promoted by the production process of the present invention, whereby it is possible to provide a sufficient absorption efficiency and luminance.

The chemical analysis of the concentration of Mn contained in the phosphor in the present invention can be made, for example, by SEM-EDX. This method is one wherein in a scanning electron microscopic (SEM) measurement, the phosphor is irradiated with an electron beam (e.g. accelerating voltage: 20 kV), whereby characteristic X-rays emitted from various elements contained in the phosphor are detected to carry out an elemental analysis. As apparatus for measurement, for example, SEM (S-3400N) manufactured by Hitachi, Ltd. and energy dispersion X-ray analyzer (EDX) (EX-250x-act) manufactured by HORIBA, Ltd. may be used for the analysis.

Further, the above phosphor may contain, in addition to the above-described elements constituting the phosphor, one or more elements selected from the group consisting of Al, Ga, B, In, Nb, Mo, Zn, Ta, W, $R_e$ and Mg within a range not to adversely affect the performance of the phosphor.

(2-2-2-2) Characteristics of Phosphor

<Emission Spectrum>

The phosphor of the present invention preferably has the following characteristics when its emission spectrum is measured under excitation with light having a peak wavelength of 455 nm.

It is preferred that the peak wavelength λp (nm) in the above emission spectrum is usually longer than 600 nm, preferably at least 605 nm, more preferably at least 610 nm and usually at most 660 nm, preferably at most 650 nm. If such an emission peak wavelength λp is too short, the emission tends to be yellowish, and on the other hand, if it is too long, the emission tends to be dark reddish. Either case is not desirable, since the characteristics as orange or red light are likely to be deteriorated.

Further, with the phosphor of the present invention, it is preferred that the half-value width of the emission peak (full width at half maximum, hereinafter sometimes abbreviated as "FWHM") in the above emission spectrum is usually larger than 1 nm, preferably at least 2 nm, more preferably at least 3 nm and usually less than 50 nm, preferably at most 30 nm, more preferably at most 10 nm, further preferably at most 8 nm, still further preferably at most 7 nm. If this half-value width (FWHM) is too narrow, the emission peak intensity may sometimes decrease, and if it is too wide, the color purity may sometimes decrease.

In order to excite the above phosphor with light having a peak wavelength of 455 nm, a xenon light source may, for example, be used. Further, the measurement of the emission spectrum of the phosphor of the present invention can be carried out by using, for example, a fluorometer (manufactured by JASCO Corporation) equipped with a 150 W xenon lamp as an excitation light source and a multichannel CCD detector C7041 (manufactured by Hamamatsu Photonics K.K.) as a spectrum-measuring apparatus. The emission peak wavelength and the half-value width of the emission peak can be calculated from the obtained emission spectrum.

<Quantum Efficiency/Absorption Efficiency>

With the phosphor of the present invention, the higher the internal quantum efficiency, the better. The value of the internal quantum efficiency is usually at least 50%, preferably at least 75%, more preferably at least 85%, particularly preferably at least 90%. If the internal quantum efficiency is low, the emission efficiency tends to decrease, such being undesirable.

With the phosphor of the present invention, the higher the external quantum efficiency, the better. The value of the external quantum efficiency is usually at least 20%, preferably at least 25%, more preferably at least 30%, particularly preferably at least 35%. If the external quantum efficiency is low, the emission efficiency tends to decrease, such being undesirable.

With the phosphor of the present invention, the higher the absorption efficiency, the better. The value of the absorption efficiency is usually 25%, preferably at least 30%, more preferably at least 42%, particularly preferably at least 50%. If the absorption efficiency is low, the emission efficiency tends to decrease, such being undesirable.

The above internal quantum efficiency, external quantum efficiency and absorption efficiency can be measured by the methods disclosed in Examples given hereinafter.

<Weight-Average Median Diameter $D_{50}$>

With the phosphor of the present invention, it is preferred that the weight-average median diameter $D_{50}$ is usually at least 3 μm, preferably at least 10 μm and usually at most 50 μm, preferably at most 30 μm. If the weight-average median diameter $D_{50}$ is too small, the luminance may sometimes decrease, or phosphor particles may sometimes undergo aggregation. On the other hand, if the weight-average median diameter $D_{50}$ is too large, non-uniform coating or clogging of e.g. a dispenser is likely to occur.

In the present invention, the weight-average median diameter $D_{50}$ of the phosphor can be measured, for example, by using an apparatus such as a laser diffraction/scattering type particle size distribution-measuring apparatus.

<Specific Surface Area>

It is preferred that the specific surface area of the phosphor of the present invention is usually at most 1.3 $m^2/g$, preferably at most 1.1 $m^2/g$, particularly preferably at most 1.0 $m^2/g$ and usually at least 0.05 $m^2/g$, preferably at least 0.1 $m^2/g$. If the specific surface area of the phosphor is too small, the phosphor particles are large, whereby non-uniform coating or clogging of e.g. a dispenser tends to occur, and if it is too large, the phosphor particles are small, whereby the contact area with exterior increases, and the durability tend to be poor.

In the present invention, the specific surface area of the phosphor can be measured, for example, by a BET one point method by using e.g. a fully automatic specific surface area-measuring apparatus (flow method) (AMS1000A) manufactured by Ohkura Riken Co., Ltd.

<Particle Size Distribution>

It is preferred that the phosphor of the present invention has one peak value in its particle size distribution.

Presence of two or more peak values indicates that there are a peak value by single particles and a peak value by their aggregates. Therefore, the presence of two or more peak values means that single particles are very small.

Thus, a phosphor having one peak value in its particle size distribution is one wherein single particles are large and aggregates are very little. Accordingly, there will be an effect such that the luminance is improved or an effect such that as single particles are grown large, the specific surface area becomes small, whereby the durability is improved.

In the present invention, the particle size distribution of the phosphor can be measured, for example, by a laser diffraction/scattering type particle size distribution-measuring apparatus (LA-300) manufactured by HORIBA, Ltd. In the measurement, the phosphor is dispersed by using ethanol as a dispersion solvent, then the initial transmittance on the optical axis is adjusted to about 90%, and the measurement is preferably carried out by suppressing the influence by aggregation to the minimum while stirring the dispersion solvent by a magnet stirrer.

Further, the width of the peak of the above particle size distribution is preferably narrow. Specifically, the quantile deviation (QD) of the particle size distribution of phosphor particles is usually at least 0.18, preferably at least 0.20 and usually at most 0.60, preferably at most 0.40, more preferably at most 0.35, further preferably at most 0.30, particularly preferably 0.25.

Here, the quantile deviation of the particle size distribution becomes small as particle sizes of phosphor particles are uniform. That is, the quantile deviation of the particle size distribution being small means that the width of a peak of the particle size distribution is narrow, and the size of phosphor particles is uniform.

Further, the quantile deviation of the particle size distribution can be calculated by using a particle size distribution curve measured by using a laser diffraction/scattering type particle size distribution-measuring apparatus.

<Particle Shape>

The particle shape of the phosphor of the present invention as observed from a SEM photograph of the present invention is preferably a granular shape uniformly grown in triaxial directions. When the granular shape is uniformly grown in triaxial directions, the specific surface area becomes small, whereby the contact area with exterior is small, and the durability will be excellent.

Here, such a SEM photograph may be taken, for example, by SEM (53400N) manufactured by Hitachi, Ltd.

<Other Characteristics>

Further, in a case where the phosphor is a fluoride complex phosphor, the thermally decomposed fluorine amount per 1 g of the phosphor at 200° C. (hereinafter sometimes referred to as "thermally decomposed F amount") may become at least 0.01 μg/min, further at least 1 μg/min. However, as described hereinafter, by adopting a specific light emitting device structure, it becomes possible to suppress deterioration with time when the light emitting device is stored or operated in a high temperature and high humidity state (e.g. at a temperature of 85° C. under a humidity of 85%). Here, the thermally decomposed F amount per 1 g of the phosphor is preferably at most 2 μg/min from the environmental standard. Further, in order to minimize damage to the circumference of the phosphor, a phosphor having a thermally decomposed F amount of at most 1.5 μg/min is suitably used.

Such a thermally decomposed F amount can be measured by the following method. A predetermined amount of a phosphor is accurately weighed and put in a platinum boat and then set in an alumina core tube of a horizontal electric furnace. Then, while circulating argon gas at a flow rate of 400 ml/min, the temperature in the furnace is raised and when the temperature of the phosphor becomes 200° C., it is maintained for two hours. Here, the total amount of argon gas circulated in the furnace is absorbed by a KOH aqueous solution (concentration: 67 mM), and the absorbed solution is analyzed by a liquid chromatography method, to obtain the thermally decomposed F amount per minute per 1 g of the phosphor.

Further, in a case where the above red emitting phosphor is a fluoride complex phosphor, if it is one having a solubility of at most 7 g in 100 g of water at a room temperature of 20° C., as described hereinafter, it becomes possible to suppress deterioration with time when the light emitting device is stored or operated in a high temperature and high humidity state (e.g. at a temperature of 85° C. under a humidity of 85%) by adopting a specific light emitting device structure. Further, in the case of a fluoride complex phosphor, the solubility in 100 g of water at a room temperature of 20° C. is usually at least 0.005 g, preferably at least 0.010 g, more preferably at least 0.015 g.

For reference, solubilities of hexafluoro complexes are shown in the following Table. The values disclosed in the Table are based on Material Safety Data Sheet (MSDS) attached to the reagents manufactured by Morita Chemical Industries Co., Ltd.

Solubilities of Hexafluoro Complexes

| Fluorides | Solubility (g/100 g of water) |
|---|---|
| $K_2TiF_6$ | 1.28 (20° C.) |
| $Na_2TiF_6$ | 6.5 (20° C.) |
| $K_2SiF_6$ | 0.12 (17.5° C.), 0.95 (100° C.) |
| $Na_2SiF_6$ | 0.44 (0° C.), 2.45 (100° C.) |
| $K_2ZrF_6$ | 1.41 (15° C.) |
| $Na_2ZrF_6$ | 0.378 (18° C.) |
| $BaSiF_6$ | 0.026 (17° C.), 0.09 (100° C.) |
| $K_3AlF_6$ | 0.0385 (16° C.) |
| $Na_3AlF_6$ | 0.039 (25° C.) |

(2-2-2-3) Process for Producing Phosphor

The process for producing the phosphor of the present invention is not particularly limited, but it is generally classified into a method of employing a poor solvent as in the following method (1) and a method of not using a poor solvent as in the following method (2) (specifically the following method (2-1) or (2-2)).

(1) Poor solvent separation method (2) Method of mixing at least two solutions each containing at least one element selected from the group consisting of K, Na, Si, Mn and F and then obtaining a precipitate (phosphor) precipitated by the mixing In the above method (2), it is preferred that all elements constituting the desired phosphor are contained in the solutions to be mixed, and as a combination of the solutions to be mixed, the following (2-1) and (2-2) may specifically be mentioned.

(2-1) Method of mixing a solution containing at least Si and F with a solution containing at least K (and/or Na), Mn and F (2-2) Method of mixing a solution containing at least Si, Mn and F with a solution containing at least K (and/or Na) and F Now, the respective production methods will be described with reference to a typical example wherein $M^{IV'}$ contains only Si.

(1) Poor Solvent Separation Method

This method is, for example, as disclosed in Example II-1-1 given hereinafter, a method wherein as raw material compounds e.g. $M^{I'}{}_2SiF_6$ and $M^{I'}{}_2RF_6$ are used (wherein $M^{I'}$ and R are as defined in the above formula (1')), and these compounds are added in predetermined proportions into hydrofluoric acid and dissolved and reacted with stirring, and thereafter, a poor solvent for the phosphor is added to precipitate the phosphor. For example, this method can be carried out in the same manner as the method disclosed in U.S. Pat. No. 3,576,756.

As mentioned above, by the method disclosed in U.S. Pat. No. 3,576,756, there is a problem such that the phosphor particles obtainable are fine and the luminance is also low, such being practically not useful. The present inventors have found it possible to obtain the desired phosphor by not introducing the poor solvent all at once to precipitate the phosphor by adding such a poor solvent, but slowing down the addition rate of the poor solvent or adding it dividedly.

The combination of the raw material compounds to be used for this poor solvent separation method is preferably a combination of $K_2SiF_6$ and $K_2MnF_6$, a combination of $K_2SiF_6$ and $KMnO_4$, or a combination of $K_2SiF_6$ and $K_2MnCl_6$.

The combination of $K_2SiF_6$ and $K_2MnF_6$ may specifically be a combination of a water-soluble K salt (such as KF, $KHF_2$, KOH, KCl, KBr, KI, potassium acetate, $K_2CO_3$ or the like, the same applies hereinafter), hydrofluoric acid, an aqueous $H_2SiF_6$ solution and $K_2MnF_6$, a combination of the water-soluble K salt, hydrofluoric acid, a silicate (such as $SiO_2$, Si alkoxide or the like, the same applies hereinafter) and $K_2MnF_6$, or a combination of potassium silicate ($K_2SiO_3$), hydrofluoric acid and $K_2MnF_6$.

The combination of $K_2SiF_6$ and $KMnO_4$ may specifically be a combination of the water-soluble K salt, hydrofluoric acid, an aqueous $H_2SiF_6$ solution and $KMnO_4$, a combination of the water-soluble K salt, hydrofluoric acid, a silicate and $KMnO_4$, or a combination of potassium silicate ($K_2SiO_3$), hydrofluoric acid and $KMnO_4$.

The combination of $K_2SiF_6$ and $K_2MnCl_6$ may specifically be a combination of the water-soluble K salt, hydrofluoric acid, an aqueous $H_2SiF_6$ solution and $K_2MnCl_6$, a combination of the water-soluble K salt, hydrofluoric acid, a silicate and $K_2MnCl_6$, and a combination of potassium silicate ($K_2SiO_3$), hydrofluoric acid and $K_2MnCl_6$.

Here, the above water-soluble K salt or a water-soluble potassium salt in the after-mentioned method (2-1) or (2-2) is a potassium salt having a solubility of at least 10 wt % in water at 15° C.

These raw material compounds are used in such proportions that a phosphor of a desired composition can be obtained. However, as mentioned above, there will be a certain deviation between the charged composition of the phosphor raw materials and the composition of the obtained phosphor, and it is important to make adjustment so that the composition of the obtained phosphor would be the desired composition.

Hydrogen fluoride is used in the form of an aqueous solution wherein its concentration is usually at least 10 wt %, preferably at least 20 wt %, more preferably at least 30 wt % and usually at most 70 wt %, preferably at most 60 wt %, more preferably at most 50 wt %. For example, when the hydrofluoric acid concentration is from 40 to 50 wt %, it is preferred to employ it so that the amount of hydrofluoric acid (concentration: 40 to 50 wt %) to 1 g of $K_2SiF_6$ would be about from 30 to 60 ml.

The reaction can be carried out under atmospheric pressure at room temperature (20 to 30° C.).

Usually, raw material compounds are added and mixed in predetermined proportions to hydrofluoric acid, and after the raw material compounds are all dissolved, the poor solvent is added.

As the poor solvent, an organic solvent having a solubility parameter of at least 10 and less than 23.4, preferably from 10 to 15, is usually employed. Here, the solubility parameter is one defined as follows.

(Definition of Solubility Parameter)

By a regular solution theory, the force acting between a solvent and a solute is modeled to be only an intermolecular force, and the interaction to flocculate liquid molecules can be considered to be only the intermolecular force. The cohesive energy of a liquid is equivalent to the vaporization enthalpy, and accordingly, the solubility parameter is defined by $\delta=\sqrt{(\Delta H/V-RT)}$ where ΔH is the molar heat of vaporization and V is the molar volume. That is, it is calculated from the square root $(cal/cm^3)^{1/2}$ of the heat of vaporization required to vaporize 1 mol volume of the liquid.

It is rare that a practical solution is a regular solution, and between solvent and solute molecules, a force other than the intermolecular force, such as a hydrogen bond will act, and whether the two components will undergo mixing or phase separation, is thermodynamically determined by a difference between the mixing enthalpy and the mixing entropy of such components. However, on an empirical basis, materials having similar solubility parameters (hereinafter sometimes referred to as "SP value") tend to be easily mixed. Therefore, the SP value will be an index to judge the mixing efficiency of a solute and a solvent.

By a regular solution theory, the force acting between a solvent and a solute is assumed to be only the intermolecular force, and the solubility parameter is used as an index to represent the intermolecular force. A real solution may not necessarily be a regular solution, but it is empirically known that as the difference in the SP value between the two components is small, the solubility will be large.

Such a poor solvent may, for example, be acetone (solubility parameter: 10.0), isopropanol (solubility parameter: 11.5), acetonitrile (solubility parameter: 11.9), dimethylformamide (solubility parameter: 12.0), acetic acid (solubility parameter: 12.6), ethanol (solubility parameter: 12.7), cresol (solubility parameter: 13.3), formic acid (solubility parameter: 13.5), ethylene glycol (solubility parameter: 14.2), phenol (solubility parameter: 14.5) or methanol (solubility parameter: 14.5 to 14.8). Among them, acetone is preferred since it contains no hydroxyl group (—OH) and is well soluble in water. Such poor solvents may be used alone or in combination as a mixture of two or more of them.

The amount of the poor solvent to be used, varies depending upon its type, but it is usually at least 50 vol %, preferably at least 60 vol %, more preferably at least 70 vol % and usually at most 200 vol %, preferably at most 150 vol %, more preferably at most 120 vol %, based on the phosphor material-containing hydrofluoric acid.

Addition of the poor solvent may be dividedly or continuously. However, as the rate of addition of the poor solvent to the phosphor raw material-containing hydrofluoric acid, it is preferred to adopt a relatively slow addition rate i.e. usually at most 400 ml/hr, preferably from 100 to 350 ml/hr, with a view to obtaining the desired phosphor having a small specific surface area and high luminance. However, if this addition rate is excessively slow, the productivity will be impaired.

The phosphor precipitated by the addition of the poor solvent is recovered by solid-liquid separation by e.g. filtration and washed with a solvent such as ethanol, water or acetone. Thereafter, moisture adsorbed to the phosphor is evaporated at a temperature of usually at least 100° C., preferably at least 120° C., more preferably at least 150° C. and usually at most 300° C., preferably at most 250° C., more preferably at most 200° C. The drying time is not particularly limited, but it is for example at a level of from 1 to 2 hours.

(2-1) Method of Mixing a Solution Containing at Least Si and F with a Solution Containing at Least K, Mn and F to Precipitate the Product (Phosphor).

This method is characterized in that no poor solvent is used, and since a flammable organic solvent is not used as a poor solvent, industrial safety will be improved; since no organic solvent is used, the cost can be reduced; hydrofluoric acid required at the time of synthesizing the same amount of a phosphor, can be reduced to about one tenth as compared with the above-mentioned method (1), whereby further reduction of the cost can be made; as compared with the above method (1), particle growth is further accelerated, and it is possible to obtain a phosphor having a small specific surface area, a large particle size, excellent durability and high luminance.

A solution containing at least Si and F (hereinafter sometimes referred to as “solution I”) is hydrofluoric acid containing the $SiF_6$ source.

The $SiF_6$ source in this solution I may be one which is a compound containing Si and F and is excellent in solubility in the solution, and it may, for example, be $H_2SiF_6$, $Na_2SiF_6$, $(NH_4)_2SiF_6$, $Rb_2SiF_6$ or $Cs_2SiF_6$. Among them, $H_2SiF_6$ is preferred since the solubility in water is high, and it contains no alkali metal element as an impurity. These $SiF_6$ sources may be used alone or in combination as a mixture of two or more of them.

The hydrogen fluoride concentration in hydrofluoric acid of this solution I is usually at least 10 wt %, preferably at least 20 wt %, more preferably at least 30 wt % and usually at most 70 wt %, preferably at most 60 wt %, more preferably at most 50 wt %. Further, the $SiF_6$ source concentration is usually at least 10 wt %, preferably at least 20 wt % and usually at most 60 wt %, preferably at most 40 wt %. If the hydrogen fluoride concentration in the solution I is too low, when the after-mentioned solution containing a Mn source is added to the solution I, Mn ions tend to be hydrolyzed, and the concentration of Mn to be activated changes, whereby the activated amount of Mn in the synthesized phosphor tends to be hardly controlled, and fluctuation in the emission efficiency of the phosphor tends to be large, and if it is too high, the operational risk tends to be high. Further, if the $SiF_6$ source concentration is too low, the yield of the phosphor tends to decrease, and at the same time, the grain growth of the phosphor tends to be suppressed, and if it is too high, the phosphor particles tend to be too large.

On the other hand, a solution containing at least K, Mn and F (hereinafter sometimes referred to as “solution II”) is hydrofluoric acid containing a K source and a Mn source.

As the K source in the solution II, it is possible to use a water-soluble potassium salt such as KF, $KHF_2$, KOH, KCl, KBr, KI, potassium acetate or $K_2CO_3$. Among them, $KHF_2$ is preferred, since it can be dissolved without lowering the hydrogen fluoride concentration in the solution, and the safety is high since the dissolution heat is small.

Further, as the Mn source in the solution II, it is possible to use, for example, $K_2MnF_6$, $KMnO_4$ or $K_2MnCl_6$. Among them, $K_2MnF_6$ is preferred, since it does not contain a Cl element which tends to distort and instabilize a crystal lattice, whereby it can be present stably in hydrofluoric acid as $MnF_6$ complex ions while maintaining the oxidation number (tetravalent) to be activated. Further, among Mn sources, one containing K may serve also as a K source.

These K sources and Mn sources may respectively be used alone or in combination as a mixture of two or more of them.

The hydrogen fluoride concentration in this hydrofluoric acid of solution II is usually at least 10 wt %, preferably at least 20 wt %, more preferably at least 30 wt % and usually at most 70 wt %, preferably at most 60 wt %, more preferably at most 50 wt %. Further, the total concentration of the K source and the Mn source is usually at least 5 wt %, preferably at least 10 wt %, more preferably at least 15 wt % and usually at most 45 wt %, preferably at most 40 wt %, more preferably at most 35 wt %. If the hydrogen fluoride concentration is too low, the raw material $K_2MnF_6$ for an activated element contained in the solution II tends to be unstable and tends to be hydrolysable, and the Mn concentration changes vigorously, whereby the activated amount of Mn in the phosphor to be synthesized tends to be hardly controlled, and fluctuation in the emission efficiency of the phosphor tends to be large, and if it is too high, the operational risk tends to be high. On the other hand, if the K source and Mn source concentration is too low, the yield of the phosphor tends to decrease, and at the same time, the grain growth of the phosphor tends to be suppressed, and if it is too high, the phosphor particles tend to be too large.

The method of mixing the solution I and the solution II is not particularly limited. While stirring the solution I, the solution II may be added and mixed, or while stirring the solution the solution I may be added and mixed. Otherwise, the solution I and the solution II may be put into a container all at once and mixed with stirring.

By mixing the solution I and the solution II, the $SiF_6$ source, the K source and the Mn source are reacted in a prescribed ratio, whereby crystals of the desired phosphor will precipitate. The crystals are recovered by solid-liquid separation by e.g. filtration and washed with a solvent such as ethanol, water or acetone. Thereafter, moisture adsorbed to the phosphor is evaporated at a temperature of usually at least 100° C., preferably at least 120° C., more preferably at least 150° C. and usually at most 300° C., preferably at most 250° C., more preferably at most 200° C. The drying time is not particularly limited, but it may, for example, be at a level of from 1 to 2 hours.

Also at the time of this mixing of the solution I and the solution II, it is necessary to adjust the mixing ratio of the solution I and the solution II so that the composition of the phosphor as the product would be the desired composition, taking into consideration the deviation between the above-mentioned charged composition of the phosphor raw material and the composition of the obtainable phosphor.

(2-2) Method of Mixing a Solution Containing at Least Si, Mn and F with a Solution Containing at Least K and F to Precipitate a Product (Phosphor)

Also this method is characterized in that no poor solvent is used, and there are the same merits as in the above method (2-1).

Further, according to this method (2-2), $K_2MnF_6$ is dissolved in the solution, and therefore, as compared with the above method (2-1), Mn can be uniformly activated. Therefore, the concentration of Mn to be actually activated can be linearly controlled against the charged composition of the Mn concentration, and thus, there is a merit that the quality control can easily be carried out on an industrial scale.

A solution containing at least Si, Mn and F (hereinafter sometimes referred to as "solution III") is hydrofluoric acid containing a $SiF_6$ source and a Mn source.

The $SiF_6$ source of the solution III may be one which is a compound containing Si and F and is excellent in solubility in the solution, and it may, for example, be $H_2SiF_6$, $Na_2SiF_6$, $(NH_4)_2SiF_6$, $Rb_2SiF_6$ or $Cs_2SiF_6$. Among them, $H_2SiF_6$ is preferred, since the solubility in water is high, and it contains no alkali metal element as an impurity. These $SiF_6$ sources may be used alone or in combination as a mixture of two or more of them.

As the Mn source of the solution III, $K_2MnF_6$, $KMnO_4$, $K_2MnCl_6$ may, for example, be used. Among them, $K_2MnF_6$ is preferred, since it does not contain a Cl element which tends to distort and instabilize a crystal lattice, whereby it can be stably present in the HF aqueous solution as $MnF_6$ complex ions while maintaining the oxidation number (tetravalent) to be activated. Among such Mn sources, one containing K may serve also as a K source. Such Mn sources may be used alone or in combination as a mixture of two or more of them.

The hydrogen fluoride concentration in this hydrofluoric acid of the solution III is usually at least 10 wt %, preferably at least 20 wt %, more preferably at least 30 wt % and usually at most 70 wt %, preferably at most 60 wt %, more preferably at most 50 wt %. Further, the $SiF_6$ source concentration is usually at least 10 wt %, preferably at least 20 wt %, and usually at most 60 wt %, preferably at most 40 wt %. Further, the Mn source concentration is usually at least 0.1 wt %, preferably at least 0.3 wt %, more preferably at least 1 wt % and usually at most 10 wt %, preferably at most 5 wt %, more preferably at most 2 wt %. If the hydrogen fluoride concentration in the solution III is too low, Mn ions tend to be easily hydrolyzed, and whereby the concentration of Mn to be activated will change, and it tends to be difficult to control the activated amount of Mn in the synthesized phosphor, and fluctuation in the emission efficiency of the phosphor tends to be large. On the other hand, if the hydrogen fluoride concentration is too high, the operational risk tends to be high. Further, if the $SiF_6$ source concentration is too low, the yield of the phosphor tends to decrease, and at the same time, the grain growth of the phosphor tends to be suppressed, and if it is too high, the phosphor particles tend to be too large. Further, if the Mn concentration is too low, the yield of the phosphor tends to decrease, and at the same time, the grain growth of the phosphor tends to be suppressed, and if it is too high, the phosphor particles tends to be too large.

On the other hand, a solution containing at least K and F (hereinafter sometimes referred to as "solution IV") is hydrofluoric acid containing a K source.

As the K source in the solution IV, it is possible to use a water-soluble potassium salt such as KF, $KHF_2$, KOH, KCl, KBr, KI, potassium acetate or $K_2CO_3$. Among them, $KHF_2$ is preferred, since it can be dissolved without lowering the hydrogen fluoride concentration in the solution, and the dissolution heat is small, and the safety is high. Such K sources may be used alone or in combination as a mixture of two or more of them.

The hydrogen fluoride concentration in this hydrofluoric acid of the solution IV is usually at least 10 wt %, preferably at least 20 wt %, more preferably at least 30 wt % and usually at most 70 wt %, preferably at most 60 wt %, more preferably at most 50 wt %. Further, the K source concentration is usually at least 5 wt %, preferably at least 10 wt %, more preferably at least 15 wt % and usually at most 45 wt %, preferably at most 40 wt %, more preferably at most 35 wt %. If the hydrogen fluoride concentration is too low, when added to the solution III, the raw material $K_2MnF_6$ for an activated element contained in the solution III tends to be unstable and tends to be hydrolyzed, whereby the Mn concentration changes vigorously, and it becomes difficult to control the activated amount of Mn in the synthesized phosphor, and fluctuation in the luminous efficiency of the phosphor tends to be large, and if it is too high, the operational risk tends to be high. Further, if the K source concentration is too low, the yield of the phosphor tends to decrease, and at the same time, the grain growth of the phosphor tends to be suppressed, and if it is too high, the phosphor particles tend to be too large.

Further, if the Mn concentration is too low, the yield of the phosphor tends to decrease, and at the same time, the grain growth of the phosphor tends to be suppressed, and if it is too high, the phosphor particles tend to be too large.

The method of mixing the solution III and the solution IV is not particularly limited, and while stirring the solution III, the solution IV may be added and mixed, or while stirring the solution IV, the solution III may be added and mixed. Otherwise, the solution III and the solution IV may be put into a container all at once and mixed with stirring.

By mixing the solution III and the solution IV, the $SiF_6$ source, the Mn source and the K source are reacted in a prescribed ratio, whereby crystals of the desired phosphor will precipitate. The crystals are recovered by solid-liquid separation by e.g. filtration and washed with a solvent such as ethanol, water or acetone. Thereafter, moisture adsorbed to the phosphor is evaporated at a temperature of usually at least 100° C., preferably at least 120° C., more preferably at least 150° C. and usually at most 300° C., preferably at most 250° C., more preferably at most 200° C. The drying time is not particularly limited, but it may, for example, be at a level of from 1 to 2 hours.

Also at the time of this mixing of the solution III and the solution IV, it is necessary to adjust the mixing ratio of the solution III and the solution IV so that the composition of the phosphor as the product would be the desired composition, taking into consideration the deviation between the above-mentioned charged composition of the phosphor raw material and the composition of the obtainable phosphor.

(2-2-2-4) Application of Phosphor

The phosphor of the present invention can be used in an optional application to use a phosphor. Further, the phosphor of the present invention may be used alone, but it is possible to use it in the form of a mixture of phosphors in an optional combination, i.e. two or more phosphors of the present invention may be used in combination, or a phosphor of the present invention may be used in combination with another phosphor.

Further, the phosphor of the present invention may suitably be used for various light emitting devices taking an advantage of the characteristic such that it can be excited with blue light. The phosphor of the present invention is usually a red emitting phosphor. Accordingly, for example, by combining the phosphor of the present invention with an excitation light source which emits blue light, it is possible to produce a purple to pink color-emitting device. Further, by combining the phosphor of the present invention with an excitation light source which emits blue light and a phosphor which emits green light, or with an excitation light source which emits near ultraviolet light, a phosphor which emits blue light and a phosphor which emits green light, the phosphor of the present invention will be excited by blue light from the excitation light source which emits blue light or from the phosphor which emits blue light, to emit red light, whereby it is possible to produce a white light emitting device (the after-mentioned "light emitting device of the present invention").

The emission color of the light emitting device is not limited to white color, and by suitably selecting the combination or contents of phosphors, it is possible to produce a light emitting device which emits a bulb color (warm white color) or a pastel color. A light emitting device thus obtained can be used as an illuminating device or a light emitting portion of an image display device (particularly a backlight for liquid crystal or the like).

(2-2-3) Green Emitting Phosphor

As the green emitting phosphor to be used for the phosphor film or phosphor layer to be used for a color image display device of the present invention, it is possible to use various phosphors having at least one emission peak wavelength in a wavelength region of preferably from 515 to 550 nm, more preferably from 515 to 535 nm. As the green emitting phosphor to realize an image having such a high color purity, an oxynitride phosphor, a sialon phosphor, an aluminate phosphor or an orthosilicate phosphor may, for example, be mentioned. Among them, an europium and/or cerium-activated oxynitride phosphor, an europium-activated sialon phosphor, an europium-activated Mn-containing aluminate phosphor, or an europium-activated orthosilicate phosphor, is preferred.

Now, specific examples of preferably employed green emitting phosphors will be described.

(2-2-3-1) Europium and/or Cerium-Activated Oxynitride Phosphor

As another example of the green emitting phosphor, a compound represented by the following formula (G6) may be mentioned.

$$M1_xBa_yM2_zL_uO_vN_w \qquad (G6)$$

In the above formula (G6), M1 is at least one activated element selected from the group consisting of Cr, Mn, Fe, Ce, Pr, Nd, Sm, Eu, Tb, Dy, Ho, Er, Tm and Yb, M2 is at least one bivalent metal element selected from the group consisting of Sr, Ca, Mg and Zn, L is a metal element selected from metal elements belonging to Groups 4 and 14 of the Periodic Table, and x, y, z, u, v and w are numerical values within the following ranges, respectively:

$0.00001 \leq x \leq 3$, $0 \leq y \leq 2.99999$, $2.6 \leq x+y+z \leq 3$, $0 < u \leq 0.11$, $6 < v \leq 25$, and $0 < w \leq 17$.

In the formula (G6), M1 is an activated element.

As M1, in addition to Eu, at least one transition metal element or rare earth element selected from the group consisting of Cr, Mn, Fe, Ce, Pr, Nd, Sm, Tb, Dy, Ho, Er, Tm and Yb may be mentioned. M1 may contain any one of these elements alone or may contain two or more of them in an optional combination or ratio. Among them, in addition to Eu, Ce, Sm, Tm or Yb as a rare earth element, may be mentioned as a preferred element. Further, the above M1 preferably contains at least Eu or Ce among them, from the viewpoint of luminescent quantum efficiency. Among them, one containing at least Eu is more preferred from the viewpoint of the emission peak wavelength, and it is particularly preferred to employ only Eu.

The activated element M1 will be present in the form of a bivalent cation and/or a trivalent cation in the phosphor of the present invention. At that time, the activated element M1 preferably has a higher proportion of the bivalent cation. In a case where M1 is Eu, the proportion of $Eu^{2+}$ based on the entire amount of Eu is specifically usually at least 20 mol %, preferably at least 50 mol %, more preferably at least 80 mol %, particularly preferably at least 90 mol %.

Here, the proportion of $Eu^{2+}$ in the entire Eu contained in the phosphor of the present invention may be examined, for example, by the measurement of the X-ray absorption fine structure. Namely, when the L3 absorption edge of Eu atoms is measured, $Eu^{2+}$ and $Eu^{3+}$ show separate absorption peaks, and their ratio can be determined from the peak areas. Further, the proportion of $Eu^{2+}$ in the entire Eu contained in the phosphor of the present invention may be also known by the measurement of electron spin resonance (ESR).

Further, in the formula (G6), x is a numerical value within a range of $0.00001 \leq x \leq 3$. Within such a range, x is preferably at least 0.03, more preferably at least 0.06, particularly preferably at least 0.12. On the other hand, if the content of the activated element M1 is too large, the concentration quenching is likely to result, and accordingly, x is preferably at most 0.9, more preferably at most 0.7, particularly preferably at most 0.45.

Further, in the phosphor of the present invention, the sites of Ba may be substituted by Sr, Ca, Mg and/or Zn, while the after-mentioned specific phase crystal structure (hereinafter sometimes referred to as "the BSON phase crystal structure") is maintained. Accordingly, in the above formula (G6), M2 is at least one bivalent metal element selected from the group consisting of Sr, Ca, Mg and Zn. At that time, M2 is preferably Sr, Ca and/or Zn, more preferably Sr and/or Ca, further preferably Sr. Further, Ba and M2 may further be partially substituted by such metal element ions.

Further, M2 may contain any one of these elements alone or may contain two or more of them in an optional combination or ratio.

In the substitution by Ca ions, the proportion of Ca based on the total amount of Ba and Ca is preferably at most 40 mol %. If the amount of Ca exceeds this proportion, the emission wavelength tends to shift to the long wavelength side, whereby the emission peak intensity is likely to decrease.

In the substitution by Sr ions, the proportion of Sr based on the total amount of Ba and Sr is preferably at most 50 mol %. If the amount of Sr exceeds this proportion, the emission wavelength tends to shift to the long wavelength side, and the emission peak intensity is likely to decrease.

In the substitution by Zn ions, the proportion of Zn based on the total amount of Ba and Zn is preferably at most 60 mol %. If the amount of Zn exceeds this proportion, the emission wavelength tends to shift to the long wavelength side, and the emission peak intensity is likely to decrease.

Accordingly, in the formula (G6), the amount of z may be set depending upon the type of the metal element M2 and the amount of y. Specifically, in the formula (G6), y is a numerical value within a range of $0 \leq y \leq 2.9999$. Further, in the formula (G6), x+y+z is $2.6 \leq x+y+z \leq 3$.

In the phosphor of the present invention, Ba or M2 element may sometimes be deficient together with oxygen or nitrogen. Accordingly, in the formula (G6), the value of x+y+z may sometimes be less than 3, and x+y+z may usually take a value of $2.6 \leq x+y+z \leq 3$, but ideally x+y+z=3.

Further, the phosphor of the present invention preferably contains Ba from the viewpoint of the stability of the crystal structure. Thus, in the above formula (G6), y is preferably larger than 0, more preferably at least 0.9, particularly preferably at least 1.2, and, from the relation to the content of activating elements, it is preferably smaller than 2.99999, more preferably at most 2.99, further preferably at most 2.98, particularly preferably at most 2.95.

In the formula (G6), L represents a metal element selected from metal elements in Group 4 of the Periodic Table such as Ti, Zr and Hf and metal elements in Group 14 of the Periodic Table such as Si and Ge. Here, L may contain any one of such metal elements alone or may contain two or more of them in an optional combination or ratio. Here, L is preferably Ti, Zr, Hf, Si or Ge, more preferably Si or Ge, particularly preferably Si. Here, L may partially contain metal elements capable of becoming trivalent cations such as B, Al and Ga, so long as no adverse effects are given to the performance of the phosphor from the viewpoint of the electrical charge balance of the crystal of the phosphor. The content of such metal elements is usually at most 10 atomic %, preferably at most 5 atomic %, based on L.

Further, in the formula (G6), u is a numerical value of usually at most 11, preferably at most 9, more preferably at most 7 and usually larger than 0, preferably at least 3, more preferably at least 5.

The amounts of O ions and N ions are represented by numerical values v and w in the formula (G6). Specifically, in the formula (GB), v is a numerical value of usually larger than 6, preferably larger than 7, more preferably larger than 8 and further preferably larger than 9, particularly preferably larger than 11, and a numerical value of usually at most 25, preferably smaller than 20, more preferably smaller than 15, further preferably smaller than 13.

Further, the phosphor of the present invention is an oxynitride, and therefore, N is an essential component. Thus, in the formula (G6), w is a numerical value larger than 0. Further, w is a numerical value of usually at most 17, preferably smaller than 10, more preferably smaller than 4, further preferably smaller than 2.4.

Accordingly, from the above described viewpoint, in the formula (GB), u, v and w are particularly preferably $5 \leq u \leq 7$, $9 < v < 15$ and $0 < w < 4$, respectively. It is thereby possible to increase the emission peak intensity of the phosphor.

Further, in the phosphor of the present invention, the proportion of oxygen atoms to metal elements such as (M1+Ba+M2) and L is preferably larger than the proportion of nitrogen atoms, and the amount of nitrogen atoms to the amount of oxygen atoms (N/O) is at most 70 mol %, preferably at most 50 mol %, more preferably at most 30 mol %, further preferably less than 20 mol %. Further, the lower limit is usually larger than 0 mol %, preferably at least 5 mol %, more preferably at least 10 mol %.

Specific examples of preferred compositions of the phosphor of the present invention will be given below, but it should be understood that the composition of the phosphor of the present invention is by no means restricted to the following examples.

In the following examples, the composition in the brackets means a composition comprising at least one of elements divided by a comma (,). For example, $(Ca,Sr,Ba)_3(Si,Ge)_6O_{12}N_2$:(Eu,Ce,Mn) represents a phosphor which comprises at least one atom selected from the group consisting of Ca, Sr and Ba, at least one atom selected from the group consisting of Si and Ge, O and N and which is further activated by at least one atom selected from the group consisting of Eu, Ce and Mn.

A preferred specific example of the green emitting phosphor of the present invention may, for example, be $(Ca,Sr,Ba)_3(Si,Ge)_6O_{12}N_2$:(Eu,Ce,Mn), $(Ca,Sr,Ba)_3(Si,Ge)_6O_9N_4$:(Eu,Ce,Mn), $(Ca,Sr,Ba)_3(Si,Ge)_6O_3N_8$:(Eu,Ce,Mn), $(Ca,Sr,Ba)_3(Si,Ge)_7O_{12}N_{8/3}$:(Eu,Ce,Mn), $(Ca,Sr,Ba)_3(Si,Ge)_6O_{12}N_{14/3}$:(Eu,Ce,Mn), $(Ca,Sr,Ba)_3(Si,Ge)_8O_{12}N_6$:(Eu,Ce,Mn), $(Ca,Sr,Ba)_3(Si,Ge)_{28/3}O_{12}N_{22/3}$:(Eu,Ce,Mn), $(Ca,Sr,Ba)_3(Si,Ge)_{29/3}O_{12}N_{26/3}$:(Eu,Ce,Mn), $(Ca,Sr,Ba)_3(Si,Ge)_{6.5}O_{13}N_2$:(Eu,Ce,Mn), $(Ca,Sr,Ba)_3(Si,Ge)_7O_{14}N_2$:(Eu,Ce,Mn), $(Ca,Sr,Ba)_3(Si,Ge)_8O_{16}N_2$:(Eu,Ce,Mn), $(Ca,Sr,Ba)_3(Si,Ge)_9O_{18}N_2$:(Eu,Ce,Mn), $(Ca,Sr,Ba)_3(Si,Ge)_{10}O_{20}N_2$:(Eu,Ce,Mn) or $(Ca,Sr,Ba)_3(Si,Ge)_{11}O_{22}N_2$:(Eu,Ce,Mn), and a more preferred example may, for example, be $Ba_3Si_6O_{12}N_2$:Eu, $Ba_3Si_6O_9N_4$:Eu, $Ba_3Si_6O_3N_8$:Eu, $Ba_3Si_7O_{12}N_{8/3}$:Eu, $Ba_3Si_8O_{12}N_{14/3}$:Eu, $Ba_3Si_8O_{12}N_6$:Eu, $Ba_3Si_{28/3}O_{12}N_{22/3}$:Eu, $Ba_3Si_{29/3}O_{12}N_{26/3}$:Eu, $Ba_3Si_{6.5}O_{13}N_2$:Eu, $Ba_3Si_7O_{14}N_2$:Eu, $Ba_3Si_8O_{16}N_2$:Eu, $Ba_3Si_9O_{18}N_2$:Eu, $Ba_3Si_{10}O_{20}N_2$:Eu, $Ba_3Si_{11}O_{22}N_2$:Eu, $Ba_3Si_6O_{12}N_2$:Eu, Mn, $Ba_3Si_6O_9N_4$:Eu, Mn, $Ba_3Si_6O_3N_8$:Eu, Mn, $Ba_3Si_7O_{12}N_{8/3}$:Eu, Mn, $Ba_3Si_8O_{12}N_{14/3}$:Eu, Mn, $Ba_3Si_8O_{12}N_6$:Eu, Mn, $Ba_3Si_{28/3}O_{12}N_{22/3}$:Eu, Mn, $Ba_3Si_{29/3}O_{12}N_{26/3}$:Eu, Mn, $Ba_3Si_{6.5}O_{13}N_2$:Eu, Mn, $Ba_3Si_7O_{14}N_2$:Eu, Mn, $Ba_3Si_8O_{16}N_2$:Eu, Mn, $Ba_3Si_9O_{18}N_2$:Eu, Mn, $Ba_3Si_{10}O_{20}N_2$:Eu, Mn, $Ba_3Si_{11}O_{22}N_2$:Eu, Mn, $Ba_3Si_6O_{12}N_2$:Ce, $Ba_3Si_6O_9N_4$:Ce, $Ba_3Si_6O_3N_8$:Ce, $Ba_3Si_7O_{12}N_{8/3}$:Ce, $Ba_3Si_8O_{12}N_{14/3}$:Ce, $Ba_3Si_8O_{12}N_6$:Ce, $Ba_3Si_{28/3}O_{12}N_{22/3}$:Ce, $Ba_3Si_{29/3}O_{12}N_{26/3}$:Ce, $Ba_3Si_{6.5}O_{13}N_2$:Ce, $Ba_3Si_7O_{14}N_2$:Ce, $Ba_3Si_8O_{16}N_2$:Ce, $Ba_3Si_9O_{18}N_2$:Ce, $Ba_3Si_{10}O_{20}N_2$:Ce or $Ba_3Si_{11}O_{22}N_2$:Ce.

The above-described oxynitride phosphor to be used in the present invention preferably has a specific crystal structure i.e. the BSON phase as defined below.

(2-2-3-1-1) BSON Phase

It is a crystal phase whereby a diffraction peak is observed in a range (R0) of diffraction angle (2θ) of from 26.9 to 28.2° in an X-ray diffraction measurement using an X-ray source of CuKα. Using the diffraction peak (P0) as the standard peak, five diffraction peaks (excluding diffraction peaks within an angle range of from 20.9° to 22.9°) led from Bragg angles (θ0) of P0 are designated as P1, P2, P3, P4 and P5, respectively, in the sequential order from the low angle side, and when the angle ranges of the diffraction angles of these diffraction peaks are designated as R1, R2, R3, R4 and R5, R1, R2, R3, R4 and R5 show the following angle ranges, respectively:

R1=R1s-R1e,

R2=R2s-R2e,

R3=R3s-R3e,

R4=R4s-R4e,

R5=R5s-R5e.

Further, it is a crystal phase wherein there is at least one diffraction peak in each of all ranges of R1, R2, R3, R4 and R5, and to the height of the highest diffraction peak among P0, P1, P2, P3, P4 and P5, the intensity of P0 has an intensity of at least 20% by the ratio in height of the diffraction peak, and at least one peak intensity of P1, P2, P3, P4 or P5 is at least 5%, preferably at least 9% by the ratio in height of the diffraction peak.

Here, in a case where two or more diffraction peaks are present within each of the angle ranges R0, R1, R2, R3, R4 and R5, the peak having the highest peak intensity among them is taken as P0, P1, P2, P3, P4 and P5, respectively.

Here, R1s, R2s, R3s, R4s and R5s represent the start angles of R1, R2, R3, R4 and R5, respectively, R1e, R2e, R3e, R4e and R5e represent end angles of R1, R2, R3, R4 and R5, respectively, and they represent the following angles:

R1s: 2×arcsin {sin(θ0)/(1.994×1.015)}

R1e: 2×arcsin {sin(θ0)/(1.994×0.985)}

R2s: 2×arcsin {sin(θ0)/(1.412×1.015)}

R2e: 2×arcsin {sin(θ0)/(1.412×0.985)}

R3s: 2×arcsin {sin(θ0)/(1.155×1.015)}

R3e: 2×arcsin {sin(θ0)/(1.155×0.985)}

R4s: 2×arcsin {sin(θ0)/(0.894×1.015)}

R4e: 2×arcsin {sin(θ0)/(0.894×0.985)}

R5s: 2×arcsin {sin(θ0)/(0.756×1.015)}

R5e: 2×arcsin {sin(θ0)/(0.756×0.985)}

Further, the phosphor to be used in the present invention may contain an impurity phase of e.g. cristobalite as one crystal form of silicon dioxide, α-silicon nitride or β-silicon nitride, in the X-ray diffraction measurement using an X-ray source of CuKα. The content of such impurities can be determined by the X-ray diffraction measurement using an X-ray source of CuKα. That is, the strongest peak intensity of the impurity phase is usually at most 40%, preferably at most 30%, more preferably at most 20%, further preferably at most 10%, based on the strongest peak intensity among the above P0, P1, P2, P3, P4 and P5 from the results of the X-ray diffraction measurement, and it is particularly preferred that no peak of such an impurity phase is observed, and the BSON phase is present as a single phase. It is thereby possible to increase the emission peak intensity.

As the oxynitride phosphor to be used in the present invention, the phosphors disclosed in WO2007/088966 may be used.

Further, another specific example of the green emitting phosphor may, for example, be a $Eu^{2+}$-activated Sr—SiON which has a chemical formula $(Sr_{1-m-n}Ca_nBa_o)Si_xN_yO_z{:}Eu_m$ (wherein m=0.002 to 0.2, n=0.0 to 0.25, 0=0.0 to 0.25, x=1.5 to 2.5, y=1.5 to 2.5, and z=1.5 to 2.5) and which can be excited by light with a wavelength within a range of from UV to blue.

As specific examples of such a phosphor, known phosphors disclosed in e.g. EP1413618, JP-A-2005-530917 and JP-A-2004-134805 may, for example, be mentioned.

(2-2-3-2) Sialon Phosphor Activated by Europium

Further, another specific example of the green emitting phosphor may, for example, be β-SiAlON activated by europium, or the like, disclosed in "Success in Development of Green Phosphor for White LED", reference material for Science Reporters Association, Reporters Association for the Ministry of Education, Culture, Sports, Science and Technology, Reporters Association for Tsukuba Kenkyu-gakuentoshi, Published by Independent Administrative Institution National Institute for Materials Science on Mar. 23, 2005.

(2-2-3-3) Mn-Containing Aluminate Phosphor Activated by Europium

As another specific example of the green emitting phosphor, a compound represented by the following formula (G7) may be mentioned.

$$R_{1-a}Eu_aM_{1-b}Mn_bA_{10}O_{17} \quad (G7)$$

In the formula (G7), a and b are numbers which respectively satisfy 0.05<a≤1, 0.6<a/b<5, and 0.01<b≤0.9, and R is at least one element selected from the group consisting of Ba, Sr and Ca, M is Mg and/or Zn, and A is at least one element selected from the group consisting of Al, Ga, Sc and B.

In a case where a is at most 0.05, the emission intensity of the crystal phase tends to be low when excited with light having a wavelength of 400 nm. A crystal phase having a chemical composition wherein a is a number satisfying 0.05<a≤1, is preferred, since the emission intensity is high. For the same reason, a is more preferably 0.1≤a≤1, further preferably 0.2≤a≤1, particularly preferably 0.25≤a≤1, most preferably 0.3≤a≤1.

Further, in a case where a/b is at most 0.6, the excitation light having a wavelength of 400 nm cannot sufficiently be absorbed, whereby the emission intensity from the second phosphor tends to be low. On the other hand, if a/b is at least 5, the blue emission intensity becomes stronger than the green emission intensity, whereby a green emission with a good color purity tends to be hardly obtainable. The crystal phase having a chemical composition wherein a/b satisfies 0.6<a/b<5, is preferred since the ratio of the green emission intensity in the vicinity of a wavelength of 515 nm to the blue emission intensity in the vicinity of a wavelength of 450 nm, is high, the green color purity is high, and it is possible to obtain a light emitting device with good color rendering. For the same reason, a/b≥0.8 is preferred, and a/b≥1 is more preferred. Further, a/b≤4 is preferred, a/b≤3 is more preferred.

The element represented by R in the above formula (G7) is at least one element selected from the group consisting of Ba, Sr and Ca, but if is preferred to have a crystal phase having a chemical composition wherein R is Ba and/or Sr, since a high emission intensity can thereby be obtained. Further, it is more preferred that Ba is at least 50 mol % of the entire R, and Sr is at least 10 mol % of the entire R, whereby a high emission intensity can be obtained.

The element represented by M in the above formula (G7) is Mg and/or Zn, but it is preferred to have a crystal phase having a chemical composition wherein M is Mg, whereby a high emission intensity can be obtained.

The element represented by A in the above formula (G7) is at least one element selected from the group consisting of Al, Ga, Sc and B, but it is preferred to have a crystal phase having a chemical composition wherein Al is at least 50 mol % of the entire A, with a view to obtaining a high emission intensity. Further, it is more preferred that Al is at least 99 mol % of the entire A, whereby the emission characteristics will be good.

Among these, a phosphor which contains an alkali metal in the crystal phase of the phosphor having the above composition and wherein the content of the alkali metal element is at most 3 mol % to the number of sites which can be substituted by Eu, is preferred, since it has a high emission intensity and luminance constantly even when the phosphor is excited with a near ultraviolet light, and it is excellent also in the temperature characteristics.

Such an alkali metal element is preferably Li, Na or K, particularly preferably Na or K.

Further, the content of the alkali metal element is preferably at least 0.1 mol %, more preferably at least 0.2 mol %, further preferably at least 0.3 mol %, particularly preferably at least 0.5 mol % and preferably at most 2.6 mol %, more preferably at most 2.3 mol %, further preferably at most 2 mol %, furthermore preferably at most 1.8 mol %, particularly preferably at most 1.6 mol %.

Further, the above phosphor preferably contains F as an anion element. The content of the element F is larger than 0 mol %, preferably at least 0.01 mol %, more preferably at least 0.05 mol %, more preferably at least 0.1 mol % and usually at most 10 mol %, preferably at most 5 mol %, more preferably at most 3 mol %, based on the number of sites which may be substituted by Eu in the crystal phase of the phosphor of the above composition.

Such a phosphor can be obtained as disclosed also in WO2008/123498, by permitting a monovalent metal halide to be present at a prescribed concentration as a flux during firing of the raw material mixture.

Such phosphors are ones, whereby the reduction rate (%) of the emission peak intensity at an excitation wavelength of 400 nm to the emission peak intensity at an excitation wavelength of 340 nm is at most 29%, preferably at most 26%, more preferably at most 23%, as measured at a temperature of 25° C. Further, they are ones whereby the reduction rate of the emission peak intensity at an excitation wavelength of 390 nm to the emission peak intensity at an excitation wavelength of 382 nm is at most 3.1%, preferably at most 2.5%, more preferably at most 2%, further preferably at most 1.5%, as measured at a temperature of 25° C. Here, the reduction rate of such an emission peak intensity is usually at least 0%.

The above excitation spectrum can be measured by using e.g. a fluorescence measuring apparatus (manufactured by JASCO Corporation) equipped with a 150 W xenon lamp as an excitation light source and a multichannel CCD detector C7041 (manufactured by Hamamatsu Photonics K.K.) as a spectrum measuring device.

(2-2-3-4) Ortho-Silicate Phosphor Activated by Europium

As another specific example of the green emitting phosphor, a compound represented by the following formula (G8) may be mentioned.

$$(M1_{(1-x)}M2_x)_\alpha SiO_\beta \qquad (G8)$$

In the above formula (G8), M1 is at least one element selected from the group consisting of Ba, Ca, Sr, Zn and Mg, M2 is at least one metal element which may take bivalent and trivalent atomic valencies, and x, α and β are numbers satisfying, respectively $0.01<x<0.3$, $1.5\leq\alpha\leq2.5$, and $3.5\leq\beta\leq4.5$.

It is particularly preferred that M1 contains at least Ba. In such a case, the molar ratio of Ba based on the entire M1, is usually at least 0.5, preferably at least 0.55, more preferably at least 0.6 and usually less than 1, preferably at most 0.97, more preferably at most 0.9, particularly preferably at most 0.8.

Further, it is particularly preferred that M1 contains at least Ba and Sr. Here, when the molar ratios of Ba and Sr based on the entire M1 are represented by [Ba] and [Sr], respectively, the proportion of [Ba] in the total of [Ba] and [Sr] i.e. the value represented by [Ba]/([Ba]+[Sr]) is usually larger than 0.5, preferably at least 0.6, more preferably at least 0.65 and usually at most 1, preferably at most 0.9, more preferably at most 0.8.

Further, the relative ratio of [Ba] to [Sr], i.e. the value represented by [Ba]i[Sr], is usually within a range of larger than 1, preferably larger than 1.2, more preferably larger than 1.5, further preferably larger than 1.8 and usually at most 15, preferably at most 10, more preferably at most 5, further preferably at most 3.5.

Further, in a case where in the formula (G8), M1 contains at least Sr, part of Sr may be substituted by Ca, In such a case, the amount for substitution by Ca is usually within a range of at most 10%, preferably at most 5%, more preferably at most 2%, by a molar ratio of the amount of substituted Ca to the total amount of Sr.

Further, Si may be partially substituted by another element such as Ge. However, from the viewpoint of the green emission intensity, etc., the proportion of Si substituted by another element should better be as small as possible. Specifically, another element such as Ge may be contained in an amount of not more than 20 mol % of Si, and it is more preferred that Si is entirely Si without substitution.

In the above formula (G8), M2 is at least one metal element which is mentioned as an activated element and which may take bivalent and trivalent atomic valencies. Specifically, a transition metal element such as Cr or Mn; or a rare earth element such as Eu, Sm, Tm or Yb, may, for example, be mentioned. M2 may contain any one of such elements alone or may contain two or more of them in an optional combination or ratio. Among them, as M2, Sm, Eu or Yb is preferred, and Eu is particularly preferred.

In the formula (G8), x is a number representing the moles of M2, and specifically, it is usually larger than 0.01, preferably at least 0.04, more preferably at least 0.05, particularly preferably at least 0.06, and usually less than 0.3, preferably at most 0.2, more preferably at most 0.16.

In the formula (G8), α is preferably close to 2, but it represents a number of usually at least 1.5, preferably at least 1.7, more preferably at least 1.8 and usually at most 2.5, preferably at most 2.2, further preferably at most 2.1, particularly preferably 2.

In the formula (G8), β represents a number of usually at least 3.5, preferably at least 3.8, more preferably at least 3.9, and usually at most 4.5, preferably at most 4.4, more preferably at most 4.1.

Further, a specific composition phosphor may contain, in addition to elements disclosed in the above formula (G8) i.e. in addition to M1, M2, Si (silicon) and O (oxygen), an element (which may sometimes referred to as "a trace element") selected from the group consisting of an alkali metal element, an alkaline earth metal element, zinc (Zn), yttrium (Y), aluminum (Al), scandium (Sc), phosphorus (P), nitrogen (N), a rare earth element, a monovalent element such as a halogen element, a bivalent element, a trivalent element, a minus monovalent element and a minus trivalent element, and it is particularly preferably one containing an alkali metal element or a halogen element.

The total content of the above trace elements is usually at least 1 ppm, preferably at least 3 ppm, further preferably at least 5 ppm and usually at most 100 ppm, preferably at most 50 ppm, further preferably at most 30 ppm. In a case where the specific composition phosphor contains plural types of trace elements, their total amount is adjusted to satisfy the above range.

As the phosphor represented by the above formula (G8), one disclosed in WO2007/052405 may be mentioned. Particularly preferred is one obtained by firing a raw material mixture or phosphor precursor obtainable by firing it, and further carrying out firing in the presence of $SrCl_2$ in an amount of at least 0.05 mol by a molar ratio to silicon (Si)

in the phosphor, alone or in a further presence of CsCl in an amount of at least 0.1 mol, as flux, in a strongly reducing atmosphere, since it has a high external quantum efficiency.

Further, at the time of the firing, it is preferred to carry out the firing in a strongly reducing atmosphere, for example, in the coexistence of solid carbon.

Such a phosphor represented by the formula (G8) is one having such characteristics that the half-value width of the emission peak when excited with light having a peak wavelength of 400 nm or 455 nm is at most 75 nm, and the external quantum efficiency as defined by the following formula is at least 0.59, preferably at least 0.60, more preferably at least 0.63, further preferably at least 0.65, when excited with light having a peak wavelength of 400 nm or 455 nm.

(External quantum efficiency)=(internal quantum efficiency)×(absorption efficiency)

(2-2-4) Preferred Combinations of the Respective Color-Emitting Phosphors

In the foregoing, the red emitting phosphor and the green emitting phosphor have been described. In Table 1, preferred combinations of the above-described respective color-emitting phosphors are exemplified.

TABLE 1

| | |
|---|---|
| Red emitting phosphors | $K_2TiF_6$: Mn, $BaTiF_6$: Mn, $K_2SiF_6$: Mn, $K_3ZrF_7$: Mn, $Ba_{0.65}Zr_{0.35}F_{2.7}$: Mn, $K_2SnF_6$: Mn, $Na_2TiF_6$: Mn, $Na_2ZrF_6$: Mn, $K_2AlF_5$: Mn, $K_3AlF_6$: Mn, $K_3GaF_6$: Mn, $Zn_2AlF_7$: Mn, $KIn_2F_7$: Mn |
| Green emitting phosphors | $(Ba,Sr)_3Si_6O_{12}N_2$: Eu, Eu-activated β SiAlON, $(Ba,Sr,Ca,Mg)Si_2O_2N_2$: Eu, $(Ba,Sr,Ca,Mg)_2SiO_4$: Eu, $(Ba,Sr)MgAl_{10}O_{17}$: Eu,Mn |

Among the combinations shown in Table 1, more preferred combinations are shown in Table 2.

TABLE 2

| | |
|---|---|
| Red emitting phosphors | $K_2TiF_6$: Mn, $BaTiF_6$: Mn, $K_2SiF_6$: Mn |
| Green emitting phosphors | $(Ba,Sr)_3Si_6O_{12}N_2$: Eu, Eu-activated β SiAlON, $(Ba,Sr)MgAl_{10}O_{17}$: Eu,Mn |

Further, particularly preferred combinations are shown in Table 3.

TABLE 3

| | |
|---|---|
| Red emitting phosphor | $K_2SiF_6$: Mn |
| Green emitting phosphors | $(Ba,Sr)_3Si_6O_{12}N_2$: Eu, $(Ba,Sr)MgAl_{10}O_{17}$: Eu,Mn |

The respective color emitting phosphors shown in the above Tables are excited with light in a blue or deep blue region and emit light, respectively in narrow zones in the respective red and green regions, and they have excellent temperature characteristics such that there is little change in their emission peak intensities due to a temperature change.

Accordingly, by combining two or more phosphors including the color emitting phosphors with the solid light emitting device which emits light in a blue or deep blue region, it is possible to obtain a semiconductor light emitting device which makes it possible to set the emission efficiency to be higher than ever and which is suitable for a light source to be used for a backlight for a color image display device of the present invention.

3. Light Emitting Device

The light emitting device of the present invention is not limited in its construction except that the above-mentioned solid light emitting device and the above-mentioned green and red emitting phosphors are used and can be obtained by adopting a known device construction by using known phosphors such as a phosphor to emit a blue fluorescence (hereinafter sometimes referred to as "blue emitting phosphor"), a phosphor to emit a green fluorescence (hereinafter sometimes referred to as "green emitting phosphor"), and a phosphor to emit a yellow fluorescence (hereinafter sometimes referred to as "yellow emitting phosphor") as described hereinafter in an optional combination in a blend ratio depending upon the particular purpose.

Specific examples of the device construction will be described hereinafter.

The emission spectrum of a light emitting device can be measured by using, for example, a color/illuminance-measuring software made by Ocean Optics, Inc and a USB2000 series spectrometer (integrating sphere specification) by conducting a current of 20 mA in a chamber maintained at a temperature of 25±1° C. From such emission spectrum data in a wavelength region of from 380 nm to 780 nm, the chromaticity values (x, y, z) can be calculated as chromaticity coordinates in the XYZ color system stipulated in JIS 28701. In such a case, a relational expression of x+y+z=1 is established. In this specification, the above XYZ color system may sometimes be referred to as an XY color system, which is usually represented by (x, y).

Further, with the light emitting device of the present invention, its emission efficiency is usually at least 10 lm/W, preferably at least 30 lm/W, particularly preferably at least 50 lm/W. Here, the emission efficiency is obtained by obtaining a total luminous flux from the results of an emission spectrum measurement using a light emitting device as described above, and dividing its lumen (lm) value by an electric power consumption (W). The electric power consumption is determined as a product of a current value and a voltage value by measuring the voltage in a state where 20 mA is applied, by using e.g. True RMS Multimeters Model 187&189 manufactured by Fluke.

Here, white color of the white emitting device includes all of (yellowish) white, (greenish) white, (bluish) white, (purplish) white, as stipulated in JIS 28701, and among them, preferred is white.

(3-1) Phosphors

The light emitting device of the present invention may optionally contain, in addition to the above-described green and red emitting phosphors, the after-described second phosphors (such as a blue emitting phosphor, a green emitting phosphor, a yellow emitting phosphor and an orange emitting phosphor) depending upon its application, or the emission wavelength of the solid light emitting device as an excitation source. Such phosphors may be used alone or as mixed in the form of a phosphor composition, as dispersed in a sealing material. The weight-average median diameter of these phosphors to be used for a light emitting device is usually at least 2 μm, preferably at least 5 μm and usually at most 30 μm, preferably at most 20 μm. If the weight-average median diameter is too small, the luminance tends to be low, and the phosphor particles tend to aggregate. On the other hand, if the weight-average median diameter is too large, non-uniform coating or clogging of e.g. a dispenser tends to occur.

The composition of the second phosphors which are phosphors other than the phosphors of the present invention, is not particularly limited, but it may, for example, be one obtained by combining, as an activated element or co-activated element, ions of a rare earth metal such as Ce, Pr, Nd, Pm, Sm, Eu, Tb, Dy, Ho, Er, Tm or Yb or ions of a metal such as Ag, Cu, Au, Al, Mn or Sb, to host crystal of e.g. a metal oxide represented by e.g. $Y_2O_3$, $YVO_4$, $SnO_2$, $Y_2$, $SiO_5$, $Zn_2SiO_4$, $Sr_2SiO_4$, $Y_3Al_5O_{12}$, $(Y,Gd)_3Al_5O_{12}$, $YAlO_3$, $BaMgAl_{10}O_{17}$, $(Ba,Sr)(Mg,Mn)Al_{10}O_{17}$, $(Ba,Sr,Ca)(Mg,Zn,Mn)Al_{10}O_{17}$, $BaAl_{12}O_{19}$, $CeMgAl_{11}O_{19}(Ba,Sr,Mg)O.Al_2O_3$, $BaAl_2Si_2O_8$, $SrAl_2O_4$ or $Sr_4Al_{14}O_{25}$, a metal nitride represented by e.g. $Sr_2Si_5N_8$, a halophosphate such as $Ca_{10}(PO_4)_8(F,Cl)_2$ or $(Sr,Ca,Ba,Mg)_{10}(PO_4)_6Cl_2$, a phosphate represented by e.g. $Sr_2P_2O_7$ or $(La,Ce)PO_4$, a sulfide represented by e.g. ZnS, SrS, CaS, (Zn,Cd)S or $SrGa_2S_4$, an oxysulfide represented by e.g. $Y_2O_2S$ or $La_2O_2S$ or a borate such as $GdMgB_5O_{10}$ or $(Y,Gd)BO_3$.

The above host crystal, activated element or coactivated element are not particularly limited with respect to the element composition and may partially be substituted by homologous elements. That is, the element composition may be any composition so long as the obtainable phosphor emits visible light upon absorption of light in a near ultraviolet to visible region.

Specifically, as such phosphors, ones given hereinafter may be employed, but they are merely exemplary, and phosphors which may be used in the present invention are by no means limited thereto. Further, in the following examples, as mentioned above, phosphors different in only part of the structure are omitted as the case requires.

In the light emitting device of the present invention, in addition to the above-described green emitting phosphor and red emitting phosphor, other types of green emitting phosphors and red emitting phosphors (homochromatic combination phosphors) may be used, as the case requires, depending upon the required properties.

(Orange or Red Emitting Phosphor)

As an orange or red emitting phosphor which may be combined with the red emitting phosphor of the present invention, an optional one may be used so long as the effects of the present invention are not substantially impaired.

At that time, the emission peak wavelength of the orange or red emitting phosphor as a homochromatic combination phosphor is usually at least 570 nm, preferably at least 580 nm, more preferably at least 585 nm and usually at most 780 nm, preferably at most 700 nm, more preferably at most 680 nm.

Such an orange or red emitting phosphor may, for example, be an europium-activated alkaline earth silicon nitride phosphor represented by $(Mg,Ca,Sr,Ba)_2Si_5N_8$:Eu which is composed of ruptured particles having a red ruptured face and which emits light in a red region, or an europium-activated rare earth oxycarcogenide phosphor represented by $(Y,La,Gd,Lu)_2O_2S$:Eu which is composed of grown particles having a substantially spherical shape as a regularly crystal-grown shape and which emits light in a red region.

Further, in the present invention, it is also possible to use phosphors disclosed in JP-A-2004-300247, which contain an oxynitride and/or an oxysulfide containing at least one element selected from the group consisting of Ti, Zr, Hf, Nb, Ta, W and Mo and which contains an oxynitride having a sialon structure wherein part or all of the Al element is substituted by Ga element. Here, they are phosphors containing an oxynitride and/or an oxysulfide.

Further, as other red emitting phosphors, it is possible to use, for example, an Eu-activated oxysulfide phosphor such as $(La,Y)_2O_2S$:Eu, an Eu-activated oxide phosphor such as $Y(V,P)O_4$:Eu or $Y_2O_3$:Eu, an Eu,Mn-activated silicate phosphor such as $(Ba,Mg)_2SiO_4$:Eu,Mn or $(Ba,Sr,Ca,Mg)_2SiO_4$:Eu,Mn, an Eu-activated tungstate phosphor such as $LiW_2O_8$:Eu, $LiW_2O_8$:Eu,Sm. $Eu_2W_2O_9$, $Eu_2W_2O_9$:Nb or $Eu_2W_2O_9$:Sm, an Eu-activated sulfide phosphor such as (Ca,Sr)S:Eu, an Eu-activated aluminate phosphor such as $YAlO_3$:Eu, an Eu-activated silicate phosphor such as $Ca_2Y_8(SiO_4)_6O_2$:Eu, $LiY_9(SiO_4)_6O_2$:Eu, $(Sr,Ba,Ca)_3SiO_5$:Eu or $Sr_2BaSiO_5$:Eu, a Ce-activated aluminate phosphor such as $(Y,Gd)_3Al_5O_{12}$:Ce or $(Tb,Gd)_3Al_5O_{12}$:Ce, an Eu-activated oxide, nitride or oxynitride phosphor such as $(Mg,Ca,Sr,Ba)_2Si_5(N,O)_8$:Eu, $(Mg,Ca,Sr,Ba)Si(N,O)_2$:Eu or $(Mg,Ca,Sr,Ba)AlSi(N,O)_3$:Eu, a Ce-activated oxide, nitride or oxynitride phosphor such as $(Mg,Ca,Sr,Ba)AlSi(N,O)_3$:Ce, an Eu,Mn-activated halophosphate phosphor such as $(Sr,Ca,Ba,Mg)_{10}(PO_4)_6Cl_2$:Eu,Mn, an Eu,Mn-activated silicate phosphor such as $Ba_3MgSi_2O_8$:Eu,Mn or $(Ba,Sr,Ca,Mg)_3(Zn,Mg)Si_2O_8$:Eu,Mn, a Mn-activated germanate phosphor such as $3.5MgO.0.5MgF_2GeO_2$:Mn, an Eu-activated oxynitride phosphor such as an Eu-activated $\alpha$ sialon, an Eu,Bi-activated oxide phosphor such as $(Gd,Y,Lu,La)_2O_3$: Eu,Bi, an Eu,Bi-activated oxisulfide phosphor such as $(Gd,Y,Lu,La)_2O_2S$:Eu,Bi, an Eu,Bi-activated vanadate phosphor such as $(Gd,Y,Lu,La)VO_4$:Eu,Bi, an Eu,Ce-activated sulfide phosphor such as $SrY_2S_4$:Eu,Ce, a Ce-activated sulfide phosphor such as $CaLa_2S_4$:Ce, an Eu,Mn-activated phosphate phosphor such as $(Ba,Sr,Ca)MgP_2O_7$:Eu,Mn or $(Sr,Ca,Ba,Mg,Zn)_2P_2O_7$:Eu,Mn, an Eu,Mo-activated tungstate phosphor such as $(Y,Lu)_2WO_6$:Eu,Mo, an Eu,Ce-activated nitride phosphor such as $(Ba,Sr,Ca)_xSi_yN_z$:Eu,Ce (wherein each of x, y and z is an integer of at least 1), an Eu,Mn-activated halophosphate phosphor such as $(Ca,Sr,Ba,Mg)_{10}(PO_4)_6(F,Cl,Br,OH)$:Eu,Mn and a Ce-activated silicate phosphor such as $(Y,Lu,Gd,Tb)_{1-x-y}Sc_xCe_y)_2(Ca,Mg)_{1-r}(Mg,Zn)_{2+r}Si_{3-q}Ge_qO_{12+\delta}$ (wherein each of x, y, r and $\delta$ is a number of 0 to 1, and q is a number of from 0 to 3).

As a red emitting phosphor, it is also possible to employ a red emitting organic phosphor made of a rare earth element ion complex containing, as a ligand, an anion such as a β-diketonate, a β-diketone, an aromatic carboxylic acid or a Broensted acid, a perylene pigment (such as dibenzo{[f,f']-4,4',7,7'-tetraphenyl}diindeno[1,2,3-cd:1',2',3'-lm] perylene), an anthraquinone pigment, a lake pigment, an azo pigment, a quinacridone pigment, an anthracene pigment, an isoindoline pigment, an isoindolinone pigment, a phthalocyanine pigment, a triphenylmethane basic dye, an indanthrone pigment, an indophenol pigment, a cyanine pigment or a dioxadine pigment.

Especially, the red emitting phosphor preferably contains $(Ca,Sr,Ba)_2Si_5(N,O)_8$:Eu, $(Ca,Sr,Ba)Si(N,O)_2$:Eu, $(Ca,Sr,Ba)AlSi(N,O)_3$:Eu, $(Ca,Sr,Ba)AlSi(N,O)_3$:Ce, $(Sr,Ba)_3SiO_5$:Eu, (Ca,Sr)S:Eu, $(La,Y)_2O_2S$:Eu, $(Ca,Sr,Ba)(Al,Ga)Si_4(N,O)_7$:Eu or an Eu complex; more preferably it contains $(Ca,Sr,Ba)_2Si_5(N,O)_8$:Eu, $(Ca,Sr,Ba)Si(N,O)_2$:Eu, $(Ca,Sr,Ba)AlSi(N,O)_3$:Eu, $(Ca,Sr,Ba)AlSi(N,O)_3$:Ce, $(Sr,Ba)_3SiO_5$ (Ca,Sr)S:Eu or $(La,Y)_2O_2S$:Eu, $(Ca,Sr,Ba)(Al,Ga)Si_4(N,O)_7$:Eu, or a β-diketone type Eu complex or carboxylic acid type Eu complex such as $Eu(dibenzoylmethane)_3$.1,10-phenanthroline complex; and particularly preferably it is $(Ca,Sr,Ba)_2Si_5(N,O)_8$:Eu, $(Sr,Ca)AlSiN_3$:Eu, $(Ca,Sr,Ba)(Al,Ga)Si_4(N,O)_7$:Eu or $(La,Y)_2O_2S$:Eu.

Among the above, as an orange emitting phosphor, $(Sr,Ba)_3SiO_5$:Eu is preferred. particularly preferred is one or more red emitting phosphors selected from the group consisting of $(Sr,Ca)AlSiN_3$:Eu and $La_2O_2S$:Eu.

(Green Emitting Phosphor)

As a green emitting phosphor which may be used in combination with the green emitting phosphor of the present invention, an optional one may be used so long as it does not substantially impair the effects of the present invention.

In a case where a green emitting phosphor is used as a second phosphor, as such a green emitting phosphor, any optional one may be used so long as it does not substantially impair the effects of the present invention. At that time, the emission peak wavelength of the green emitting phosphor is usually more than 500 nm, preferably at least 510 nm, more preferably at least 515 nm and usually at most 550 nm, preferably at most 542 nm, more preferably at most 535 nm. If this emission peak wavelength is too short, the emission tends to be bluish. On the other hand, if it is too long, the emission tends to be yellowish. In either case, the characteristics as green light may deteriorate.

Specifically, the green emitting phosphor may, for example, be an europium-activated alkaline earth silicone oxynitride phosphor $(Mg,Ca,Sr,Ba)Si_2O_2N_2$:Eu which is composed of ruptured particles having a ruptured face and which emits light in a green region.

Further, as other green emitting phosphors, it is also possible to use an Eu-activated aluminate phosphor such as $Sr_4Al_{14}O_{25}$:Eu, $(Ba,Sr,Ca)Al_2O_4$:Eu, an Eu-activated silicate phosphor such as $(Sr,Ba)Al_2Si_2O_8$:Eu, $(Ba,Mg)_2SiO_4$:Eu, $(Ba,Sr,Ca,Mg)_2SiO_4$:Eu, $(Ba,Sr,Ca)_2(Mg,Zn)Si_2O_7$:Eu or $(Ba,Ca,Sr,Mg)_9(Sc,Y,Lu,Gd)_2(Si,Ge)_6O_{24}$:Eu, a Ce,Tb-activated silicate phosphor such as $Y_2SiO_5$:Ce,Tb, an Eu-activated borophosphate phosphor such as $Sr_2P_2O_7$—$Sr_2B_2O_5$:Eu, an Eu-activated halosilicate phosphor such as $Sr_2Si_3O_8$-$2SrCl_2$:Eu, a Mn-activated silicate phosphor such as $Zn_2SiO_4$:Mn, a Tb-activated aluminate phosphor such as $CeMgAl_{11}O_{19}$:Tb or $Y_3Al_5O_{12}$:Tb, a Tb-activated silicate phosphor such as $Ca_2Y_8(SiO_4)_6O_2$:Tb or $La_3Ga_5SiO_{14}$:Tb, an Eu,Tb,Sm-activated thiogallate such as $(Sr,Ba,Ca)Ga_2S_4$:Eu,Tb,Sm, a Ce-activated aluminate phosphor such as $(Y,Tb)_3(Al,Ga)_5O_{12}$:Ce or $(Y,Ga,Tb,La,Sm,Pr,Lu)_3(Al,Ga)_5O_{12}$:Ce, a Ce-activated silicate phosphor such as $Ca_3(Sc,Mg)_2Si_3O_{12}$:Ce or $Ca_3(Sc,Mg,Na,Li)_2Si_3O_{17}$:Ce, a Ce-activated oxide phosphor such as $CaSc_2O_4$:Ce, an Eu-activated oxynitride phosphor such as Eu-activated β-sialon, an Eu,Mn-activated aluminate phosphor such as $(Ba,Sr)MgAl_{10}O_{17}$:Eu,Mn, an Eu-activated aluminate phosphor such as $SrAl_2O_4$:Eu, a Tb-activated oxysulfide phosphor such as $(La,Gd,Y)_2O_2S$:Tb, a Ce,Tb-activated phosphate phosphor such as $LaPO_4$:Ce,Tb, a sulfide phosphor such as ZnS:Cu,Al or ZnS:Cu,Au,Al, a Ce,Tb-activated borate phosphor such as $(Y,Ga,Lu,Sc,La)BO_3$:Ce,Tb, $Na_2Gd_2B_2O_7$:Ce,Tb or $(Ba,Sr)_2(Ca,Mg,Zn)B_2O_6$:K,Ce,Tb, an Eu,Mn-activated halosilicate phosphor such as $Ca_8Mg(SiO_4)_4Cl_2$:Eu,Mn, an Eu-activated thioaluminate phosphor or thiogallate phosphor such as $(Sr,Ca,Ba)(Al,Ga,In)_2S_4$:Eu, an Eu,Mn-activated halosilicate phosphor such as $(Ca,Sr)_8(Mg,Zn)(SiO_4)_4Cl_2$:Eu,Mn, and an Eu-activated oxynitride phosphor such as $M_3Si_5O_9N_4$:Eu or $M_3Si_6O_{12}N_2$:Eu (wherein M is an alkaline earth metal element).

Further, as a green emitting phosphor, it is also possible to employ an organic phosphor such as a pyridine/phthaloimide condensation derivative, a benzooxadinone type, quinazorinone type, coumarin type, quinophthalone type or naphthalic acid imide type fluorescent colorant, or a terbium complex.

Among the above exemplified ones, as a green emitting phosphor, it is preferred to use at least one member selected from the group consisting of $(Ba,Sr,Ca,Mg)_2SiO_4$:Eu, an Eu,Tb,Sm-activated thiogallate phosphor such as $(Sr,Ba,Ca)Ga_2S_4$:Eu,Tb,Sm, $(Y,Tb)_3(Al,Ga)_5O_{12}$:Ce, a Ce-activated silicate phosphor such as $Ca_3(Sc,Mg)_2Si_3O_{12}$:Ce or $Ca_3(Sc,Mg,Na,Li)_2Si_3O_{12}$:Ce, a Ce-activated oxide phosphor such as $CaSc_2O_4$:Ce, an Eu-activated oxynitride phosphor such as Eu-activated β-sialon, an Eu,Mn-activated aluminate phosphor such as $(Ba,Sr)MgAl_{10}O_{17}$:Eu,Mn, an Eu-activated aluminate phosphor such as $SrAl_2O_4$:Eu, an Eu-activated thioaluminate phosphor or thiogallate phosphor such as $(Sr,Ca,Ba)(Al,Ga,In)_2S_4$:Eu, and an Eu-activated oxynitride phosphor such as $M_3Si_6O_{12}N_2$:Eu (wherein M is an alkaline earth metal element). Further, among them, for a display application, it is preferred to use a phosphor having a narrow emission peak half-value width. Specifically, it is preferred to use at least one member selected from the group consisting of $(Ba,Sr,Ca,Mg)_2SiO_4$:Eu, an Eu-activated thiogallate phosphor such as $(Sr,Ba,Ca)Ga_2S_4$:Eu, an Eu-activated oxynitride phosphor such as Eu-activated β-sialon, an Eu,Mn-activated aluminate phosphor such as $(Ba,Sr)MgAl_{10}O_{17}$:Eu,Mn, an Eu-activated thioaluminate phosphor or thiogallate phosphor such as $(Sr,Ca,Ba)(Al,Ga,In)_2S_4$:Eu and an Eu-activated oxynitride phosphor such as $M_3Si_8O_{12}N_2$:Eu (wherein M is an alkaline earth metal element); it is more preferred to use $(Ba,Sr)MgAl_{10}O_{17}$:Eu,Mn; it is particularly preferred to use $BaMgAl_{10}O_{17}$:Eu,Mn.

(Blue Emitting Phosphor)

In a case where a blue emitting phosphor is used for a light emitting device of the present invention, as such a blue emitting phosphor, any optional one may be used so long as it does not substantially impair the effect of the present invention. At that time, the emission peak wavelength of the blue emitting phosphor is usually at least 420 nm, preferably at least 430 nm, more preferably at least 440 nm and usually at most 490 nm, preferably at most 480 nm, more preferably at most 470 nm, further preferably at most 460 nm. When the emission peak wavelength of the blue emitting phosphor to be used, is within this range, it overlaps the excitation band of a red emitting phosphor to be used in the present invention, and by the blue light from the blue emitting phosphor, the red emitting phosphor to be used in the present invention can be efficiently excited.

Such a blue emitting phosphor may, for example, be an europium-activated barium magnesium aluminate phosphor represented by $(Ba,Sr,Ca)MgAl_{10}O_{17}$:Eu which is composed of grown particles having a substantially hexagonal shape as a regular crystal growth shape and which emits light in a blue region, an europium-activated halophosphate calcium phosphor represented by $(Mg,Ca,Sr,Ba)_5(PO_4)_3(Cl,F)$:Eu which is composed of grown particles having a substantially spherical shape as a regular crystal growth shape and which emits light in a blue region, an europium-activated alkaline earth chloroborate phosphor represented by $(Ca,Sr,Ba)_2B_5O_9Cl$:Eu which is composed of grown particles having substantially a cubic shape as a regular crystal growth shape and which emits light in a blue region, or an europium-activated alkaline earth aluminate phosphor represented by $(Sr,Ca,Ba)Al_2O_4$:Eu or $(Sr,Ca,Ba)_4Al_{14}O_{25}$:Eu which is composed of ruptured particles having a ruptured face and which emits light in a bluish green region.

Further, as a blue emitting phosphor, it is also possible to use a Sn-activated phosphate phosphor such as $Sr_2P_2O_7$:Sn, an Eu-activated aluminate phosphor such as $(Sr,Ca,Ba)Al_2O_4$:Eu, $(Sr,Ca,Ba)_4Al_{14}O_{25}$:Eu, $BaMgAl_{10}O_{17}$:Eu, $(Ba,Sr,Ca)MgAl_{10}O_{17}$:Eu, $BaMgAl_{10}O_{17}$:Eu,Tb,Sm or $BaAl_3O_{13}$:Eu, a Ce-activated thiogallate phosphor such as $SrGa_2S_4$:Ce or $CaGa_2S_4$:Ce, an Eu,Mn-activated aluminate phosphor such as $(Ba,Sr,Ca)MgAl_{10}O_{17}$:Eu,Mn, an Eu-activated halophosphoate phosphor such as $(Sr,Ca,Ba,Mg)_{10}$ $(PO_4)_6Cl_2$:Eu or $(Ba,Sr,Ca)_5(PO_4)_3$ (Cl,F,Br,OH):Eu,Mn,Sb, an Eu-activated silicate phosphor such as $BaAl_2Si_2O_8$:Eu or $(Sr,Ba)_3MgSi_2O_8$:Eu, an Eu-activated phosphate phosphor such as $Sr_2P_2O_7$:Eu, a sulfide phosphor such as ZnS:Ag or ZnS:Ag,Al, a Ce-activated silicate phosphor such as $Y_2SiO_5$:Ce, a tungstate phosphor such as $CaWO_4$ an Eu,Mn-activated borophosphate phosphor such as $(Ba,Sr,Ca)BPO_5$:Eu,Mn, $(Sr,Ca)_{10}$ $(PO_4)_5$-$nB_2O_3$:Eu or $2SrO.0.84P_2O_5.0.16B_2O_3$:Eu, an Eu-activated halosilicate phosphor such as $Sr_2Si_3O_8.2SrCl_2$:Eu, an Eu-activated oxynitride phosphor such as $SrSi_9Al_{19}O_{31}$:Eu or $EuSi_9Al_{19}ON_{31}$, or a Ce-activated oxynitride phosphor such as $La_{1-x}Ce_xAl(Si_{6-z}Al_z)(N_{10-z}O_z)$ (wherein x and y are, respectively, numbers satisfying $0\leq x\leq 1$ and $0\leq z\leq 6$), or $La_{1-x-y}Ce_xCa_yAl(Si_{6-z}Al_z)(N_{10-z}O_z)$ (wherein x, y and z are, respectively, numbers satisfying $0\leq x\leq 1$, $0\leq y\leq 1$ and $0\leq z\leq 6$).

Further, as a blue emitting phosphor, it is also possible to employ, for example, an organic phosphor such as a fluorescent colorant of a naphthalic acid imide type, benzooxazole type, styryl type, coumarin type, pyrazoline type or triazole type compound, or thulium complex.

Among the above exemplified ones, as a blue emitting phosphor, it preferably contains $(Ca,Sr,Ba)MgAl_{10}O_{17}$:Eu, $(Sr,Ca,Ba,Mg)_{10}(PO_4)_6(Cl,F)_2$:Eu or $(Ba,Ca,Mg,Sr)_2SiO_4$:Eu; it more preferably contains $(Ca,Sr,Ba)MgAl_{10}O_{17}$:Eu, $(Sr,Ca,Ba,Mg)_{10}(PO_4)_6$ $(Cl,F)_2$:Eu or $(Ba,Ca,Sr)_3MgSi_2O_8$:Eu; and it further preferably contains $BaMgAl_{10}O_{17}$:Eu, $Sr_{10}(PO_4)_6(Cl,F)_2$:Eu or $Ba_3MgSi_2O_8$:Eu. Further, among them, for a display application, $(Sr,Ca,Ba,Mg)_{10}(PO_4)_6Cl_2$:Eu or $(Ca,Sr,Ba)MgAl_{10}O_{17}$:Eu having a narrow emission peak half-value width is preferred; $(Sr,Ca,Ba,Mg)_{10}(PO_4)_3Cl_2$:Eu is more preferred; and $Sr_{10}(PO_4)_6Cl_2$:Eu is particularly preferred.

Among the above-mentioned ones, a phosphor represented by $(Sr,Ca,Ba,Mg)_{10}(PO_4)_5Cl_2$:Eu is preferably one obtained by a multistage firing process as described in the after-described Preparation Example I-7 wherein a flux is used in the second or subsequent firing step. As such a phosphor, one disclosed in WO2009/005035 may be mentioned.

Further, as a phosphor represented by (Ca,Sr,Ba) $MgAl_{10}O_{17}$:Eu, a phosphor is preferred which contains an alkali metal in the crystal phase of the phosphor and wherein the content of the alkali metal element is at most 3% based on the number of sites which can be substituted by Eu, since it has a constantly high emission intensity and luminance even under excitation with a near ultraviolet light and it is excellent also in the temperature characteristics.

Further, as such a phosphor, one containing F as an anionic element is preferred.

The type and content of the above alkali metal element and the content of the F element are the same as those described above with respect to the formula (G7). Such a phosphor can be prepared as disclosed in WO2008/123498 by permitting a monovalent metal halide to be present as a flux in a prescribed concentration during the firing of the raw material mixture.

As such a blue emitting phosphor, it is particularly preferred to employ one, of which the variation rate of the emission peak intensity at 100° C. to the emission intensity at 25° C., when the wavelength of the excitation light is 400 nm or 405 nm, is at most 30%, more preferably at most 25%, further preferably at most 22%, still further preferably at most 18%, particularly preferably at most 15%.

In the light emitting device of the present invention, the green and red emitting phosphors excellent in the temperature dependency are used, and therefore, it is preferred that also the blue emitting phosphor has such characteristics, whereby a color shift can be prevented.

Here, the temperature dependency of the blue emitting phosphor can be measured in the same manner as the measurement of the temperature dependency of the above-described green and red emitting phosphors except that the wavelength of the excitation light is adjusted to 400 nm or 405 nm.

Any one of the above exemplified blue emitting phosphors may be used alone, or two or more of them may be used in an optional combination or ratio.

(Yellow Emitting Phosphor)

In a case where a yellow emitting phosphor is used for a light emitting device of the present invention, as such a yellow emitting phosphor, any optional one may be used so long as it does not substantially impair the effects of the present invention. At that time, the emission peak wavelength of the yellow emitting phosphor is usually at least 530 nm, preferably at least 540 nm, more preferably at least 550 nm and usually at most 620 nm, preferably at most 600 nm, more preferably at most 580 nm.

As such a yellow phosphor, various phosphors of oxide type, nitride type, oxynitride type, sulfide type, oxysulfide type, etc., may be mentioned. Particularly, it may be a garnet phosphor having a garnet structure represented by e.g. $RE_3M_5O_{12}$:Ce (wherein $R_E$ is at least one element selected from the group consisting of Y, Tb, Gd, Lu, and Sm, and M is at least one element selected from the group consisting of Al, Ga and Sc) or $M^a{}_3M^b{}_2M^c{}_3O_{12}$:Ce (wherein $M^a$ is a bivalent metal element, $M^b$ is a trivalent metal element, and $M^c$ is a tetravalent metal element), an orthosilicate phosphor represented by $AE_2M_dO_4$:Eu (wherein AE is at least one element selected from the group consisting of Ba, Sr, Ca, Mg and Zn, and Mg is Si and/or Ge), an oxynitride phosphor having part of oxygen as a constituting element of such a phosphor substituted by nitrogen, or a Ce-activated phosphor of e.g. a nitride phosphor having a $CaAlSiN_3$ structure, such as $AEAlSiN_3$:Ce (wherein AE is at least one element selected from the group consisting of Ba, Sr, Ca, Mg and Zn).

Further, as a yellow emitting phosphor, it is also possible to employ a sulfide phosphor such as $CaGa_2S_4$:Eu, (Ca,Sr) $Ga_2S_4$:Eu or $(Ca,Sr)(Ga,Al)_2S_4$:Eu, an Eu-activated phosphor such as an oxynitfide type phosphor having a sialon structure such as $Ca_X(Si,Al)_{12}(O,N)_{16}$:Eu (wherein x is $0\leq x\leq 4$), an Eu-activated or Eu,Mn-coactivated halogenated borate phosphor such as $(M_{1-A-B}Eu_AMn_B)_2(BO_3)_{1-P}(PO_4)_P$ X (wherein M is at least one element selected from the group consisting of Ca, Sr and Ba, X is at least one element selected from the group consisting of F, Cl and Br, and A, B and P are respectively numbers satisfying $0.001\leq A\leq 0.3$, $0\leq B\leq 0.3$ and $0\leq P\leq 0.2$), or a Ce-activated nitride phosphor having a $La_3Si_6N_{11}$ structure which may contain an alkaline earth metal element.

Further, as a yellow emitting phosphor, it is possible to employ, for example, a fluorescent dye such as brilliant sulfoflavine FF (Colour Index Number 56205), basic yellow HG (Colour Index Number 46040), cosine (Colour Index Number 45380) or rhodamine 6G (Colour Index Number 45160).

Any one of the above exemplified yellow emitting phosphors may be used alone, or two or more of them may be used in an optional combination or ratio.

(3-1-1) Combination of Phosphors

The amounts of the above-mentioned respective phosphors, and the combination, the ratio, etc. of the phosphors may optionally be set depending upon e.g. the particular application of the light emitting device.

For example, in a case where the light emitting device of the present invention is to be constructed as a red emitting device, only the red emitting phosphor of the present invention may be used, and use of other phosphors is usually unnecessary.

On the other hand, in a case where the light emitting device of the present invention is to be constructed as a white emitting device, the red emitting phosphor and green emitting phosphor are used, and, as the case requires, a blue emitting phosphor and/or a yellow emitting phosphor may, for example, be suitably combined, in order to obtain the desired white light. Specifically, the following combination (A) or (B) may be mentioned as a preferred combination of phosphors in a case where the light emitting device of the present invention is constructed as a white emitting device.

(A) As the first illuminant, a blue illuminant (blue emitting LED or the like) is used, and the above-described red emitting phosphor and one or more green emitting phosphors selected from the group consisting of a $(Ba,Sr,Ca,Mg)_2SiO_4$:Eu type phosphor, a $(Ca,Sr)Sc_2O_4$:Ce type phosphor, a $(Ca_3(Sc,Mg)_2Si_3O_{12}$:Ce type phosphor, an Eu-activated β-sialon type phosphor, a $(Mg,Ca,Sr,Ba)Si_2O_2N_2$:Eu type phosphor and a $(Mg,Ca,Sr,Ba)_3Si_6O_{12}N_2$:Eu type phosphor, are used.

(B) As a first illuminant, a near ultraviolet or violet illuminant (near ultraviolet or violet emitting LED or the like) is used, the above red emitting phosphor and one or more green emitting phosphor are used, and a blue emitting phosphor is further used in combination, In this case, as the blue emitting phosphor, a $(Ba,Sr)MgAl_{10}O_{17}$:Eu type phosphor and/or a $(Sr,Ca,Ba,Mg)_{10}(PO_4)_6(Cl,F)_2$:Eu type phosphor is used, and as the green emitting phosphor, one or more green emitting phosphors selected from the group consisting of a $(Ba,Sr)MgAl_{10}O_{17}$:Eu,Mn type phosphor, a $(Ba,Sr,Ca,Mg)_2SiO_4$:Eu type phosphor, a $(Ca,Sr)Sc_2O_4$:Ce type phosphor, a $Ca_3(Sc,Mg)_2Si_3O_{12}$:Ce type phosphor, an Eu-activated β-sialon type phosphor, a $(Mg,Ca,Sr,Ba)Si_2O_2N_2$:Eu type phosphor, a $(Mg,Ca,Sr,Ba)_3Si_6O_{12}N_2$:Eu type phosphor, a $(Ba,Sr,Ca)_4Al_{14}O_{25}$:Eu and $(Ba,Sr,Ca)Al_2O_4$:Eu type phosphors, are used.

It is particularly preferred to use a phosphor having a narrow emission peak half-value width for each of three colors of red, blue and green, since it is thereby possible to remarkably improve the color reproduction range of a display. Specifically, it is preferred to use a near ultraviolet emitting LED, the red emitting phosphor of the present invention, $(Ba,Sr)MgAl_{10}O_{17}$:Eu,Mn as a green emitting phosphor and $(Sr,Ca,Ba,Mg)_{10}(PO_4)_6(Cl,F)_2$:Eu as a blue emitting phosphor, in combination.

Now, depending upon the applications of the light emitting device, suitable combinations of the solid light emitting device and the phosphors are shown in Tables 4 to 8 and will be described in further detail.

TABLE 4

(1) CASES WHERE BLUE ILLUMINANT IS USED AS FIRST ILLUMINANT

| First illuminant | Green emitting phosphor | Red emitting phosphor |
|---|---|---|
| (1-1) APPLICATION OF IMAGE DISPLAY DEVICE TO BACKLIGHT | | |
| Blue emitting LED | $(Mg,Ca,Sr,Ba)Si_2O_2N_2$: Eu<br>$(Ba,Sr,Ca,Mg)_2SiO_4$: Eu<br>$(Ba,Sr)_3Si_6O_{12}N_2$: Eu<br>Eu-activated β-sialon | Red emitting phosphor of the invention |
| (1-2) APPLICATION TO ILLUMINATING DEVICE | | |
| Blue emitting LED | $(Y,Tb)_3(Al,Ga)_5O_{12}$: Ce<br>$Ca_3(Sc,Mg,Na,Li)_2Si_3O_{12}$: Ce<br>$(Ca,Sr)Sc_2O_4$: Ce<br>$(Mg,Ca,Sr,Ba)Si_2O_2N_2$: Eu<br>$(Ba,Sr,Ca,Mg)_2SiO_4$: Eu<br>$(Ba,Sr)_3Si_6O_{12}N_2$: Eu | Red emitting phosphor of the invention |

TABLE 5

(2) CASES WHERE NEAR ULTRAVIOLET ILLUMINANT IS USED AS FIRST ILLUMINANT

| First illuminant | Blue emitting phosphor | Green emitting phosphor | Red emitting phosphor |
|---|---|---|---|
| (2-1) APPLICATION OF IMAGE DISPLAY DEVICE TO BACKLIGHT | | | |
| Near ultraviolet emitting LED | $(Sr,Ca,Ba,Mg)_{10}(PO_4)_6(Cl,F)_2$: Eu<br>$(Sr,Ba)_3MgSi_2O_8$: Eu<br>$(Ba,Sr,Ca)MgAl_{10}O_{17}$: Eu | $(Mg,Ca,Sr,Ba)Si_2O_2N_2$: Eu<br>$(Ba,Sr,Ca,Mg)_2SiO_4$: Eu<br>$(Ba,Sr)_3Si_6O_{12}N_2$: Eu<br>Eu-activated β-sialon<br>$(Ba,Sr)MgAl_{10}0_{17}$: Eu,Mn | Red emitting phosphor of the invention |
| (2-2) APPLICATION TO ILLUMINATING DEVICE | | | |
| Near ultraviolet emitting LED | $(Sr,Ca,Ba,Mg)_{10}(PO_4)_6(Cl,F)_2$: Eu<br>$(Sr,Ba)_3MgSi_2O_8$: Eu<br>$(Ba,Sr,Ca)MgAl_{10}O_{17}$: Eu | $(Y,Tb)_3(Al,Ga)_5O_{12}$: Ce<br>$Ca_3(Sc,Mg,Na,Li)_2Si_3O_{12}$: Ce<br>$(Ca,Sr)Sc_2O_4$: Ce<br>$(Mg,Ca,Sr,Ba)Si_2O_2N_2$: Eu<br>$(Ba,Sr,Ca,Mg)_2SiO_4$: Eu<br>$(Ba,Sr)_3Si_6O_{12}N_2$: Eu<br>$(Sr,Ca,Ba)Al_2O_4$: Eu | Red emitting phosphor of the invention |

Further, among them, the following combinations are further preferred

TABLE 6

| (1) CASES WHERE BLUE ILLUMINANT IS USED AS FIRST ILLUMINANT | | |
|---|---|---|
| First illuminant | Green emitting phosphor | Red emitting phosphor |
| (1-1) APPLICATION OF IMAGE DISPLAY DEVICE TO BACKLIGHT | | |
| Blue emitting LED | $(Mg,Ca,Sr,Ba)Si_2O_2N_2$: Eu<br>$(Ba,Sr,Ca,Mg)_2SiO_4$: Eu<br>$(Ba,Sr)_3Si_6O_{12}N_2$: Eu<br>Eu-activated β-sialon | Red emitting phosphor of the invention |

TABLE 6-continued

| (1) CASES WHERE BLUE ILLUMINANT IS USED AS FIRST ILLUMINANT | | |
|---|---|---|
| First illuminant | Green emitting phosphor | Red emitting phosphor |
| (1-2) APPLICATION TO ILLUMINATING DEVICE | | |
| Blue emitting LED | $Y_3(Al,Ga)_5O_{12}$: Ce<br>$Ca_3(Sc,Mg)_2Si_3O_{12}$: Ce<br>$CaSc_2O_4$: Ce<br>$(Sr,Ba)Si_2O_2N_2$: Eu<br>$(Ba,Sr,Ca)_2SiO_4$: Eu<br>$(Ba,Sr)_3Si_6O_{12}N_2$: Eu | Red emitting phosphor of the invention |

TABLE 7

| (2) CASES WHERE NEAR ULTRAVIOLET ILLUMINANT IS USED AS FIRST ILLUMINANT | | | |
|---|---|---|---|
| First illuminant | Blue emitting phosphor | Green emitting phosphor | Red emitting phosphor |
| (2-1) APPLICATION OF IMAGE DISPLAY DEVICE TO BACKLIGHT | | | |
| Near ultraviolet emitting LED | $Sr_{10}(PO_4)_6Cl_2$: Eu<br>$(Sr,Ba)_3MgSi_2O_8$: Eu<br>$BaMgAl_{10}O_{17}$: Eu | $(Sr,Ba)Si_2O_2N_2$: Eu<br>$(Ba,Sr)_2SiO_4$: Eu<br>$(Ba,Sr)_3Si_6O_{12}N_2$: Eu<br>Eu-activated β-sialon<br>$BaMgAl_{10}O_{17}$: Eu,Mn | Red emitting phosphor of the invention |
| (2-2) APPLICATION TO ILLUMINATING DEVICE | | | |
| Near ultraviolet emitting LED | $Sr_{10}(PO_4)_6Cl_2$: Eu<br>$(Sr,Ba)_3MgSi_2O_8$: Eu<br>$BaMgAl_{10}O_{17}$: Eu | $Y_3(Al,Ga)_5O_{12}$: Ce<br>$Ca_3(Sc,Mg)_2Si_3O_{12}$: Ce<br>$CaSc_2O_4$: Ce<br>$(Sr,Ba)Si_2O_2N_2$: Eu<br>$(Ba,Sr,Ca)_2SiO_4$: Eu<br>$(Ba,Sr)_3Si_6O_{12}N_2$: Eu<br>$(Sr,Ca,Ba)Al_2O_4$: Eu | Red emitting phosphor of the invention |

Among them, the following combinations are further preferred.

TABLE 8

| (1) CASES WHERE BLUE ILLUMINANT IS USED AS FIRST ILLUMINANT | | |
|---|---|---|
| First illuminant | Green emitting phosphor | Red emitting phosphor |
| (1-1) APPLICATION OF IMAGE DISPLAY DEVICE TO BACKLIGHT | | |
| Blue emitting LED | $(Ba,Sr)_2SiO_4$: Eu<br>$(Ba,Sr)_3Si_6O_{12}N_2$: Eu<br>Eu-activated β-sialon | Red emitting phosphor of the invention |
| (1-2) APPLICATION TO ILLUMINATING DEVICE | | |
| Blue emitting LED | $Y_3(Al,Ga)_5O_{12}$: Ce<br>$Ca_3(Sc,Mg)_2Si_3O_{12}$: Ce<br>$CaSc_2O_4$: Ce | Red emitting phosphor of the invention |

| (2) CASES WHERE NEAR ULTRAVIOLET ILLUMINANT IS USED AS FIRST ILLUMINANT | | | |
|---|---|---|---|
| First illuminant | Blue emitting phosphor | Green emitting phosphor | Red emitting phosphor |
| (2-1) APPLICATION OF IMAGE DISPLAY DEVICE TO BACKLIGHT | | | |
| Near ultraviolet emitting LED | $Sr_{10}(PO_4)_6Cl_2$: Eu | $BaMgAl_{10}O_{17}$: Eu,Mn | Red emitting phosphor of the invention |
| (2-2) APPLICATION TO ILLUMINATING DEVICE | | | |
| Near ultraviolet emitting LED | $BaMgAl_{10}O_{17}$: Eu | $(Ba,Sr,Ca)_2SiO_4$: Eu<br>$(Ba,Sr)_3Si_6O_{12}N_2$: Eu | Red emitting phosphor of the invention |

(3-2) Construction of Light Emitting Device (Phosphor-Containing Composition)

In the light emitting device of the present invention, the above-described phosphors are used usually in the state of a phosphor-containing composition having them dispersed in a liquid medium as a sealing material (binder). One having the phosphors of the present invention dispersed in a liquid medium will be referred to as "the phosphor-containing composition of the present invention", as the case requires.

(3-2-1) Liquid Medium

The liquid medium to be used for the phosphor-containing composition of the present invention is not particularly limited so long as it does not impair the performance of the phosphors within the desired range, but usually, a curable material which can be molded to cover the solid light emitting device, may be employed.

The curable material is a material which is a fluid material and can be cured by applying certain curing treatment. Here, "fluid" means, for example, a liquid or gel state. The curable material is not limited with respect to the specific type, so long as it reserves a role of guiding light emitted from the solid light emitting device to the phosphors. Further, one of curable materials may be used alone, or two or more of them may be used in an optional combination or ratio.

Accordingly, the curable material may be any material so long as it shows a liquid nature under the desired working conditions and it is capable of well dispersing the phosphors of the present invention and at the same time will not bring about an undesirable reaction, and an inorganic material, an organic material or a mixture of both may be employed.

An inorganic material may, for example, be a metal alkoxide; a solution obtained by hydrolyzing and polymerizing a solution containing a ceramic precursor polymer or a metal alkoxide by a sol-gel method; or an inorganic material having such a combination solidified (e.g. an inorganic material having siloxane bonds).

On the other hand, an organic material may, for example, be a thermoplastic resin, a thermosetting resin or a photocurable resin. Specific examples include, for example, a (meth)acrylic resin such as polymethyl (meth)acrylate; a styrene resin such as polystyrene or a styrene/acrylonitrile copolymer; a polycarbonate resin; a polyester resin; a phenoxy resin; a butyral resin; a polyvinyl alcohol; a cellulose resin such as ethyl cellulose, cellulose acetate or cellulose acetate butyrate; an epoxy resin; a phenol resin; and a silicone resin.

Among the above inorganic materials and organic materials, it is particularly preferred to use a silicon-containing compound which is excellent in heat resistance and which is substantially free from deterioration by light emitted from a light emitting device.

A silicon-containing compound is a compound having silicon atoms in its molecule, and it may be an organic material (a silicone compound) such as a polyorganosiloxane, an inorganic material such as silicon oxide, silicon nitride or silicon oxynitride, or a glass material such as a borosilicate, a phosphosilicate or an alkali metal silicate. Among them, a silicone material is preferred since it is excellent in transparency, adhesion, handling efficiency, mechanical and thermal relaxation properties.

Such a silicone material usually means an organic polymer having a siloxane bond as the main chain, and, for example, a silicone material of e.g. condensation type, addition type, improved sol-gel type or photocurable type may be used.

As a condensation type silicone material, for example, components for semiconductor light emitting devices disclosed in e.g. JP-A-2007-112973 to 112975, JP-A-2007-19459 and JP-A-2008-34833, may be used. Such a condensation type silicone material is excellent in adhesion with a component such as a package, an electrode or a light emitting element to be used for a semiconductor light emitting device, whereby addition of an adhesion-improving component can be minimized, and crosslinking is mainly by siloxane bonds, whereby there is a merit in that it is excellent in heat resistance and light resistance.

As an addition type silicone material, it is possible to suitably use, for example, a silicone material for potting as disclosed in e.g. JP-A-2004-186168, JP-A-2004-221308 and JP-A-2005-327777, an organic modified silicone material for potting as disclosed in e.g. JP-A-2003-183881 and JP-A-2006-206919, a silicone material for injection molding as disclosed in e.g. JP-A-2006-324596 or a silicone material for transfer molding as disclosed in e.g. JP-A-2007-231173. Such an addition type silicone material has merits such that the degree of freedom is high in selection of e.g. the curing rate or the hardness of the cured product, it is free from a component which detaches at the time of curing and substantially free from curing shrinkage, and if is excellent in depth curability.

Further, as an improved sol-gel type silicone material as one of the condensation type silicone material, it is possible to suitably use, for example, a silicone material as disclosed in e.g. JP-A-2006-077234, JP-A-2006-291018 and JP-A-2007-119569. Such an improved sol-gel type silicone material has merits such that it has a high crosslinking degree and is excellent in durability with high heat resistance and light resistance and it has low gas permeability and is excellent also in the function to protect a phosphor having low moisture resistance.

As a photocurable type silicone material, it is possible to suitably use a silicone material as disclosed in e.g. JP-A-2007-131812 and JP-A-2007-214543. An ultraviolet curable type silicone material has merits such that it cures in a short time and thus is excellent in productivity, and it is not required to apply a high temperature for curing, whereby deterioration of the light emitting device is less likely to take place.

Such a silicone material may be used alone, or a plurality of such silicone materials may be used as mixed, if no curing inhibition takes place by such mixing.

Especially in a case where it is used for a semiconductor light emitting device, it is more preferred to use a condensation type silicone material from the viewpoint of the heat resistance and deterioration resistance against the emission wavelengths in an ultraviolet region to a blue region.

(3-2-2) Contents of Liquid Medium and Phosphors

The content of the liquid medium is optional so long as the effects of the present invention are not substantially impaired, but it is usually at least 25 wt %, preferably at least 40 wt % and usually at most 99 wt %, preferably at most 95 wt %, more preferably at most 80 wt %, based on the entire phosphor-containing composition of the present invention. There will be no particular problem in a case where the amount of the liquid medium is large. However, in order to obtain the desired chromaticity coordinates, color rendering index, emission efficiency, etc. when made into a semiconductor light emitting device, it is usually advisable to use the liquid medium in the above-mentioned content. On the other hand, if the liquid medium is too small, the fluidity deteriorates, whereby the handling tends to be difficult.

In the phosphor-containing composition of the present invention, the liquid medium has a role mainly as a binder. One type of such a liquid medium may be used alone, or two or more types may be used in an optional combination or ratio. For example, in a case where a silicon-containing compound is used for the purpose of improving e.g. heat resistance or light resistance another heat curable resin such as an epoxy resin may be contained within a range not to impair the durability of the silicon-containing compound. In such a case, the content of another heat curable resin is usually at most 25 wt %, preferably at most 10 wt %, based on the total amount of the liquid medium as the binder.

The content of the phosphors in the phosphor-containing composition of the present invention is optional so long as the effects of the present invention are not substantially impaired, but it is usually at least 1 wt %, preferably at least 3 wt %, more preferably at least 5 wt %, further preferably at least 10 wt %, particularly preferably at least 20 wt % and usually at most 80 wt %, preferably at most 60 wt %, based on the entire phosphor-containing composition of the present invention. Further, the proportion of the phosphors of the present invention occupying the phosphors in the phosphor-containing composition is also optional, but it is usually at least 30 wt %, preferably at least 50 wt % and usually at most 100 wt %. If the content of the phosphors in the phosphor-containing composition is too much, the fluidity of the phosphor-containing composition tends to be poor, and handling tends to be difficult, and if the content of the phosphors is too small, the emission efficiency of the light emitting device tends to be low.

(3-2-3) Other Components

Further, in the liquid medium, additives such as a diffusing agent to make the emission light to be more uniform, a filler, a viscosity-controlling agent, an ultraviolet absorber, a refractive index-controlling agent, a shrinkage-reducing agent and a binder may be contained as other components, so long as they do not substantially impair the effects of the present invention. One type of such other components may be used alone, or two or more types may be used in an optional combination or ratio.

As the diffusing agent, a colorless material having a size of from 100 nm to a few tens μm by an average particle size, is preferred. Alumina, zirconia, yttoria or the like can be preferably employed as the diffusing agent, since it is stable in a practical temperature range of from −60 to 120° C. Further, if the refractive index is high, the effects of the diffusing agent will be high, such being more preferred.

Further, in a case where phosphors having large particle sizes are used, color shading or color shift is likely to occur due to precipitation of the phosphors, and accordingly, it is preferred to incorporate a precipitation preventing agent to the binder. As the precipitation-preventing agent, ultrafine particulate silica having a particle size of about 10 nm or fumed silica (dried silica), such as “tradename: AEROSIL #200, manufactured by Nippon Aerosil Co., Ltd.” or “tradename: Reolosil, manufactured by Tokuyama Corporation” is common.

(3-3) Construction of Light Emitting Device (Others)

So long as the light emitting device of the present invention is provided with the above-described solid light emitting device and phosphors, other constructions are not particularly limited. Usually, however, the above-described solid light emitting device and phosphors are disposed on a suitable frame. At that time, they are disposed so that the phosphors are excited by light emitted from the solid light emitting device to emit light, and the emission of the solid light emitting device and/or the emission of the phosphors is taken out to the exterior. In such a case, a plurality of phosphors may not necessarily be mixed in the same layer. For example, phosphors may be contained in separate layers for the respective emission colors of the phosphors, and such layers may be deposited.

The above frame has at least positive and negative electrodes to conduct current to the light source of the solid light emitting device, and the electrodes of the solid light emitting device and the electrodes of the frame are electrically connected. These electrodes are electrically connected by wire bonding or flip chip bonding. When they are bonded by wire bonding, a gold wire or aluminum wire having a diameter of from 20 to 40 μm may be employed.

The light emitting device of the present invention can be made to be a light emitting device suitable for a light source for the after-mentioned backlight for an image display device by combining a specific red emitting phosphor and a specific green emitting phosphor to be excited by an emission having wavelengths in an ultraviolet to blue region and by combining them with another specific blue emitting phosphor, as the case requires. That is, the red emitting phosphor to be used in the present invention presents luminance which has a narrow band in a red region and is excellent in the temperature characteristics, and accordingly, by combining it with the above solid light emitting device and phosphors, it is possible to produce a semiconductor light emitting device as a light source for a backlight for an image display device which is capable of setting the emission efficiency at a level higher than ever and yet is capable of setting the color reproduction range broader than ever.

Further, in an application to a light source for a backlight for an image display device employing a plurality of solid light emitting devices, it is desired to use, as such solid light emitting devices, ones having little fluctuation in the emission efficiency. Since phosphors to be excited by wavelengths in a near ultraviolet to blue region are, in many cases, ones, of which the excitation efficiency substantially changes in the vicinity of a wavelength of 400 nm, it is particularly preferred to use a semiconductor light emitting device having little fluctuation in the emission efficiency. Specifically, the degree of fluctuation in the emission wavelength at which the emission efficiency in a semiconductor light emitting device becomes maximum, is usually at most ±5 nm, preferably at most ±2.5 nm, more preferably at most ±1.25 nm.

Further, a concave cup is provided on the frame, and the solid light emitting device is disposed on its bottom surface, whereby it is possible to let the outgoing light have directivity and thereby to effectively utilize the light. Further, by subjecting the inner surface of the concave portion or the entirety of the frame to plating treatment with a highly reflective metal such as silver, platinum or aluminum or its alloy, if is possible to increase the reflectance in the entire visible light region and thereby to increase the light use efficiency, such being more preferred. Further, similar effects can be obtained by making the surface of the concave portion or the entirety of the frame from an injection molding resin containing a highly reflective material such as a white-colored glass fiber, alumina powder or titania powder.

To fix the solid light emitting device, an adhesive of e.g. epoxy type, imide type or acrylic type, a solder of AuSn or AgSn, or bumps of e.g. Au may, for example, be used.

In a case where the solid light emitting device is electrically connected through the adhesive, an electrically conductive filler such as fine silver particles may be incorporated to the adhesive, or, for example, a silver paste or carbon paste may be applied thinly and uniformly thereon. Further, in the case of a light emitting diode or laser diode of a large current type where the heat dissipation becomes important, solder is effective, In a case where the solid light emitting device is not electrically connected through the adhesive, any adhesive may be used for fixing the light source, but in consideration of the heat dissipation, a silver paste or solder is preferred.

In a case where a plurality of solid light emitting devices are employed, use of a solder is not advisable, since the solid light emitting devices are likely to be repeatedly exposed at high temperature or so exposed for a long time, whereby the useful life of the solid light emitting devices may be deteriorated. On the other hand, when bumps are used, the operation can be carried out at a temperature lower than the solder, and bonding can be carried out simply and certainly. Especially in a case where a flip chip type LED is to be used, a silver paste adhesive may short-circuit the p-type and n-type electrodes, but the bumps are free from such a trouble and thus are preferred.

In the light emitting device of the present invention, in addition to the above-described solid light emitting device, phosphors and frame, other components may be employed. Further, the solid light emitting device is preferably sealed by a sealing material. As such a sealing material, the above-described phosphor-containing composition may serve also as a sealing material, or the above-described liquid medium may be used as a sealing material. Such a sealing material may be used not only for the purpose of dispersing phosphors in a light emitting device, but also for the purpose of bonding the solid light emitting device, the phosphors and the frame.

When the light emitting device of the present invention is switched on, firstly the solid light emitting device will emit light in a blue to deep blue region or in an ultraviolet region. The phosphor will absorb a part of the emission and will emit a green or red color. As the light coming out from the light emitting device, in a case where the solid light emitting device emits a blue color, the blue light of the solid light emitting device will be mixed with the green and red lights having wavelengths changed by the phosphors thereby to present substantially white color. Whereas, in a case where the solid light emitting device emits light in a deep blue region or in an ultraviolet region, lights of blue, green and red colors having wavelengths changed directly or indirectly by the phosphors from the light in the deep blue region or in the ultraviolet region emitted from the solid light emitting device, will be mixed to present substantially white light.

(3-4) Practical Embodiments of Light Emitting Device

Now, the light emitting device of the present invention will be described in detail with reference to specific practical embodiments, but it should be understood that the present invention is by no means limited to the following practical embodiments and may be carried out by optionally modifying them within the scope of the present invention.

Figure 3:
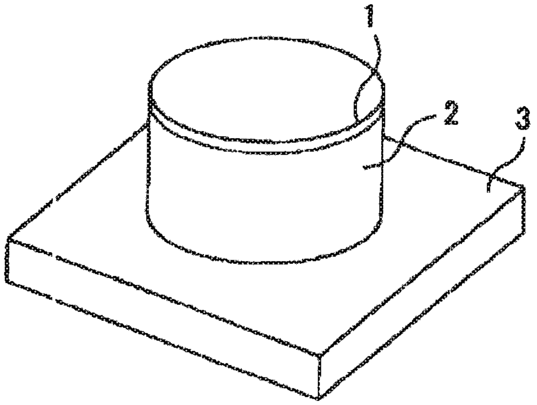
FIG. 3 is a schematic perspective view showing an embodiment of the light emitting device of the present invention.

FIG. 3 is a schematic perspective view showing the positional relation between a solid light emitting device (hereinafter sometimes referred to as a first illuminant) to be an excitation light source and a second illuminant constructed as a phosphor-containing portion having phosphors, in one embodiment of the light emitting device of the present invention. In FIG. 3, (1) represents the phosphor-containing portion (second illuminant), (2) represents a surface-emitting type GaN type LD as an excitation light source (first illuminant), and (3) represents a substrate. In order to make a mutually contacted state, the LD (2) and the phosphor-containing portion (second illuminant) (1) are separately prepared, and their surfaces may be bonded by an adhesive or by other means, or the phosphor-containing portion (second illuminant) may be deposited (molded) on the emission surface of the LD (2). It is thereby possible to bring the LD (2) and the phosphor-containing portion (second illuminant) (1) into contact with each other.

When such a device construction is taken, it is possible to avoid the light quantity loss by leakage of the light from the excitation light source (first illuminant) as reflected on the film surface of the phosphor-containing portion (second illuminant), whereby the emission efficiency of the entire device can be improved.

Figure 4A:
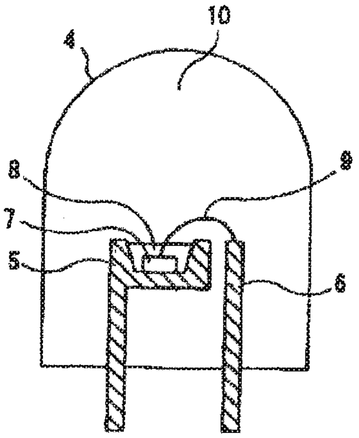
In FIG. 4, FIG. 4(*a*) is a schematic cross sectional view showing an embodiment of a shell type light emitting device of the present invention, and FIG. 4(*b*) is a schematic cross sectional view showing an embodiment of a surface mounting light emitting device of the present invention.
Figure 4B:
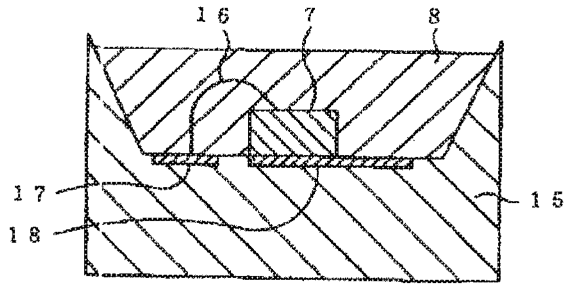

FIG. 4(*a*) is a schematic cross-sectional view showing one embodiment of a light emitting device having an excitation light source (first illuminant) and a phosphor-containing portion (second illuminant), which is a typical example of a light emitting device of a form so-called a shell type. In the light emitting device (4), (5) represents a mount lead, (6) an inner lead, (7) an excitation light source (first illuminant), (8) a phosphor-containing portion, (9) an electroconductive wire, and (10) a mold member.

Further, FIG. 4(*b*) is a schematic cross-sectional view showing one embodiment of a light emitting device having an excitation light source (first illuminant) and a phosphor-containing portion (second illuminant), which is a typical example of a light emitting device of a form so-called surface mount type. In the FIG., (15) represents a frame, (16) an electroconductive wire, and (17) and (18) electrodes.

Here, in a case where the above red-emitting phosphor is a fluoride complex phosphor, it is preferred that the light emitting device has at least one of the following structures (a) to (c) with a view to improving the light emitting device, specifically from such a viewpoint that deterioration with time of the light emitting device at a temperature of 85° C. under a humidity of 85% can be suppressed.

(a) a layer of a material not containing said fluoride complex phosphor is present between the solid light emitting device and the layer containing said fluoride complex phosphor, (b) part or whole of the surface of the light emitting device is covered by a layer of a material not containing said fluoride complex phosphor, and (c) the layer containing said fluoride complex phosphor is covered by a layer of a material not containing said fluoride complex phosphor.

The respective embodiments will be described in detail.

(3-4-1) Embodiment (a)

Figure 22:
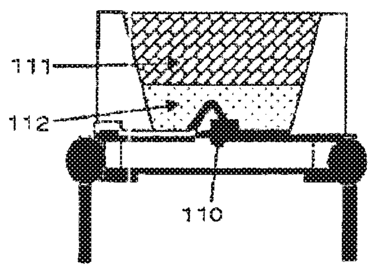
FIG. 22 is a view showing an embodiment of a preferred layer construction in a light emitting device of the present invention.

With respect to a light emitting device having the above structure (a), one embodiment is shown in FIG. 22 to describe it specifically.

In FIG. 22, a material layer C (112) which is a layer of material not containing a fluoride complex phosphor, is present on a semiconductor light emitting device (110), and a material layer B (111) which is a layer containing a fluoride complex phosphor, is deposited thereon.

The material constituting the material layer C is not particularly limited so long as it is a material having optical transparency and high chemical stability against heat, light and chemical reagents, but a resin is preferred from the viewpoint of availability and handling efficiency.

Specifically, the resin to be used for the material layer C may, for example, be a silicone resin, an epoxy resin, a fluorinated saturated or unsaturated aliphatic hydrocarbon resin, a polyolefin resin such as polyethylene, or a polyester such as polycarbonate or polyethylene terephthalate. Among them, a silicone resin is preferred from such a viewpoint that it has good adhesion with the semiconductor light emitting device (110) and the fluoride complex phosphor-containing layer (111).

The silicone resin may be ones disclosed above with respect to the liquid medium. Among them, preferred may be an addition-type silicone resin. Such a resin may specifically be SCR1011 or 1016 manufactured by Shin-Etsu Chemical Co., Ltd.

The weight average molecular weight of the resin constituting the material layer C is usually at least 500, preferably at least 1,000 and usually at most 1,000,000, preferably at most 500,000, as measured by a GPC method.

Further, the thickness of the material layer C may depends also on the size of the light emitting device (cup), but it is usually at least 100 μm, preferably at least 200 μm, more preferably at least 250 μm and usually at most 500 μm, preferably at most 400 μm, more preferably at most 300 μm. If the material layer C is too thin, the effects may not be obtainable. On the other hand, if it is too thick, such is not desirable from the viewpoint of the cost and the labor and time for production of such a light emitting device.

As a production method, the LED chip (λ) is fixed at the bottom of a package, then a composition to constitute the material layer C is injected on (λ) to form a layer, and then a composition to constitute the fluoride complex phosphor-containing layer (material layer B) is injected. For the injection method, it is preferred to use a commonly employed injection device such as a dispenser.

(3-4-2) Embodiment (b)

Figure 23A:
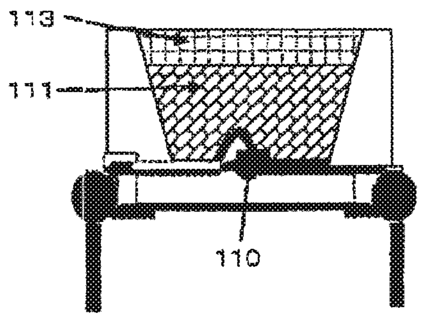
FIG. 23 is views showing embodiments (a), (b) and (c) of preferred layer constructions in a light emitting device of the present invention.
Figure 23B:
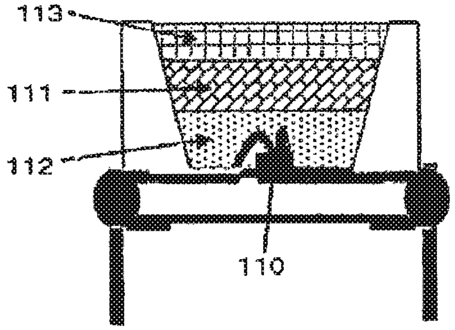
Figure 23C:
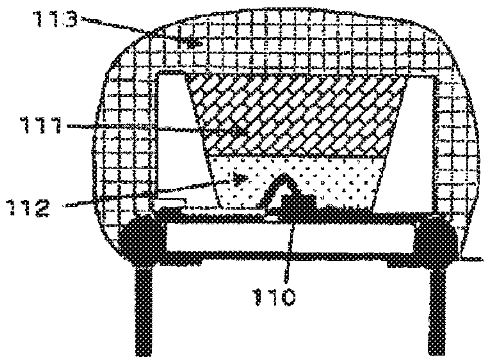

With respect to a light emitting device having the above-mentioned structure (b), some embodiments are shown in FIGS. 23(*a*) to 23(*c*) to describe it specifically.

In FIG. 23(*a*), a material layer B (111) which is a fluoride complex phosphor-containing layer, is formed on a semiconductor light emitting device (110), and then a material layer D (113) which is a layer of material not containing a fluoride complex phosphor, is deposited thereon, thereby to cover the surface of the light emitting device.

Further, in FIG. 23(*b*), the embodiment disclosed in the above (3-4-1) added to the embodiment of FIG. 23(*a*).

Further, FIG. 23(*c*) shows an embodiment wherein the material layer D (113) covers the entire light emitting device.

The material to constitute the above material layer D may, for example, be the same ones as disclosed for the above material layer C, but a material having a gas barrier property is preferred. That is, it is considered likely that hydrogen fluoride is formed in the light emitting device by a reaction of the fluoride complex phosphor with moisture within the light emitting device, and it may adversely affect the performance of the light emitting device.

The material to constitute the material layer D may, for example, be preferably a fluorinated saturated or unsaturated aliphatic hydrocarbon resin, a silicone resin or an epoxy resin, more preferably a fluorinated saturated or unsaturated aliphatic hydrocarbon resin or a silicone resin. Such a fluorinated saturated or unsaturated aliphatic hydrocarbon resin may, for example, be EIGHT SEALS F-3000, manufactured by Flon Industry Co., Ltd., fine heat resistant TFE coat manufactured by Flon Industry Co., Ltd., or ALESFLON CLEAR manufactured by Kansai Paint Co., Ltd. The silicone material may, for example, be SCR1011 or 1016 manufactured by Shin-Etsu Chemical Co., Ltd.

Further, in a case where an epoxy resin is used for the material layer D, it is preferred to have a layer formed by another type of resin, between it and the material layer B, whereby its effects will be more distinct.

The weight average molecular weight of the resin to constitute the above material layer D is usually at least 500, preferably at least 1,000 and usually at most 1,000,000, preferably at most 500,000, as measured by a GPC method.

Further, the thickness of the above material layer D may depend also on the size of the light emitting device, but it is usually at least 50 μm, preferably at least 80 μm, more preferably at least 100 μm, further preferably at least 150 μm and usually at most 500 μm, preferably at most 400 μm, more preferably at most 300 μm. If the material layer D is too thin, the effects may not be obtainable. On the other hand, if it is too thick, such is not desirable from the viewpoint of the cost and the labor and time for production of such a light emitting device.

As a production method, the method may be adopted wherein the LED chip (A) is fixed at the bottom of a package, then a composition to constitute the material layer D is injected on (A) to form a layer, and then a composition to constitute the fluoride complex phosphor-containing layer (material layer B) is injected, or wherein a light emitting device is prepared and then, it is immersed in a curable material to constitute the material layer D, followed by curing.

(3-4-3) Embodiment (c)

Figure 24:
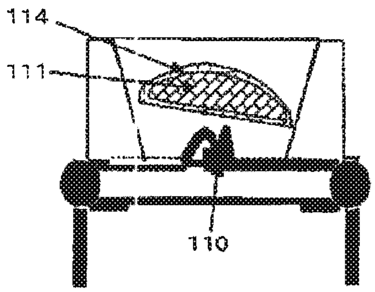
FIG. 24 is a view showing an embodiment of a preferred layer construction in a light emitting device of the present invention.

With respect to a light emitting device having the above-mentioned structure (c), one embodiment is shown in FIG. 24 to describe it specifically.

In FIG. 24, the circumference of a material layer B (111) which is a fluoride complex phosphor-containing layer, is covered by a material layer E (114) which is a layer of a material not containing a fluoride complex phosphor.

The material to constitute the material layer E is particularly preferably one not having groups reactive with the fluoride complex phosphor, and it may, for example, be a fluorinated saturated or unsaturated hydrocarbon resin or a silicone resin.

The weight average molecular weight of the resin to constitute the material layer E as measured by a GPC method may, for example, be the same one as the molecular weight of the resin to constitute the above-mentioned material layers C and D.

Further, the thickness of the above material layer D may depend also on the size of the light emitting device, but it is usually at least 1 μm, preferably at least 2 μm, more preferably at least 5 μm, further preferably at least 10 μm and usually at most 50 μm, preferably at most 30 μm, more preferably at most 20 μm.

As a production method, a method may be mentioned wherein the material layer E is formed around a preliminarily prepared material layer B by an operation such as coating, and such an assembly is inserted in a cup of the light emitting device.

At that time, a portion other than the material layer B covered by the material layer E may be filled with the above-mentioned resin to form the material layer C or D.

By adopting such a construction, the durability will be improved. The reason is not clearly understood, but is considered to be such that by having such a specific layer, deterioration of the fluoride complex phosphor is suppressed and/or it is possible to lower a bypass current around the LED chip.

(3-5) Application of Light Emitting Device

Application of the light emitting device of the present invention is not particularly limited, and it may be used in various fields wherein common light emitting devices are employed. However, for such a reason that the color rendering is high or the color reproduction range is broad, it is particularly useful as a light source for an illuminating device or an image display device.

(3-5-1) Illuminating Device

In a case where the light emitting device of the present invention is to be applied to an illuminating device, the light emitting device as described above may be used as suitably assembled in a known illuminating device. For example, a surface-emitting illuminating device (11) having the above-described light emitting device (4) assembled therein as shown in FIG. 5, may be mentioned.

Figure 5:
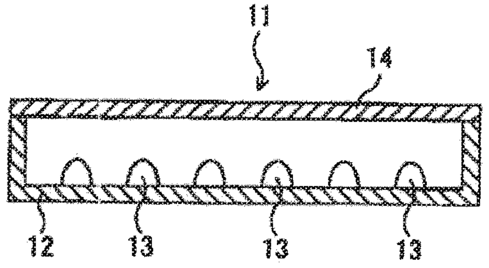
FIG. 5 is a schematic cross sectional view showing an embodiment of an illuminating device of the present invention.

FIG. 5 is a cross-sectional view schematically showing one embodiment of the illuminating device of the present invention. As shown in FIG. 5, as such the surface-emitting illuminating device (11) has many light emitting devices (13) corresponding to the above-described light emitting devices (4) on the bottom surface of a rectangular holding case (12) having its inner surface made to be non-light transmitting such as a white colored flat surface, and a power source, circuit, etc. (not shown) for driving the light emitting device (13) on its outside, and a diffusion plate (14) such as a milky white acryl plate is fixed at a portion corresponding to a cover of the holding case (12) to make the emission uniform.

And, the surface-emitting illuminating device (11) is driven to emit light by applying a voltage to an excitation light source (first illuminant) of the light emitting device (13). A part of the emission is absorbed by the above-mentioned phosphors in the phosphor-containing resin portion as a phosphor-containing portion (second illuminant), and upon the absorption, the phosphors emit visible light. On the other hand, by color mixing with e.g. blue light not absorbed by the phosphors, highly color rendering emission can be obtained. This light passes through the diffusion plate (14) and will be emitted upward in the drawing, whereby it will be possible to obtain illumination light having uniform brightness in the plane of the diffusion plate (14) of the holding case (12).

(3-5-2) Image Display Device

In a case where the light emitting device of the present invention is used as a light source for an image display device, the specific construction of its image display device is not particularly limited, but it is preferred to employ it together with a color filter. For example, in a case where the image display device is made to be a color image display device utilizing a color liquid crystal display element, it is possible to form the image display device by using the above light emitting device as a backlight and combining it with optical shutters using liquid crystal and a color filter having red, green and blue pixels. This embodiment will be described below in further detail.

4. Color Image Display Device

With the light emitting device of the present invention, by combining it with a color filter which is optimum to its emission wavelength, it is possible to realize an image display having high color purity. That is, the above light emitting device is a light source where blue, green and red emissions with high emission peak intensities in narrow band regions and excellent in temperature characteristics, are combined, whereby it is possible to obtain an excellent image display device having the emission peak intensity stabilized and having little color shift given by employing a semiconductor light emitting device as a power device which has a light use efficiency higher than ever even at a high NTSC ratio and which becomes high temperature.

Now, one embodiment of the color image display device of the present invention will be described in detail.

The color image display device of the present invention is one comprising a combination of light shutters, a color filter having color elements of at least three colors of red, green and blue corresponding to the light shutters, and a backlight for transmission illumination. Its specific construction is not particularly limited. However, a color liquid crystal display device of TFT (thin film transistor) type may, for example, be mentioned, which employs light shutters utilizing liquid crystal, as shown in FIG. 6.

Figure 6:
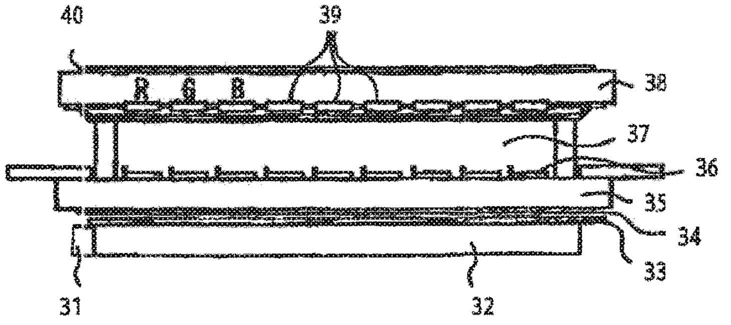
FIG. 6 is a view showing a construction of a color liquid crystal display device of a TFT type.

FIG. 6 shows an example of the color liquid crystal display device of the TFT type using a side-light type backlight device and a color filter, In this liquid crystal display device, light emitted from a light source (31) having the solid light emitting device and the phosphors, is converted to a surface light source by a light guide plate (32), a light diffusion sheet (3) further enhances uniformity of the light, and the light then passes through a prism sheet to enter a polarizer (34). For this incident light, a direction of polarization is controlled in each pixel by TFT (36) and thereafter the light is incident into a color filter (39). Finally, the light entered into the color filter (39), passes through a polarizer (40) with the direction of polarization perpendicular to that of the polarizer (34) and then reaches an observer, TFT (36) and the color filter (39) are, respectively, provided on glass substrates (35) and (38) which are transparent substrates, and liquid crystal (37) is sealed in the space between these glass substrates (35) and (38). The degree of change of the polarization direction of the incident light varies depending upon an applied voltage to TFT (36), so as to change the quantity of light passing through the polarizer (40), thus enabling display of a color image.

Further, the color image display device of the present invention is characterized in that by the construction which will be described below in detail, the relationship between the light use efficiency Y shown below and the color reproduction range (NTSC ratio) W of the color image display device is represented by the following formula (a), preferably (b), more preferably (c), particularly preferably (d).

It is particularly preferred to use as the solid semiconductor light emitting device, a solid light emitting device which emits light in a deep blue region or in an ultraviolet region, whereby the light use efficiency tends to be high.

$Y \geq -0.4W+64$ (a) (where $W \geq 85$)

$Y \geq -0.4W+66$ (b) (where $W \geq 85$)

$Y \geq -0.4W+71$ (c) (where $W \geq 85$)

$Y \geq -0.4W+73$ (d) (where $W \geq 85$)

$$X = \frac{\int_{380}^{780} \overline{x}(\lambda) S(\lambda) T(\lambda)\, d\lambda}{\int_{380}^{780} \overline{y}(\lambda) S(\lambda)\, d\lambda} \quad x = \frac{X}{X+Y+Z}$$

$$Y = \frac{\int_{380}^{780} \overline{y}(\lambda) S(\lambda) T(\lambda)\, d\lambda}{\int_{380}^{780} \overline{y}(\lambda) S(\lambda)\, d\lambda} \quad y = \frac{Y}{X+Y+Z}$$

$$Z = \frac{\int_{380}^{780} \overline{z}(\lambda) S(\lambda) T(\lambda)\, d\lambda}{\int_{380}^{780} \overline{y}(\lambda) S(\lambda)\, d\lambda}$$

wherein the definitions of the respective symbols are as follows:

x(λ), y(λ), z(λ): color matching functions of XYZ color system

S(λ): relative emission spectrum of the backlight

T(λ): transmittance of the color filter

That is, with a conventional color image display device, up to a NTSC ratio of 85%, it was possible to control the light use efficiency to some extent, but with a color image display device designed to have a NTSC ratio exceeding 85%, i.e. a NTSC ratio of at least 85%, particularly at least 87%, especially at least 90%, it was difficult to increase the light use efficiency because of the pigment to be used for a resist of a conventional color filter or the emission spectrum of a phosphor, or the backlight spectrum obtained by a combination of a solid light emitting device and a phosphor.

In the color image display device of the present invention, the relationship between the NTSC ratio W and the light use efficiency Y is set as follows.

(i) With a color image display device with a NTSC ratio exceeding 85% formed by a combination of a specific novel backlight and a color filter, the emission spectra of the respective phosphors used and the emission spectrum of the solid light emitting device (LED chip) are combined to prepare an emission spectrum of a backlight. Based on the emission spectrum of the backlight, a virtual color filter is simulated by calculation so that the NTSC ratio of the color image display device would be at least 85%.

(ii) With the virtual color image display device having the virtual color filter simulated in the above (i), the light use efficiency is calculated at two points where the NTSC ratio would be at least 85%. In the present invention, two points of (NTSC ratio, light use efficiency)=(87.2%, 29.5%) and (91.6%, 27.7%) are calculated as simulated values when using β-SiAlON as a green emitting phosphor and $K_2TiF_6$:Mn as a red emitting phosphor.

(iii) from the above (ii), a linear function passing through the above two points:

$$Y=-0.4W+64$$

is calculated, whereby the above-mentioned formula (a), i.e.

$$Y\geq-0.4W+64 \quad \text{(a) (where } W\geq85\text{)}$$

is obtained.

Further, a more preferred relationship between the NTSC ratio W and the light use efficiency Y in a color image display device is obtainable in such a manner that two points of (NTSC ratio, light use efficiency)=(87.2%, 29.5) and (91.6%, 27.7) are calculated as simulated values when using $Ba_3Si_6O_{12}N_2$:Eu as a green emitting phosphor and $K_2TiF_6$:Mn as a red emitting phosphor, and from a linear function passing through the two points:

$$Y=-0.4W+66$$

the more preferred relation is obtainable as the above formula (b), i.e.

$$Y\geq-0.4W+66 \quad \text{(b) (where } W\geq85\text{)}$$

is obtained.

Further, in the case of using a near ultraviolet emitting LED as the solid light emitting device, $BaMgAl_{10}O_{17}$:Eu as a blue emitting phosphor, $BaMgAl_{10}O_{17}$:Eu,Mn as a green emitting phosphor, and $K_2TiF_5$:Mn as a red emitting phosphor, the above formula (c) is obtainable in the same manner as above.

Still further, in the case of using a near ultraviolet emitting LED as the solid light emitting device, $Sr_5(PO_4)_3Cl$:Eu as a blue emitting phosphor, $BaMgAl_{10}O_{17}$:Eu,Mn as a green emitting phosphor, and $K_2TiF_5$:Mn as a red emitting phosphor, the above formula (d) is obtainable in the same manner as above.

Further, also when $K_2SiF_5$:Mn is used as a red emitting phosphor, the above formula can be obtained in the same manner.

Figure 7:
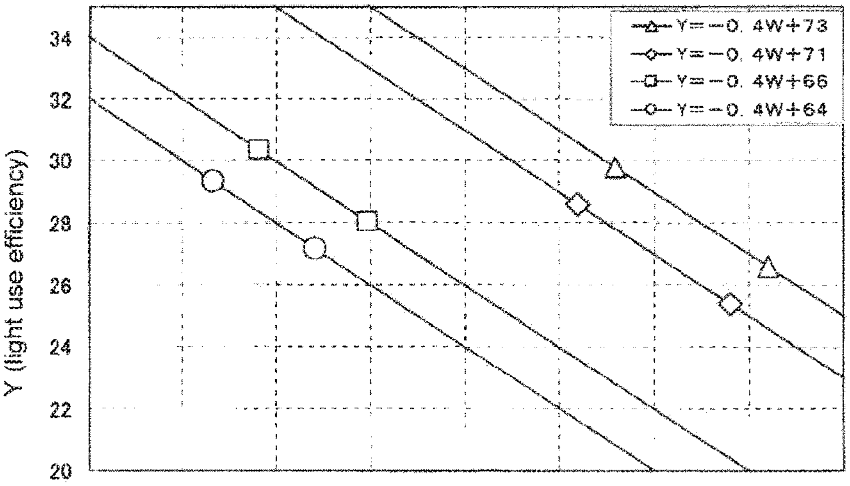
FIG. 7 is a graph showing the relation between the NTSC ratio and the light use efficiency of a color image display device according to the present invention.

A graph showing the relationships between the NTSC ratio and the light use efficiency, representing the formulae (a) to (d), is shown in FIG. 7.

In the present invention, the light use efficiency Y can specifically be calculated by measuring the relative emission spectrum S(λ) of the backlight by a high luminance measuring apparatus and the transmittance spectrum T(λ) of the color filter by a spectrophotometer, and by applying the measured values to the above formulae.

Further, the color image display device of the present invention is characterized in that it has broad color reproducibility.

That is, the color image display device of the present invention comprises light shutters, a color filter having color elements of at least three colors of red, green and blue corresponding to the light shutters, and a backlight for transmission illumination, in combination. The light source for the backlight has a semiconductor light emitting device comprising a solid light emitting device which emits light in a blue or deep blue region or in an ultraviolet region, and phosphors, in combination, and the semiconductor light emitting device has at least one main component of emission in each of the wavelength regions of from 430 to 470 nm, from 500 to 550 nm and from 600 to 680 nm, whereby the color reproduction range of the color image display device is usually at least 60% by NTSC ratio. The NTSC ratio is preferably at least 70%, more preferably at least 80%, further preferably at least 85%, still more preferably at least 87%, particularly preferably at least 90%.

Further, the color image display device of the present invention usually has a color temperature of from 4,000 to 10,000 K, preferably from 4,500 to 9,500 K, more preferably from 5,000 to 9,000 K. If the color temperature is too low, the image tends to be entirely reddish. On the other hand, if the color temperature is too high, the brightness tends to be low.

(4-1) Backlight Device

First, the construction of the backlight device to be used in a color liquid crystal display device will be described.

The backlight device used in the present invention is a surface light source device disposed on a back face of a liquid crystal panel and used as a back light source means for a transmission type or semi-transmission type color liquid crystal display device.

As the specific construction, the backlight device comprises a white-emitting light source and a light uniformizing means for converting this light-source light into a nearly uniform surface light source.

Typical examples of the method for installation of the light source include a method of placing the light source immediately below the back face of the liquid crystal elements (direct backlight system), and a method of placing the light source on a side face and using an optically transparent light guide such as an acrylic plate or the like to convert the light into surface light to obtain a surface light source (side light system). Among them, the side light system as shown in FIGS. 8 and 9 is suitably applicable as a surface light source being thin and excellent in uniformity of luminance distribution, and is now most commonly put to practical use.

Figure 8:
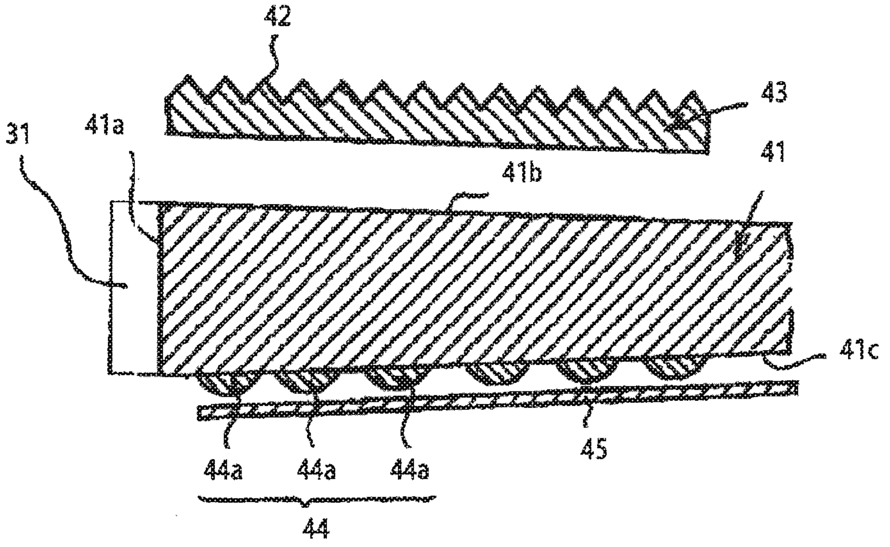
FIG. 8 is a cross sectional view showing an example of a backlight device suitable for the present invention.

The backlight device of FIG. 8 is constructed so that a light source (31) is placed along one side end face (41*a*) of a substrate consisting of an optically transparent flat plate, i.e., a light guide (41), and light is permitted to enter through one side end face (41*a*) as a light entrance face into the interior of the light guide (41). One surface (41*b*) of the light guide (41) serves as a light exit face, and a light control sheet (43) with an array (42) of nearly triangular prism shape formed therein is placed above the light exit face (41*b*) so that apex angles of the array (42) are directed toward the observer. A light extracting mechanism (44) printed in a predetermined pattern of many dots (44a) of light scattering ink is provided on the other face (41c) opposite to the light exit face (41b) in the light guide (41). On this face (41c) side, a reflecting sheet (45) is provided in proximity to this face (41c).

Figure 9:
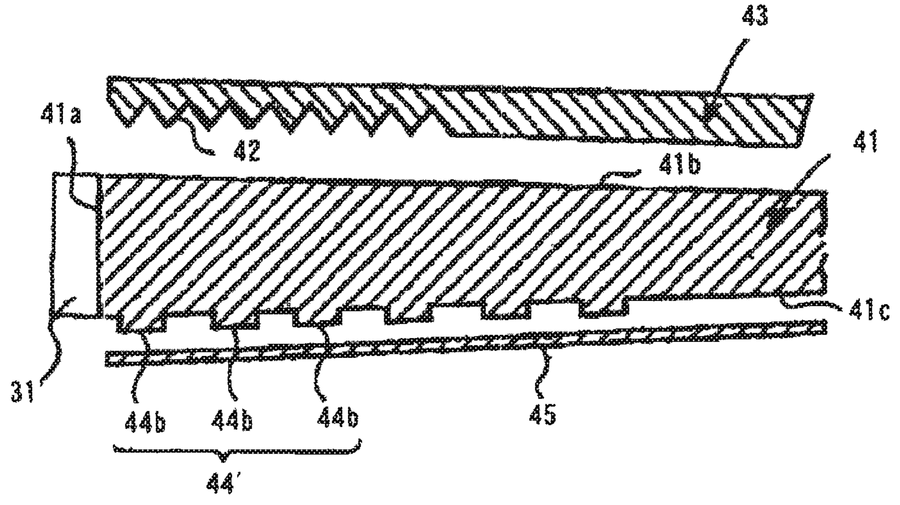
FIG. 9 is a cross sectional view showing another example of a backlight device suitable for the present invention.

The backlight device of FIG. 9 is constructed in much the same construction as the backlight device shown in FIG. 8, except that the light control sheet (43) with the prism array (42) of nearly triangular prism shape formed therein is located so that the apex angles of the array (42) are directed toward the light exit face (41b) of the light guide (41) and except that the light extracting mechanism (44') provided in the face (41c) opposite to the light exit face (41b) of the light guide (41) is comprised of a rough pattern (44b) with each surface being formed as a rough surface.

By adopting the backlight devices of the side light system as described above, it is feasible to bring out the lightweight and low-profile features of the liquid crystal display device more effectively.

As the light source of the backlight device of this invention, the above-described light emitting device may be used, and it may contain LED in its structure. As such a light source, any one may usually be used so long as it is of a type to provide emissions within the red, green and blue wavelength regions i.e. within the ranges of from 580 to 700 nm, from 500 to 550 nm and from 400 to 480 nm.

For the backlight to satisfy such conditions, the light source has a semiconductor light emitting device comprising one or plural solid light emitting devices to emit light in a blue or deep blue region or in an ultraviolet region, and phosphors to be excited by light from such solid light emitting devices, in combination. The semiconductor light emitting device is adjusted so that it has at least one emission main peak in each wavelength region of the red region (region of usually at least 600 nm, preferably at least 610 nm, more preferably at least 620 nm and usually at most 680 nm, preferably at most 670 nm, further preferably at most 650 nm), the green region (region of usually at least 500 nm, preferably at least 510 nm and usually at most 550 nm, preferably at most 542 nm, more preferably at most 540 nm, further preferably at most 535 nm, more preferably at most 530 nm, particularly preferably at most 525 nm, especially preferably at most 520 nm) and the blue region (region of usually at least 430 nm, preferably at least 440 nm and usually at most 470 nm, preferably at most 460 nm).

The light quantity in each region of red, green and blue in a transmissive or semi-transmissive transparent mode, is determined by the product of the emission from the backlight and the spectral transmittance of the color filter. Accordingly, it is necessary to select the backlight to satisfy the conditions which will be described hereinafter in the section (c) Colorant for the composition for a color filter.

(4-2) Color Filter

The color filter to be used for the color image display device of the present invention is not particularly limited, and for example, the following one may be employed.

The color filter is a filter obtained by forming fine pixels of red, green, blue and so on on a transparent substrate of glass or the like by a method of dyeing, printing, electrodeposition, pigment dispersion, or the like. In order to block leaking light between these pixels and obtain images with higher quality, it is often the case to provide a light shielding pattern called a black matrix between pixels.

A color filter by dyeing is fabricated in such a manner that an image is formed by a photosensitive resin obtained by mixing a bichromate as a photosensitive agent into gelatin, polyvinyl alcohol, or the like, followed by dyeing.

A color filter by printing is fabricated by transferring a heat-curing or photo-curing ink onto a transparent substrate of glass or the like by such a method as screen printing, gravure printing, flexographic printing, inversion printing or soft lithography (imprint printing).

A color filter by electrodeposition is formed by electrophoresis effected while a transparent substrate of glass or the like with an electrode thereon is immersed in a bath containing a pigment or a dye.

A color filter by pigment dispersion is formed by applying a composition in which a colorant such as a pigment is dispersed or dissolved in a photosensitive resin, onto a transparent substrate of glass or the like to form a coating film thereon, exposing the coating film to radiation through a photomask to effect exposure, and removing unexposed portions by a development process to form a pattern.

The color filter can also be fabricated by other methods than these, including a method of applying a polyimide type resin composition in which a colorant is dispersed or dissolved, and forming a pixel image by etching, a method of attaching a film coated with a resin composition containing a colorant, to a transparent substrate, peeling it off, and effecting image exposure and development to form a pixel image, a method of forming a pixel image by an ink jet printer, and so on.

In recent years, the pigment dispersion method is mainstream in fabrication of the color filters for liquid crystal display elements by virtue of its high productivity and excellent microfabrication property, but the color filter according to the present invention can be fabricated by any one of the above-mentioned production methods.

Examples of methods of forming the black matrix include a method of forming a chromium and/or chromium oxide (single-layer or multi-layer) film over an entire surface of a transparent substrate of glass or the like by a method such as sputtering, and thereafter removing only color pixel portions by etching, a method of applying a photosensitive composition in which a light shielding component is dispersed or dissolved, onto a transparent substrate of glass or the like to form a coating film, exposing the coating film to radiation through a photomask to effect exposure, and removing unexposed portions by development to form a pattern, and so on.

(4-2-1) Method for Producing Color Filter

Now, a specific example of the method for producing the color filter of the present invention will be described.

The color filter of the present invention can be produced usually by forming red, green and blue pixel images on a transparent substrate provided with a black matrix. At the time of forming the respective color pixels on the transparent substrate, pigments and film thicknesses are optimized basically in order to let the peak wavelengths in the red, blue and green regions in the emission spectrum of the backlight permeate most efficiently. More specifically, the most suitable pigments and film thicknesses are set by calculating the white point, the color index of the spectrum of the backlight and the desired NTSC ratio, by a color matching system.

The material for the transparent substrate is not particularly limited. The material may, for example, be a polyester such as polyethylene terephthalate; a polyolefin such as polyethylene, polypropylene; a thermoplastic sheet of e.g. polycarbonate, polymethyl methacrylate or polystyrene; a thermosetting sheet of e.g. an epoxy resin, an unsaturated polyester resin or a poly(meth)acrylic resin; and various glass plates. Among them, a glass plate or a heat resistant plastic is preferred from the viewpoint of heat resistance.

To the transparent substrate, in order to improve the physical property such as the adhesive property of the surface, corona discharge treatment, ozone treatment or thin film treatment with a silane coupling agent or various polymers such as urethane polymer may be preliminarily applied.

A black matrix is formed on a transparent substrate by using a metal thin film or a pigment dispersion for black matrix.

The black matrix using a metal thin film may, for example, be formed by a single chromium layer or by two layers of chromium and chromium oxide. In such a case, firstly, a thin film of such a metal or metal-metal oxide is formed on the transparent substrate by vapor deposition or sputtering. Then, a photosensitive coating film is formed thereon, and then, by using a photomask having a repeated pattern of a stripe, mosaic, triangle, etc., the photosensitive coating film is exposed and developed to form a resist image. Then, the thin film is subjected to etching treatment to form a black matrix.

In a case where a pigment dispersion for black matrix is to be used, a composition for a color filter containing a black colorant is used as a colorant to form a black matrix. For example, black colorants such as carbon black, graphite, iron black, aniline black, cyanine black and titanium black may be used alone or in combination as a mixture of a plurality of them, or a composition for a color filter containing a black colorant by mixing red, green, blue, etc. suitably selected from inorganic or organic pigments or dyes, is used to form a black matrix in the same manner as the following method for forming red, green and blue pixel images.

On the transparent substrate provided with the black matrix, the above mentioned composition for a color filter containing one colorant among red, green and blue, is applied and dried, and then, a photomask is placed on this coating film, and the image exposure via the photomask, development and if necessary, heat-curing or photo-curing are carried out to form pixel images to form a colored layer. This operation is carried out for each of color filter compositions for three colors of red, green and blue to form a color filter image.

Application of the color filter composition can be carried out by a coating device such as a spinner, a wire bar, a flow coater, a die coater, a roll coater or a spray.

The drying after the coating, may be carried out by using a hot plate, an IR oven, or a convection oven. With respect to the drying temperature, the adhesive property to the transparent substrate will be improved as the temperature becomes high. However, if it is too high, the after-mentioned photo polymerization initiator system tends to be decomposed, thus inducing heat polymerization to cause development failure. Therefore, the drying temperature is usually within a range of from 50 to 200° C., preferably from 50 to 150° C. Further, the drying time is usually from 10 seconds to 10 minutes, preferably from 30 seconds to 5 minutes. Further, prior to such drying by a heat, it is also possible to apply a drying method under reduced pressure.

The thickness of the coating film after the drying, i.e. the thickness of each pixel, is within a range of usually from 0.5 to 3.5 μm, preferably from 1.0 to 3.0 μm. If the film thickness is too thick, non-uniformity in the film thickness tends to be large, and if it is too thin, the pigment concentration tends to be high, and it tends to be difficult to form images.

In the present invention, the light use efficiency of the backlight is excellent, whereby the color filter may be made thin. By making the color filter thin, it is possible to shorten the time and simplify the production steps, thus leading to improvement of the productivity and reduction of the price, and it is also possible to save the power consumption of the backlight when operated as a display panel. Further, it is possible to realize a thin image display device, and it is particularly suitable for a cellphone whereby a thin-form is required for the device itself.

Further, the composition for the color filter to be used comprises a binder resin and an ethylenic compound, and when the binder resin is an acrylic resin having ethylenic double bonds and carboxyl groups in side chains, a very high sensitivity and a high resolution are obtainable, whereby an image may be formed by exposure and development without providing an oxygen-shielding layer of e.g. polyvinyl alcohol, such being desirable.

The exposure light source useful for the image exposure is not particularly limited. For example, a lamp light source such as a xenon lamp, a halogen lamp, a tungsten lamp, a high pressure mercury lamp, a super high pressure mercury lamp, a metal halide lamp, a medium pressure mercury lamp, a low pressure mercury lamp, a carbon arc or a fluorescent lamp; or a laser light source such as an argon ion laser, a YAG laser, an excimer laser, a nitrogen laser, a helium cadmium laser or a semiconductor laser, may be used. An optical filter may be used in a case where only a certain wavelength is to be used.

After the image exposure by means of such a light source, development is carried out by means of an organic solvent, or an aqueous solution containing a surfactant and an alkali agent, to form an image on the substrate. Such an aqueous solution may further contain an organic solvent, a buffering agent, a dye, a pigment, etc.

The treating method for the development is not particularly limited, but usually, a method of immersion development, spray development, brush development or ultrasonic wave development may be used at a development temperature of usually from 10 to 50° C., preferably from 15 to 45° C.

The alkali agent to be used for the development may, for example, be an inorganic alkali agent such as sodium silicate, potassium silicate, sodium hydroxide, potassium hydroxide, lithium hydroxide, sodium triphosphate, sodium diphosphate, sodium carbonate, potassium carbonate, or sodium bicarbonate, or an organic amine such as trimethylamine, diethylamine, isopropylamine, n butylamine, monoethanolamine, diethanolamine, triethanolamine or tetraalkylammonium hydroxide. They may be used alone or in combination as a mixture of two or more of them.

As the surfactant, a nonionic surfactant such as a polyoxyethylene alkyl ether, a polyoxyethylene alkyl aryl ether, a polyoxyethylene alkyl ester, a sorbitan alkyl ester, a monoglyceride alkyl ester; an anionic surfactant such as an alkylbenzene sulfonate, an alkylnaphthalene sulfonate, an alkyl sulfate, an alkyl sulfonate or a sulfosuccinate; or an amphoteric surfactant such as an alkylbetaine or an amino acid, may be used.

The organic solvent may be used alone or in combination with an aqueous solution, and in either case, isopropyl alcohol, benzyl alcohol, ethyl cellosolve, butyl cellosolve, phenyl cellosolve, propylene glycol or diacetone alcohol may, for example, be used.

(4-3) Composition for Color Filter

The composition (resist) for a color filter to be used for the color image display device of the present invention is not particularly limited, and the following one may, for example, be used.

Raw materials for production of the color filter will be described below, using an example of the pigment dispersion method which is commonly used.

The pigment dispersion method uses a composition in which a colorant such as a pigment is dispersed in a photosensitive resin as described above (hereinafter called a "composition for a color filter"). This composition for a color filter is generally a color composition for a color filter in which (a) a binder resin and/or (b) a monomer, (c) a colorant and (d) other components are dissolved or dispersed as the constituting components in a solvent.

Each of the components will be described below in detail. In the description below, "(meth)acryl", "(meth)acrylate" and "(meth)acrylol" mean "acryl or methacryl", "acrylate or methacrylate" and "acrylol or methacrylol", respectively.

(a) Binder Resin

Where a binder resin is used singly, an appropriate one is properly selected in consideration of the desired image forming property and performance, a production method desired to adopt, and so on. Where a binder resin is used in combination with a monomer described later, the binder resin is added in order to modify the composition for a color filter and improve the physical properties after photo-curing. In this case, therefore, a binder resin is properly selected depending upon the purpose for improvement such as compatibility, a film forming property, a development property, an adhesion property, or the like.

The binder resins usually used are, for example, homopolymers or copolymers of (meth)acrylic acid, (meth)acrylate esters, (meth)acrylamide, maleic acid, (meth)acrylonitrile, styrene, vinyl acetate, vinylidene chloride, maleimide, and so on, polyethylene oxides, polyvinyl pyrrolidones, polyamides, polyurethanes, polyesters, polyethers, polyethylene terephthalates, acetylcelluloses, novolak resins, resol resins, polyvinyl phenols, polyvinyl butyrals, and so on.

Among these binder resins, preferred binder resins are those having a carboxyl group or a phenolic hydroxyl group in a side chain or in the main chain thereof. Development in an alkali solution becomes possible with use of the resins having these functional groups. Among them, preferred binder resins are resins having a carboxyl group, which have a high alkali development property; for example, homo- or co-polymers of acrylic acid, resins of styrene/maleic anhydride, resins of novolak epoxy acrylate modified with an acid anhydride, and so on.

Particularly preferred binder resins are homo- or copolymers containing (meth)acrylic acid or a (meth)acrylate ester having a carboxyl group (these will be referred to as "acrylic resins" in the present invention). Namely, these acrylic resins are preferred in terms of easy controllability of performance and a production method because they are excellent in the development property and transparency and can provide various copolymers from a wide range of monomers.

Specific examples of the acrylic resins include resins that comprise, as an essential component, (meth)acrylic acid and/or a compound obtained by adding an acid (anhydride), such as (anhydrous) succinic acid, (anhydrous) phthalic acid, (anhydrous) maleic acid, or the like, to a hydroxyalkyl (meth)acrylate, such as succinic acid (2-(meth)acryloyloxyethyl) ester, adipic acid (2-acryloyloxyethyl) ester, phthalic acid (2-(meth)acryloyloxyethyl) ester, hexahydrophthalic acid (2-(meth)acryloyloxyethyl) ester, maleic acid (2-(meth)acryloyloxyethyl) ester, succinic acid (2-(meth)acryloyloxypropyl) ester, adipic acid (2-(meth)acryloyloxypropyl) ester, hexahydrophthalic acid (2-(meth)acryloyloxypropyl) ester, phthalic acid (2-(meth)acryloyloxypropyl) ester, maleic acid (2-(meth)acryloyloxypropyl) ester, succinic acid (2-(meth)acryloyloxybutyl) ester, adipic acid (2-(meth)acryloyloxybutyl) ester, hexahydrophthalic acid (2-(meth)acryloyloxybutyl) ester, phthalic acid (2-(meth)acryloyloxybutyl) ester, maleic acid (2-(meth)acryloyloxybutyl) ester, or the like; and that are copolymerized, if necessary, with one of various monomers, e.g., styrene type monomers such as styrene, α-methylstyrene, vinyltoluene, and so on; unsaturated group-containing carboxylic acids such as cinnamic acid, maleic acid, fumaric acid, maleic anhydride, itaconic acid, and so on; (meth)acrylate esters such as methyl (meth)acrylate, ethyl (meth)acrylate, propyl (meth)acrylate, allyl (meth)acrylate, butyl (meth)acrylate, 2-ethylhexyl (meth)acrylate, hydroxyethyl (meth)acrylate, hydroxypropyl (meth)acrylate, benzyl (meth)acrylate, hydroxyphenyl (meth)acrylate, methoxyphenyl (meth)acrylate, and so on; compounds obtained by adding to (meth)acrylic acid, one of lactones such as ε-caprolactone, β-propiolactone, γ-butyrolactone, δ-valerolactone, and so on; acrylonitrile; acrylamides such as (meth)acrylamide, N-methylolacrylamide, N,N-dimethylacrylamide, N-methacryloyl morpholine, N,N-dimethylaminoethyl (meth)acrylate, N,N-dimethylaminoethylacrylamide, and so on; vinyl acids such as vinyl acetate, vinyl versatate, vinyl propionate, vinyl cinnamate, vinyl pivalate, and so on.

For a purpose of increasing the strength of the coating film, acrylic resins preferably used are those obtained by copolymerization of from 10 to 98 mol %, preferably from 20 to 80 mol %, more preferably from 30 to 70 mol %, of one of monomers having a phenyl group, such as styrene, α-methylstyrene, benzyl (meth)acrylate, hydroxyphenyl (meth)acrylate, methoxyphenyl (meth)acrylate, hydroxyphenyl (meth)acrylamide, hydroxyphenyl (meth)acrylsulfoamide, and so on, and from 2 to 90 mol %, preferably from 20 to 80 mol %, more preferably from 30 to 70 mol %, of at least one monomer selected from the group consisting of (meth)acrylic acid, or (meth)acrylates having a carboxyl group, such as succinic acid (2-(meth)acryloyloxyethyl) ester, adipic acid (2-acryloyloxyethyl) ester, phthalic acid (2-(meth)acryloyloxyethyl) ester, hexahydrophthalic acid (2-(meth)acryloyloxyethyl) ester, maleic acid (2-(meth)acryloyloxyethyl) ester, and so on.

In addition, these binder resins preferably have an ethylenic double bond in a side chain. By using a binder resin having a double bond in a side chain, the photo-curing property of the composition for a color filter obtained is enhanced, whereby it is feasible to further improve the resolving property and adhesion property.

Means for introducing an ethylenic double bond into a binder resin include, for example, methods disclosed in JP-B-50-34443, JP-B-50-34444, and so on; i.e., a method of reacting a compound having both a glycidyl group/an epoxy cyclohexyl group, and a (meth)acryloyl group with a carboxylic group of a resin, and a method of reacting an acrylic acid chloride or the like with a hydroxyl group of a resin.

For example, a binder resin having an ethylenic double bond in a side chain is obtained by reacting a compound, such as glycidyl (meth)acrylate, allyl glycidyl ether, glycidyl α-ethylacrylate, crotonyl glycidyl ether, (iso)crotonic acid glycidyl ether, (3,4-epoxycyclohexyl)methyl (meth)acrylate, (meth)acrylic acid chloride, or (meth)acryl chloride, with a resin having a carboxyl group or a hydroxyl group.

Particularly preferred binder resins are those resulting from a reaction with an alicyclic epoxy compound such as (3,4-epoxy cyclohexyl)methyl (meth)acrylate.

When an ethylenic double bond is preliminarily introduced into a resin having a carboxylic group or hydroxyl group as described above, it is preferable to bond a compound having an ethylenic double bond to from 2 to 50 mol %, preferably from 5 to 40 mol %, of the carboxyl group or hydroxyl group in the binder resin.

These acrylic resins preferably have a weight-average molecular weight, as measured by GPO (gel permeation chromatography), in a range of from 1,000 to 100,000. If the weight-average molecular weight is less than 1,000, it tends to be difficult to obtain a uniform film. On the other hand, if it exceeds 100,000, the development property tends to degrade. A preferred content of the carboxylic group is in a range of from 5 to 200 as an acid value (mgKOH/g). If the acid value is less than 5, the resin tends to be insoluble in an alkali developer. On the other hand, if it exceeds 200, the sensitivity may become lower.

As the binder resin, particularly preferred specific examples will be described below.

(a-1): "Alkali-soluble resin obtainable by adding an unsaturated monobasic acid to at least some of epoxy groups in a copolymer of an epoxy group-containing (meth)acrylate with another radical polymerizable monomer, and further adding a polybasic acid anhydride to at least some of hydroxyl groups formed by the above addition reaction"

As such a resin, a resin disclosed in JP-A-2005-154708, paragraphs 0090 to 0110, may, for example, be mentioned.

(a-2): "Carboxyl Group-Containing Linear Alkali-Soluble Resin"

As the carboxyl group-containing linear alkali-soluble resin is not particularly limited so long as it has carboxyl groups, and such a resin is usually obtained by polymerizing a polymerizable monomer having a carboxyl group. As such a resin, a resin disclosed in JP-A-2005-232432, paragraphs 0055 to 0066, may, for example, be mentioned.

(a-3): "a Resin Having an Epoxy Group-Containing Unsaturated Compound Added to Carboxyl Group Moieties of the Above Mentioned (a-2) Resin"

A resin having an epoxy group-containing unsaturated compound added to carboxyl group moieties of the above carboxyl group-containing resin (a-2), is particularly preferred.

The epoxy group-containing unsaturated compound is not particularly limited so long as it is one having an ethylenic unsaturated group and an epoxy group in its molecule.

For example, a non-cyclic epoxy group-containing unsaturated compound such as glycidyl (meth)acrylate, allyl glycidyl ether, glycidyl-α-ethylacrylate, crotonyl glycidyl ether, (iso)crotonic acid glycidyl ether, N-(3,5-dimethyl-4-glycidyl)benzylacrylamide or 4-hydroxybutyl (meth)acrylate glycidyl ether, may also be mentioned. However, from the viewpoint of the heat resistance and the after-mentioned dispersibility of pigment, an alicyclic epoxy group-containing unsaturated compound is preferred.

Here, as the alicyclic epoxy group-containing unsaturated compound, its alicyclic epoxy group may, for example, be a 2,3-epoxycyclopentyl group, a 3,4-epoxycyclohexyl group or a 7,8-epoxy{tricyclo[5.2.1.0]decy-2-yl} group.

Further, as the ethylenic unsaturated group, one derived from a (meth)acryloyl group is preferred. Particularly preferred is 3,4-epoxycyclohexyl methyl (meth)acrylate.

As such a resin, a resin disclosed in JP-A-2005-232432, paragraphs 0055 to 0066, may, for example, be mentioned.

(a-4): "Acrylic Resin"

As a preferred acrylic resin, a resin disclosed in JP-A-2006-161035, paragraphs 0067 to 0086, may for example, be mentioned.

Such a binder resin is contained within a range of usually from 10 to 80 wt %, preferably from 20 to 70 wt %, in the total solid content of the composition for a color filter.

(b) Monomer

There is no particular restriction on the monomer as long as it is a polymerizable low molecular weight compound. A preferred monomer is an addition-polymerizable compound having at least one ethylenic double bond (hereinafter, abbreviated as an "ethylenic compound"). The ethylenic compound is a compound having an ethylenic, double bond which is addition-polymerized by the action of a photopolymerization initiator system as described hereinafter, to cure when the composition for a color filter is exposed to active lights. Here the monomer in the present invention implies a concept obverse to a so-called polymer substance and implies a concept embracing not only monomers in a narrow sense but also dimers, trimers, and oligomers.

The ethylenic compound may be, for example, an unsaturated carboxylic acid, an ester of an unsaturated carboxylic acid with a monohydroxy compound, an ester of an aliphatic polyhydroxy compound with an unsaturated carboxylic acid, an ester of an aromatic polyhydroxy compound with an unsaturated carboxylic acid, an ester obtained by an esterification reaction of an unsaturated carboxylic acid and a polybasic carboxylic acid with a polyhydric hydroxy compound such as the aforementioned aliphatic polyhydroxy compound or aromatic polyhydroxy compound, an ethylenic compound with a urethane skeleton obtained by reacting a polyisocyanate compound with a (meth)acryloyl-containing hydroxy compound, or the like.

The unsaturated carboxylic acid may be, for example, (meth)acrylic acid, (anhydrous) maleic acid, crotonic acid, itaconic acid, fumaric acid, 2-(meth)acryloyloxyethyl succinic acid, 2-acryloyloxyethyl adipic acid, 2-(meth)acryloyloxyethyl phthalic acid, 2-(meth)acryloyloxyethyl hexahydrophthalic acid, 2-(meth)acryloyloxyethyl maleic acid, 2-(meth)acryloyloxypropyl succinic acid, 2-(meth)acryloyloxypropyl adipic acid, 2-(meth)acryloyloxypropyl hydrophthalic acid, 2-(meth)acryloyloxypropyl phthalic acid, 2-(meth)acryloyloxypropyl maleic acid, 2-(meth)acryloyloxybutyl succinic acid, 2-(meth)acryloyloxybutyl adipic acid, 2-(meth)acryloyloxybutyl hydrophthalic acid, 2-(meth)acryloyloxybutyl phthalic acid, 2-(meth) acryloyloxybutyl maleic acid, a monomer obtained by adding to (meth)acrylic acid one of lactones such as ε-caprolactone, β-propiolactone, γ-butyrolactone, δ-valerolactone, and so on, a monomer obtained by adding to a hydroxyalkyl (meth)acrylate, an acid (anhydride) such as (anhydrous) succinic acid, (anhydrous) phthalic acid or (anhydrous) maleic acid, or the like. Among them, (meth)acrylic acid and 2-(meth)acryloyloxyethyl succinic acid are preferred, and (meth)acrylic acid is more preferred. These may be used in combination of two or more.

The ester of an aliphatic polyhydroxy compound with an unsaturated carboxylic acid may be an acrylate such as ethylene glycol diacrylate, triethylene glycol diacrylate, trimethylolpropane triacrylate, trimethylolethane triacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, glycerol acrylate, or the like. Further, the ester may be a methacrylate, an itaconate, a crotonate or a maleate obtained by replacing the acrylic acid moiety of the aforementioned acrylates with a methacrylic acid moiety, an itaconic acid moiety, a crotonic acid moiety or a maleic acid moiety, respectively.

The ester of an aromatic polyhydroxy compound with an unsaturated carboxylic acid may be hydroquinone diacrylate, hydroquinone dimethacrylate, resorcin diacrylate, resorcin dimethacrylate, pyrogallol triacrylate, or the like.

The ester obtained by an esterification reaction of an unsaturated carboxylic acid and a polybasic carboxylic acid with a polyhydric hydroxy compound is not necessarily a single substance, but it may be a mixture. Typical examples of the ester include a condensation product of acrylic acid, phthalic acid and ethylene glycol, a condensation product of acrylic acid, maleic acid and diethylene glycol, a condensation product of methacrylic acid, terephthalic acid and pentaerythritol, a condensation product of acrylic acid, adipic acid, butanediol and glycerol, and so on.

The ethylenic compound with a urethane skeleton obtained by reacting a polyisocyanate compound and a (meth)acryloyl group-containing hydroxy compound may be a reaction product of an aliphatic diisocyanate such as hexamethylene diisocyanate, trimethylhexamethylene diisocyanate, or the like; an alicyclic diisocyanate such as cyclohexane diisocyanate, isophorone diisocyanate, or the like; an aromatic diisocyanate such as tolylene diisocyanate, diphenylmethane diisocyanate, or the like, with a (meth)acryloyl group-containing hydroxy compound such as 2-hydroxyethyl acrylate, 2-hydroxyethyl methacrylate, 3-hydroxy(1,1,1-triacryloyloxymethyl) propane, 3-hydroxy(1,1,1-trimethacryloyloxymethyl) propane, or the like.

Other examples of the ethylenic compound used in the present invention include acryl amides such as ethylenebisacrylamide; allyl esters such as diallyl phthalate; vinyl group-containing compounds such as divinyl phthalate.

The compounding rate of the ethylenic compounds is usually in a range of from 10 to 80% by weight, preferably in a range of from 20 to 70% by weight, relative to the total solid content of the composition for a color filter.

(c) Colorant

In order to utilize the light from the backlight as effectively as possible, it is necessary to select a colorant so that, in accordance with the red, green and blue emission wavelengths of the backlight, the transmittance at the emission wavelengths of the phosphor in each color pixel becomes as high as possible, while the transmittance becomes as low as possible at the other emission wavelengths.

The present invention is characterized particularly by a high color reproducibility not available by conventional LED backlight, and accordingly, a due care is required for the selection of the colorants, Namely, in order to sufficiently utilize the characteristics of a backlight having deep red and green emission wavelengths characteristic to the present invention, it is required to satisfy the following conditions.

(4-3-1) Red Composition

Firstly, a red composition (red resist) constituting red pixels will be described.

The pigments to be used for the red composition in the present invention, may be organic pigments, such as azo type, quinacridone type, benzimidazolone type, isoindoline type, perylene type and diketopyrrolopyrol type pigments, and, in addition thereto, various inorganic pigments, Specifically, pigments having the following pigment numbers may, for example, be used. Here, the term “C. I.” below means a color index (C. I.).

Red colorant: C. I. pigment red 1, 2, 3, 4, 5, 6, 7, 8, 9, 12, 14, 15, 16, 17, 21, 22, 23, 31, 32, 37, 38, 41, 47, 48, 48:1, 48:2, 48:3, 48:4, 49, 49:1, 49:2, 50:1, 52:1, 52:2, 53, 53:1, 53:2, 53:3, 57, 57:1, 57:2, 58:4, 60, 63, 63:1, 63:2, 64, 64:1, 68, 69, 81, 81:1, 81:2, 81:3, 81:4, 83, 88, 90:1, 101, 101:1, 104, 108, 108:1, 109, 112, 113, 114, 122, 123, 144, 146, 147, 149, 151, 166, 168, 169, 170, 172, 173, 174, 175, 176, 177, 178, 179, 181, 184, 185, 187, 188, 190, 193, 194, 200, 202, 206, 207, 208, 209, 210, 214, 216, 220, 221, 224, 230, 231, 232, 233, 235, 236, 237, 238, 239, 242, 243, 245, 247, 249, 250, 251, 253, 254, 255, 256, 257, 258, 259, 260, 262, 263, 264, 265, 266, 267, 268, 269, 270, 271, 272, 273, 274, 275, 276.

Further, for fine adjustment of the color, the following yellow colorant may be mixed to the above red colorant.

Yellow colorant: C. I. pigment yellow 1, 1:1, 2, 3, 4, 5, 6, 9, 10, 12, 13, 14, 16, 17, 24, 31, 32, 34, 35, 35:1, 36, 36:1, 37, 37:1, 40, 41, 42, 43, 48, 53, 55, 61, 62, 62:1, 63, 65, 73, 74, 75, 81, 83, 87, 93, 94, 95, 97, 100, 101, 104, 105, 108, 109, 110, 111, 116, 119, 120, 126, 127, 127:1, 128, 129, 133, 134, 136, 138, 139, 142, 147, 148, 151, 153, 154, 155, 157, 158, 159, 160, 161, 162, 163, 164, 165, 166, 167, 168, 169, 170, 172, 173, 174, 175, 176, 180, 181, 182, 183, 184, 185, 188, 189, 190, 191, 191:1, 192, 193, 194, 195, 196, 197, 198, 199, 200, 202, 203, 204, 205, 206, 207, 208, etc.

(4-3-2) Green Composition

Now, a green composition (green resist) constituting green pixels will be described.

The pigments to be used for the green composition of the present invention may be organic pigments, such as azo type and phthalocyanine type pigments, and, in addition thereto, various inorganic pigments.

Specifically, pigments having the following pigment numbers may, for example, be used.

Green colorant: C. I, pigment green 1, 2, 4, 7, 8, 10, 13, 14, 15, 17, 18, 19, 26, 36, 45, 48, 50, 51, 54, 55, and a zinc phthalocyanine bromide pigment.

Further, for fine adjustment of the color, the above mentioned yellow colorant may be mixed to the above green colorant.

As green pixels, a specific example to satisfy the above conditions preferably comprises pigment green 36, pigment green 7 and/or a zinc phthalocyanine bromide pigment as a green pigment, and at least one of an azo nickel complex yellow pigment, pigment yellow 138 and pigment yellow 139, as a yellow pigment for color adjustment. Further, pigment green 58 is preferred as the zinc phthalocyanine bromide pigment.

Further, in the present invention, in a case where a color image display device having a NTSC ratio of at least 85%, particularly at least 90%, is to be prepared, it is preferred to employ pigment green 7 or zinc phthalocyanine bromide pigment instead of pigment green 36 from the viewpoint of the transmittance. The zinc phthalocyanine bromide is preferably a zinc phthalocyanine bromide containing at least 13 bromine atoms per molecule on average, since it shows high transmittance and thus is suitable for forming a green pixel for a color filter. More preferred is a zinc phthalocyanine bromide having from 13 to 16 bromine atoms per molecule and containing no chlorine or having at most 3 chlorine atoms per molecule on average, and particularly preferred is a zinc phthalocyanine bromide having from 14 to 16 bromine atoms per molecule on average and containing no chlorine or having at most 2 chlorine atoms per molecule on average. Table 9 shows preferred blend examples (wt %) of colorants constituting green pixels.

TABLE 9

| | Pigment green 36 | Pigment green 7 | zinc phthalo-cyanine bromide | Azo nickel complex yellow pigment* | Clear resist |
|---|---|---|---|---|---|
| Blend Example 1 | 14.3 | | | 22.6 | 63.1 |
| Blend Example 2 | | 9.8 | | 22.1 | 68.1 |
| Blend Example 3 | | | 18.0 | 17.0 | 65.1 |

*Disclosed in JP-A-2007-25687

(4-3-3) Blue Composition

Now, a blue composition (blue resist) constituting blue pixels will be described.

As pigments to be used for the blue composition of the present invention, pigments having the following pigment numbers may, for example, be used.

Blue colorant: C. I. pigment blue 1, 1:2, 9, 14, 15, 15:1, 15:2, 15:3, 15:4, 15:6, 16, 17, 19, 25, 27, 28, 29, 33, 35, 36, 56, 56:1, 60, 61, 61:1, 62, 63, 66, 67, 68, 71, 72, 73, 74, 75, 76, 78, 79

Violet colorant: C. I. pigment violet 1, 1:1, 2, 2:2, 3, 3:1, 3:3, 5, 51, 14, 15, 16, 19, 23, 25, 27, 29, 31, 32, 37, 39, 42, 44, 47, 49, 50

(4-3-4) Adjustment of Color Composition

Further, irrespective of red, green or blue, the following pigments may further be used, as the case requires, for fine adjustment of the color.

Orange colorant: C. I. pigment orange 1, 2, 5, 13, 16, 17, 19, 20, 21, 22, 23, 24, 34, 36, 38, 39, 43, 46, 48, 49, 61, 62, 64, 65, 67, 68, 69, 70, 71, 72, 73, 74, 75, 77, 78, 79

Brown colorant: C. I. pigment brown 1, 6, 11, 22, 23, 24, 25, 27, 29, 30, 31, 33, 34, 35, 37, 39, 40, 41, 42, 43, 44, 45

It is, of course, possible to use other colorants such as dyes.

The dyes may, for example, be an azo type dye, an anthraquinone type dye, a phthalocyanine type dye, a quinonimine type dye, a quinoline type dye, a nitro type dye, a carbonyl type dye and a methine dye.

The azo type dye may, for example, be C. I. acid yellow 11, C. I. acid orange 7, C. I. acid red 37, C. I. acid red 180, C. I. acid blue 29, C. I. direct red 28, C. I. direct red 83, C. I. direct yellow 12, C. I. direct orange 26, C. I. direct green 28, C. I. direct green 59, C. I. reactive yellow 2, C. I. reactive red 17, C. I. reactive red 120, C. I. reactive black 5, C. I. disperse orange 5, C. I. disperse red 58, C. I, disperse blue 165, C. I. basic blue 41, C. I. basic red 18, C. I. mordant red 7, C. I. mordant yellow 5 or C. I. mordant black 7.

The anthraquinone type dye may, for example, be C. I. vat blue 4, C. I. acid blue 40, C. I. acid green 25, C. I. reactive blue 19, C. I. reactive blue 49, C. I. disperse red 60, C. I. disperse blue 56 or C. I. disperse blue 60.

With respect to others, the phthalocyanine type dye may, for example be C. I. pad blue 5; the quinonimine type dye may, for example, be C. I. basic blue 3 or C. I. basic blue 9; the quinoline type dye may, for example, be C. I. solvent yellow 33, C. I. acid yellow 3 or C. I. disperse yellow 64; and the nitro type dye may, for example, be C. I. acid yellow 1, C. I. acid orange 3 or C. I. disperse yellow 42.

Further, as colorants which may be used for the composition for a color filter, inorganic colorants such as barium sulfate, lead sulfate, titanium oxide, yellow lead, iron red, chromium oxide and carbon black, may, for example, be used.

Further, such colorants are preferably used after disperse treatment to have an average particle diameter of at most 1.0 μm, preferably at most 0.5 μm, more preferably at most 0.3 μm.

These colorants are incorporated in a range of usually from 5 to 60 wt %, preferably from 10 to 50 wt %, in the total solid content of the composition for a color filter.

(d) Other Components

To the composition for a color filter, a photopolymerization initiator, a thermal polymerization inhibitor, a plasticizer, a storage stabilizer, a surface protecting agent, a smoothing agent, a coating-assisting agent and other additives may further be added, as the case requires.

(d-1) Photopolymerization Initiation System

In a case in which the composition for a color filter comprises an ethylenic compound as (b) a monomer, it is necessary to use a photopolymerization initiation system having a function of directly absorbing light or being sensitized with light to induce a decomposition or hydrogen abstraction reaction to generate polymerization-active radicals.

The photopolymerization initiation system is comprised of a system containing a polymerization initiator and an additive such as an accelerator. The polymerization initiator may be, for example, a radical activator, such as metallocene compounds including titanocene compounds as described in each of JP-A-59-152396 and JP-A-61-151197, hexaaryl biimidazole derivatives such as 2-(2'-chlorophenyl)-4,5-diphenyl imidazol, halomethyl-s-triazine derivatives, N-aryl-α-amino acids such as N-phenyl glycine, salts of N-aryl-α-amino acids, esters of N-aryl-α-amino acids, and so on as described in JP-A-10-39503.

The accelerator to be used is, for example, alkyl ester N,N-dialkylamino benzoate such as ethyl ester N,N-dimethylaminobenzoate, a mercapto compound having a heterocyclic ring such as 2-mercaptobenzothiazole, 2-mercaptobenzoxazole or 2-mercaptobenzoimidazole, an aliphatic polyfunctional mercapto compound, or the like. Each of the photopolymerization initiator and the additive may be used in combination of two or more kinds.

The compounding rate of the photopolymerization initiation system is in a range of from 0.1 to 30% by weight, preferably from 0.5 to 20% by weight, more preferably from 0.7 to 10% by weight to the total solid content of the composition for the color filter of the present invention. If the compounding rate is too low, the sensitivity will become lower. On the other hand, if it is too high, the solubility of unexposed portions in a developer will be degraded, so as to easily induce development failure.

(d-2) Thermal Polymerization Inhibitor

The thermal polymerization inhibitor to be used may be, for example, hydroquinone, p-methoxyphenol, pyrogallol, catechol, 2,6-t-butyl-p-cresol, 3-naphthol, or the like. The compounding rate of the thermal polymerization inhibitor is preferably in a range of from 0 to 3% by weight to the total solid content of the composition for the color filter of the present invention.

(d-3) Plasticizer

The plasticizer to be used may be, for example, dioctyl phthalate, didodecyl phthalate, triethylene glycol dicaprylate, dimethyl glycol phthalate, tricresyl phosphate, dioctyl adipate, dibutyl sebacate, glycerol triacetate, or the like. The compounding rate of the plasticizer is preferably in a range of at most 10% by weight to the total solid content of the composition for the color filter of the present invention.

(d-4) Sensitizing Dye

Furthermore, for a purpose of improving the sensitivity, a sensitizing dye according to a wavelength of an image exposure light source can be mixed in the composition for a color filter, as the case requires.

Examples of the sensitizing dye include xanthane dyes as described in JP-A-04-221958 and JP-A-04-219756, coumarin dyes having a heterocyclic ring as described in JP-A-03-239703 and JP-A-05-289335, 3-ketocoumarin compounds as described in JP-A-03-239703 and JP-A-05-289335, pyrromethene dyes as described in JP-A-06-19240, and dyes having a dialkyl aminobenzene skeleton as described in JP-A-47-2528, JP-A-54-155292, JP-B-45-37377, JP-A-48-84183, JP-A-52-112681, JP-A-58-15503, JP-A-60-88005, JP-A-59-56403, JP-A-02-69, JP-A-57-168088, JP-A-05-107761, JP-A-05-210240, and JP-A-04-288818.

Among these sensitizing dyes, preferred is an amino group-containing sensitizing dye, and more preferred is a compound having an amino group and a phenyl group in the same molecule. Particularly preferred is, for example, a benzophenone type compound such as 4,4'-bis(dimethylamino)benzophenone, 4,4'-bis(diethylamino)benzophenone, 2-aminobenzophenone, 4-aminobenzophenone, 4,4'-diaminobenzophenone, 3,3'-diaminobenzophenone or 3,4-diaminobenzophenone; a p-dialkylaminophenyl group-containing compound such as 2-(p-dimethylaminophenyl) benzoxazole, 2-(p-diethylaminophenyl) benzoxazole, 2-(p-dimethylaminophenyl) benzo[4,5]benzoxazole, 2-(p-dimethylaminophenyl) benzo[6,7]benzoxazole, 2,5-bis(p-diethylaminophenyl)1,3,4-oxazole, 2-(p-dimethylaminophenyl) benzothiazole, 2-(p-diethylaminophenyl) benzothiazole, 2-(p-dimethylaminophenyl) benzimidazole, 2-(p-diethylaminophenyl) benzimidazole, 2,5-bis(p-diethylaminophenyl)1,3,4-thiadiazole, (p-dimethylaminophenyl) pyridine, (p-diethylaminophenyl) pyridine, (p-dimethylaminophenyl) quinoline, (p-diethylaminophenyl) quinoline, (p-dimethylaminophenyl) pyrimidine or (p-diethylaminophenyl) pyrimidine; or the like. Among them, most preferred is 4,4'-dialkylaminobezophenone.

The compounding rate of the sensitizing dye is normally in a range of from 0 to 20°/a by weight, preferably from 0.2 to 15% by weight, and more preferably from 0.5 to 10% by weight to the total solid content of the composition for a color filter.

(d-5) Other Additives

To the composition for a color filter, an adhesion-improving agent, a coating property-improving agent, a development-improving agent, and so on, may further be optionally added.

The composition for a color filter may be used as dissolved in a solvent, in order to control the viscosity and to dissolve the additives of the photopolymerization initiation system and others.

The solvent can be optionally selected in accordance with the components of the composition such as (a) the binder resin, (b) the monomer, etc, and the solvent may be, for example, diisopropyl ether, mineral spirit, n-pentane, amyl ether, ethyl caprylate, n-hexane, diethyl ether, isoprene, ethyl isobutyl ether, butyl stearate, n-octane, Varsol #2, Apco #18 solvent, diisobutylene, amyl acetate, butyl acetate, Apco thinner, butyl ether, diisobutyl ketone, methyl cyclohexene, methyl nonyl ketone, propyl ether, dodecane, Socal solvent No. 1 and No. 2, amyl formate, dihexyl ether, diisopropyl ketone, Solveso #150, (n, sec, t)-butyl acetate, hexene, Shell TS28 solvent, butyl chloride, ethyl amyl ketone, ethyl benzoate, amyl chloride, ethylene glycol diethyl ether, ethyl orthoformate, methoxymethylpentanone, methyl butyl ketone, methyl hexyl ketone, methyl isobutyrate, benzonitrile, ethyl propionate, methyl cellosolve acetate, methyl isoamyl ketone, methyl isobutyl ketone, propyl acetate, amyl acetate, amyl formate, bicyclohexyl, diethylene glycol monoethyl ether acetate, dipentene, methoxymethylpentanol, methyl amyl ketone, methyl isopropyl ketone, propyl propionate, propylene glycol-t-butyl ether, methyl ethyl ketone, methyl cellosolve, ethyl cellosolve, ethyl cellosolve acetate, carbitol, cyclohexanone, ethyl acetate, propylene glycol, propylene glycol monomethyl ether, propylene glycol monomethyl ether acetate, propylene glycol monoethyl ether, propylene glycol monoethyl ether acetate, dipropylene glycol monoethyl ether, dipropylene glycol monomethyl ether, dipropylene glycol monomethyl ether acetate, 3-methoxypropionic acid, 3-ethoxypropionic acid, methyl 3-ethoxypropionate, ethyl 3-ethoxypropionate, methyl 3-methoxypropionate, ethyl 3-methoxypropionate, propyl 3-methoxypropionate, butyl 3-methoxypropionate, diglyme, ethylene glycol acetate, ethylcarbitol, butylcarbitol, ethylene glycol monobutyl ether, propylene glycol-t-butyl ether, 3-methyl-3-methoxybutanol, tripropylene glycol methyl ether, 3-methyl-3-methoxybutyl acetate, or the like. These solvents may be used in combination of two or more.

The solid content concentration in the composition for a color filter is selected in accordance with a coating method to be applied. In a spin coat, a slit and spin coat, and a die coat widely used in the production of the color filter at present, an appropriate solid content is normally in a range of from 1 to 40% by weight and preferably in a range of from 5 to 30% by weight.

A combination of solvents is determined taking a dispersion stability of a pigment, a solubility to soluble components in the solid contents, such as the resin, monomer and photopolymerization initiator, a drying property in coating, and a drying property in a reduced-pressure drying step into consideration.

A composition for a color filter using the above compounded components is produced, for example, as follows.

First, a colorant is subjected to a dispersion treatment and controlled into a state of ink. The dispersion treatment is conducted by means of a paint conditioner, a sand grinder, a ball mill, a roll mill, a stone mill, a jet mill, a homogenizer or the like. The colorant is brought into a state of fine particles by the dispersion treatment, thereby achieving an improvement in transmittance of transmitted light and an improvement in a coating property.

The dispersion treatment is preferably conducted in such a system that a binder resin having a dispersing function, a dispersing agent such as a surfactant, a dispersing assistance, etc. are optionally used together with the colorant and the solvent. It is particularly preferable to use a polymer dispersing agent, by virtue of its excellent dispersion stability over time.

For example, when the dispersion treatment is conducted by use of the sand grinder, it is preferred to use glass beads or zirconia beads having a particle size of from 0.05 to several millimeters. A temperature in the dispersion treatment is normally set in a range of from 0° C. to 100° C., preferably from room temperature to 80° C. A dispersing time is appropriately adjusted because an appropriate time for the dispersion treatment varies depending on the composition of ink (the colorant, the solvent and the dispersing agent), instrument specifications of the sand grinder, and so on.

Then the binder resin, monomer, photopolymerization initiation system, and others are mixed into the color ink obtained by the above dispersion treatment, to form a uniform solution. Since fine foreign particles are often mixed into the solution in each of the dispersion treatment step and the mixing step, the resulting solution is preferably filtered by means of a filter or the like.

(4-4) Other Constructions

The color image display device preferably has an absorbing section containing an absorbent to absorb ultraviolet to near ultraviolet light emitted from the semiconductor light emitting device. It may be provided on the panel portion to display an image or on the backlight. In a case where the absorbing section is provided on the panel portion, the absorbing section may be disposed, for example, at one or more positions among between the light diffusion sheet 33 and the polarizer 34, between the polarizer 34 and the glass substrate 35, between the glass substrate 38 and the polarizer 40 and on the surface of the polarizer 40, in FIG. 6. Whereas, in a case where the absorbing section is provided on the backlight, the absorbing section may be disposed, for example, at one or more positions among between the light source 31 and the light guide 41, between the light guide 41 and the light control sheet 43 and on the surface of the light control sheet 43, in FIGS. 8 and 9.

In either case of providing the absorbing section on the panel portion or on the backlight, the absorbing section may be provided in the form of a sheet or a coating film formed of a resin containing the absorbent, or may be provided by incorporating the absorbent in the above-mentioned component.

By providing the absorbing section in the color image display device as described above, it is possible to suppress an influence of the ultraviolet to near ultraviolet light over various components constituting the color image display device or to the observer. From the viewpoint of suppressing the influence to the observer, the position to form the absorbing section is optional, but from the viewpoint of suppressing the influence over the components constituting the color image display device, it is preferred to provide the absorbing section on the side as near as possible to the semiconductor light emitting device in the traveling direction of light from the semiconductor light emitting device. Especially with a view to suppressing deterioration of the color filter or liquid crystal by the ultraviolet or near ultraviolet light, it is preferred to provide the absorbing section before the liquid crystal in the traveling direction of the light from the semiconductor light emitting device.

Here, the absorbent contained in the absorbing section will be described in detail. The absorbent to be used in the present invention is not particularly limited so long as it has a function to absorb the ultraviolet to near ultraviolet light. It may, for example, be a benzophenone type absorbent such as o-hydroxybenzophenone, 2-hydroxy-4-n-octoxybenzophenone or 2-hydroxy-4-methoxybenzophenone; a benzotriazole type absorbent such as 2-(2'-hydroxyphenyl)benzotriazole, 2-(2'-hydroxy-5'-t-octylpheny)benzotriazole, 2-(2'-hydroxy-1-butyl-5'-methylphenyl)-5-chlorobenzotriazole or 2-(2'-hydroxy-5'-methylphenyl)benzotriazole; a cyano acrylate type absorbent such as ethyl-2-cyano-3,3-diphenyl acrylate or 5-ethylhexyl-2-cyano-3,3-diphenyl acrylate; a salicylate type absorbent such as phenyl salicylate or 4-t-butylphenyl salicylate; an oxalic acid anilide type absorbent such as 2-ethyl-5'-t-butyl-2'-ethoxy-N,N'-diphenyloxalamide; or an inorganic oxide type absorbent such as zinc oxide, titanium oxide or zirconium oxide. Here, these inorganic oxides may be used as contained in glass to form an ultraviolet-shielding glass.

The absorbent can be used as dissolved in a resin, whereby the transparency is good. Further, as an inorganic adsorbent, dispersed particles having an average particle size of at most 100 nm may be used so that an absorbing section excellent in transparency may be obtained. Further, in the case of an optically active compound such as titanium oxide, it is preferred that the particle surface is treated with an inert material such as silica. With such an absorbent, the ultraviolet-shielding effect may be adjusted by adjusting its amount added to the resin. Among them, as an absorbent to shield an ultraviolet ray of at most 350 nm, a benzophenone type or zinc oxide type absorbent may be mentioned. They may be used alone or in combination as a mixture of two or more of them. By using these absorbents, it is possible to substantially shield light with a wavelength of at most 350 nm. In order to further prevent deterioration of the organic compound such as a binder resin and to improve the durability of the color image display device, it is preferred to shield near ultraviolet light having a wavelength of at most 400 nm, and such can be accomplished by suitably selecting the absorbent among the above-described ones.

The absorbent is used usually as mixed with a suitable resin. The resin to be used for this purpose may, for example, be a thermoplastic resin, a thermosetting resin or a photo-curable resin. Specifically, it may, for example, be an acrylic resin such as polymethyl methacrylate; a styrene resin such as polystyrene or a styrene/acrylonitrile copolymer; a polycarbonate resin; a polyester resin; a phenoxy resin; a butyral resin; a polyvinyl alcohol; a cellulose resin such as ethyl cellulose, cellulose acetate or cellulose acetate butyrate; an epoxy resin; a phenol resin; or a silicone resin. Among them, an epoxy resin, a butyral resin or a polyvinyl alcohol; may, for example, be preferred from the viewpoint of the transparency, heat resistance, light resistant toughness, etc.

EXAMPLES

Now, the present invention will be described in further detail with reference to Examples, but it should be understood that the present invention is by no means restricted to the following Examples.

Group I of Examples: Production of Light Emitting Device and Color Image Display Device In the following Examples, "parts" means "parts by weight".

(1) Preparation of Phosphors

(1-1) Preparation Example 1: Red Emitting Phosphor $K_2TiF_6$:Mn (Hereinafter Sometimes Referred to Also as "KTF")

So that the feedstock composition for a phosphor would be $K_2Ti_{0.95}Mn_{0.05}F_6$, as raw material compounds, $K_2TiF_6$ (4.743 g) and $K_2MnF_6$ (0.2596 g) were slowly added and dissolved in 40 ml of hydrofluoric acid (47.3 wt %) with stirring under atmospheric pressure at room temperature. After the respective raw material compounds were all dissolved, 60 ml of acetone was added at a rate of 240 ml/hr while stirring the solution to let a phosphor precipitate in the poor solvent. The obtained phosphor was washed with pure water and acetone, respectively, followed by drying at 100° C. for one hour. The obtained phosphor was confirmed to be $K_2TiF_6$:Mn by X-ray diffraction pattern.

(1-2) Preparation Example I-2: Green Emitting Phosphor $Ba_aSi_6O_{12}N_2$:Eu (Hereinafter Sometimes Referred to as "BSON")

So that the feedstock composition for a phosphor would be $Ba_{2.7}Eu_{0.3}Si_{6.9}O_{12}N_{3.2}$, as raw material compounds, $BaCO_3$ (267 g), $SiO_2$ (136 g) and $Eu_2O_3$ (26.5 g) were thoroughly stirred and mixed, and then filled in an alumina crucible. This mortar was placed in a resistance heating type electric furnace equipped with a temperature adjuster, heated to 1,100° C. at a temperature raising rate of 5° C./min under atmospheric pressure, held at that temperature for 5 hours and then left to cool to room temperature. The obtained sample was pulverized to at most 100 μm in the alumina crucible.

The obtained sample (295 g) and $Si_3N_4$ (45 g) as a raw material compound were thoroughly stirred and mixed, and then filled in an alumina mortar for primary firing, and this crucible was heated to 1,200° C. under atmospheric pressure while circulating a gas mixture of 96 vol % of nitrogen and 4 vol % of hydrogen at a rate of 0.5 L/min, held at that temperature for 5 hours and then left to cool to room temperature. The obtained fired powder was pulverized to at most 100 μm in the alumina crucible.

300 g of the fired powder obtained in the above primary firing, and as flux $BaF_2$ (6 g) and $BaHPO_4$ (6 g) were thoroughly stirred and mixed, then filled in an alumina crucible, heated to 1,350° C. under atmospheric pressure while circulating a gas mixture of 96 vol % of nitrogen and 4 vol % of hydrogen at a rate of 0.5 L/min as secondary firing, held at that temperature for 8 hours and then left to cool to room temperature. The obtained fired powder was pulverized to at most 100 μm in the alumina crucible.

A sample (70 g) obtained by the above secondary firing, $BaCl_2$ (5.6 g) as flux and $BaHPO_4$ (3.5 g) were thoroughly stirred and mixed, then filled in an alumina crucible, heated to 1,200° C. under atmospheric pressure while circulating a gas mixture of 96 vol % of nitrogen and 4 vol % of hydrogen at a rate of 0.5 L/min as third firing, held at that temperature for 5 hours and then left to cool to room temperature. The obtained fired powder was slurried and dispersed by means of glass beads, sieved to separate particles of at most 100 μm, then subjected to washing treatment, followed by surface coating by calcium phosphate by means of a calcium solution and a phosphate solution.

2 g of the obtained phosphor was heated in an atmospheric air to 700° C. in about 40 minutes by means of a quartz container having a diameter of 30 mm, and held at 700° C. for 10 minutes and then the quartz container was taken out from the furnace and cooled to room temperature on a heat resistant brick. From an X-ray diffraction pattern of the obtained fired product, it was confirmed that $Ba_3Si_6O_{12}N_2$:Eu was prepared.

(1-3) Preparation Example I-3: Green Emitting Phosphor Eu-Activated β-SiAlON Phosphor (Hereinafter Sometimes Referred to as "13-SiAlON")

95.5 wt % of α-silicon nitride powder, 3.3 wt % of aluminum nitride powder, 0.4 wt % of aluminum oxide powder and 0.8 wt % of europium oxide powder were thoroughly mixed in an agate mortar, and this raw material powder was filled in a crucible made of boron nitride and subjected to heat treatment at 1,950° C. for 12 hours in a pressurized nitrogen atmosphere of 0.92 MPa in a pressure nitriding furnace having a carbon heater. The obtained fired powder was pulverized, then sieved, subjected to washing treatment and then dried to obtain a phosphor powder. By the powder X-ray diffraction measurement, the prepared powder was found to be a single phase Eu-activated β-sialon phosphor.

(1-4) Preparation Example I-4: Red Emitting Phosphor $BaTiF_6$:Mn (Hereinafter Sometimes Referred to as "BTF")

So that the feedstock composition for a phosphor would be $K_2Ti_{0.95}$ $Mn_{0.05}F_6$, as raw material compounds, $K_2TiF_5$ (4.743 g) and $K_2MnF_5$ (0.2569 g) were slowly added and dissolved in 50 ml of hydrofluoric acid (47.3 wt %) with stirring under atmospheric pressure at room temperature. After the respective raw material compounds were all dissolved, $BaCO_3$ (3.8987 g) was added to a solution while stirring the solution to let the phosphor $BaTiF_6$:Mn precipitate. The obtained phosphor was washed with pure water and acetone, respectively, and dried at 100° C. for one hour.

(1-5) Preparation Example I-5: Red Emitting Phosphor $K_2SiF_6$:Mn (Hereinafter Sometimes Referred to as "KSF")

So that the feedstock composition for a phosphor would be $K_2Si_{0.95}$ $Mn_{0.05}F_6$, as raw material compounds, $K_2SiF_5$ (1.7783 g) and $K_2MnF_5$ (0.2217 g) were added and dissolved in 70 ml of hydrofluoric acid (47.3 wt %) with stirring under atmospheric pressure at room temperature. After the respective raw material compounds were all dissolved, 70 ml of acetone was added at a rate of 240 ml/hr while stirring the solution to let a phosphor precipitate in the poor solvent. The obtained phosphor was washed with ethanol and dried at 130° C. for one hour to obtain 1.7 g of the phosphor.

From the X-ray diffraction pattern of the obtained phosphor, it was confirmed that $K_2SiF_5$:Mn was prepared.

(1-6) Preparation Example I-6: Green Emitting Phosphor $BaMgAl_{10}O_{17}$:Eu,Mn (Hereinafter Sometimes Referred to as "GRAM")

As phosphor raw materials, barium carbonate ($BaCO_3$), europium oxide ($Eu_2O_3$), basic magnesium carbonate (mass per mol of Mg: 93.17), manganese carbonate ($MnCO_3$) and α-alumina ($Al_2O_3$), and, as a firing assistant, aluminum fluoride ($AlF_3$) were used. These phosphor raw materials were weighed in such amounts that the chemical composition would be $Ba_{0.45}Sr_{0.245}Eu_{0.3}Mg_{0.7}Mn_{0.3}Al_{10}O_{17}$, and the firing assistant was weighed in an amount of 0.8 wt % to the total weight of the phosphor raw materials, and they were mixed in a mortar for 30 minutes and then filled in an alumina crucible. In order to produce a reducing atmosphere for firing, alumina crucibles were doubled, and graphite beads were packed in a space surrounding the inside crucible, followed by firing at 1,550° C. for two hours in the atmosphere. The obtained fired product was pulverized to obtain a green emitting phosphor (GBAM).

(1-7) Preparation Example I-7: Blue Emitting Phosphor $Sr_{10}$ $(PO_4)_5Cl_2$:Eu (Hereinafter Referred to as "SCA")

0.2 mol of $SrCO_3$ (manufactured by Kanto Chemical Co., Inc), 0.605 mol of $SrHPO_4$ (manufactured by Kanto Chemical Co., Inc.), 0.050 mol of $Eu_2O_3$ (manufactured by Shin-Etsu Chemical Co., Ltd. purity: 99.99%) and 0.1 mol of $SrCl_2$ (manufactured by Kanto Chemical Co., Inc) were weighed and dry-mixed by a small size V-type blender.

The obtained raw material mixture was filled in an alumina crucible and set in a box type electric furnace. The temperature was raised to 1,050° C. at a temperature raising rate of 5° C./min in the atmosphere under atmospheric pressure, and maintained for 5 hours to obtain a fired product (primary firing).

Then, the crucible was cooled to room temperature, and the content of the crucible was taken out and pulverized.

To the obtained fired product, 0.05 mol of $SrCl_2$ was added, and the mixture was mixed in a small size V-type blender and then filled in an alumina crucible. The crucible was set in the same electric furnace as for the primary firing. While circulating a hydrogen-containing nitrogen gas (hydrogen:nitrogen=4:96 by volume ratio) at a rate of 2.5 l/min, the temperature was raised to 950° C. at a temperature raising rate of 5° C./min in a reducing atmosphere under atmospheric pressure and maintained for 3 hours (secondary firing). Then, the crucible was cooled to room temperature, and the content of the crucible was taken out and pulverized. To the obtained fired product, 0.05 mol of $SrCl_2$ was added, and the mixture was mixed in a small size V-type blender and then filled in an alumina crucible. Again, the crucible was set in the same electric furnace as for the secondary firing. While circulating a hydrogen-containing nitrogen gas (hydrogen:nitrogen=4:96 by volume ratio) at a rate of 2.5 l/min, the temperature was raised to 1,050° C. at a temperature raising rate of 5° C./min in a reducing atmosphere under atmospheric pressure and maintained for 3 hours.

The obtained fired product was roughly pulverized to a particle size of about 5 mm and then treated by a ball mill for 6 hours to obtain a phosphor slurry.

To wash the phosphor, the phosphor slurry was stirred and mixed with a large amount of water and left to stand until the phosphor particles settled, and then the supernatant was discarded. This operation was repeated until the electrical conductivity of the supernatant became at most 3 mS/m. After confirming that the electrical conductivity of the supernatant became at most 3 mS/m, classification was carried out to remove fine particles and coarse particles of the phosphor.

The obtained phosphor slurry was dispersed in a $Na_3PO_4$ aqueous solution with pH=10, and after removing small particles by classification, calcium phosphate treatment was carried out. After dehydration, drying was carried out at 150° C. for 10 hours to obtain a phosphor (SCA):$Sr_{10}(PO_4)_6Cl_2$:Eu. When the obtained phosphor was excited by light with a wavelength of 400 nm, the emission peak wavelength was 450 nm, and the half-value width was 29 nm.

(1-8) Evaluation of Temperature Dependency of Phosphor

With respect to the respective phosphors prepared in the above (1-1) to (1-6) and a red emitting phosphor "BR-101B" ($CaAlSiN_3$:Eu, hereinafter sometimes referred to as "CASN660") manufactured by Mitsubishi Chemical Corporation, the temperature dependency of the luminance and emission peak intensity (hereinafter sometimes generally referred to as "temperature characteristics") under excitation with wavelengths of 400 nm and 455 nm, were measured.

The measurement of the temperature characteristics was carried out by the following procedure by using an apparatus equipped with MCPD7000 multichannel spectrum-measuring device manufactured by Otsuka Electrics Co., Ltd. as an emission spectrum-measuring device, Luminance calorimeter BM5A as a luminance-measuring device, a stage provided with a cooling mechanism by a Peltier element and a heating mechanism by a heater, and a 150 W xenon lamp as a light source.

A cell containing a phosphor sample was placed on the stage, and the temperature was changed from 25° C. to 150° C., whereby the surface temperature of the phosphor was confirmed, and then, the phosphor was excited by light having a wavelength of 400 nm or 455 nm spectroscopically taken out from a light source by means of a diffraction grating, to measure the emission spectrum. From the measured emission spectrum, the emission peak intensity at 25° C. and the emission peak intensity at 100° C. were obtained, and the variation rate (%) of the emission peak intensity was obtained by the following formula (λ).

$$\{1-(\text{emission peak intensity at } 100°\text{ C.})/(\text{emission peak intensity at } 25°\text{ C.})\}\times 100 \quad (A)$$

Here, as the measured value of the surface temperature of the phosphor on the side irradiated with the excitation light, a value corrected by using the temperature values measured by a radiation thermometer and a thermocouple, was used. The results are shown in the following Table 10.

With respect to SCA i.e. the blue emitting phosphor prepared in the above (1-7), the temperature characteristics were measured under excitation with a wavelength of 400 nm, whereby the variation rate of the emission peak intensity was 14%.

TABLE 10

| Red emitting phosphor | Type | Emission peak wavelength (nm) | Half-value width (nm) | Wavelength range of excitation light (nm) | Variation rate of emission peak intensity (%) | Notes |
|---|---|---|---|---|---|---|
| Preparation Example I-1 | KTF | 631 | 7 | 320-520 | 20 | 455 nm excitation |
| Preparation Example I-4 | BTF | 632 | 7 | 335-520 | 40 | 455 nm excitation |
| Preparation Example I-5 | KSF | 630 | 6 | 310-510 | 15 | 455 nm excitation |
| CASN660 | | 659 | 89 | 300-620 | 10 | 400 nm excitation |

| Green emitting phosphor | Type | Emission peak wavelength (nm) | Half-value width (nm) | Emission wavelength range (nm) | Variation rate of emission peak intensity (%) | Notes |
|---|---|---|---|---|---|---|
| Preparation Example I-2 | BSON | 529 | 68 | 470-610 | 17 | 455 nm excitation |
| Preparation | β-SiAlON | 542 | 56 | 495-620 | 12 | 455 nm |

TABLE 10-continued

| | | | | | | |
|---|---|---|---|---|---|---|
| Example I-3 | | | | | | excitation |
| Preparation Example I-6 | GBAM | 517 | 27 | 495-560 | 9 | 400 nm excitation |

(2) Production of Backlight

Production Examples of the backlight of the present invention will be given.

(2-1) Production Example I-1: Production of Backlight 1 (BL-1)

A light-emitting device is prepared by the following procedure.

A blue light emitting diode having a peak emission wavelength of 454 nm is bonded to a cup bottom surface of a frame by die bonding, and then, the light emitting diode and the frame electrodes are connected by wire bonding.

As a green-emitting phosphor, BSON is used, and as a red-emitting phosphor, KTF is used. These phosphors are kneaded into a silicone resin "JCR6101UP" manufactured by Dow Corning Toray Silicone Co., Ltd. to obtain a paste, which is applied and cured on the light emitting diode in the cup to obtain a semiconductor light emitting device.

Then, a cyclic polyolefin type resin sheet (trade name "ZEONOR" manufactured by ZEON CORPORATION) of wedge shape, which has a size of 289.6×216.8 mm and a thicknesses varying along the direction of the short side between a maximum thickness of 2.0 mm and a minimum thickness of 0.6 mm, is used as a light guide, and a semiconductor light emitting device (light source) comprised of the above-mentioned light emitting diode is placed along the thick long side, so as to allow emitted light from the linear light source to efficiently enter the thick side (light entrance surface) of the light guide.

The surface opposite to the light exit surface of the light guide is patterned by transferring fine circular patterns of rough surfaces with gradually increasing diameter according to the distance from the linear light source, from a die to the surface. The diameter of the rough surface patterns is 130 μm near the light source, gradually increases with distance from the light source, and is 230 μm at the most distant position.

The die used in the formation of the fine circular patterns of the rough surfaces herein is prepared by laminating a dry film resist in a thickness of 50 μm on a SUS substrate, forming openings in portions corresponding to the patterns by photolithography, further subjecting the die to uniform blasting under a projection pressure of 0.3 MPa with spherical glass beads of #600 by a sandblasting method, and thereafter peeling the dry film resist off.

The light exit surface of the light guide is provided with a triangular prism array with the apex angle of 90° and the pitch of 50 μm so that the ridge lines are approximately perpendicular to the light entrance surface of the light guide, thus achieving a structure of enhancing a light collecting property of beams emitted from the light guide. A die used in the formation of the light collecting element array consisting of the triangular prism array is prepared by a process of cutting a stainless steel substrate overlaid with an M nickel coating by electroless plating, with a single-crystal diamond cutting tool.

A light reflecting sheet ("Lumirror E60L" manufactured by TORAY Industries, Inc.) is placed on the side opposite to the light exit surface of the light guide, a light diffuser sheet is placed on the light exit surface, and two sheets with a triangular prism array having the apex angle of 90° and the pitch of 50 μm ("BEFIII" manufactured by SUMITOMO 3M Limited) are placed on the light diffuser sheet so that the ridge lines of the respective two prism sheets become perpendicular to each other, thereby obtaining a backlight 1 (BL-1).

The backlight 1 (BL-1) thus obtained has one emission peak wavelength in each of the wavelength regions of 455 nm, 529 nm and 631 nm.

(2-2) Production Example I-2: Production of Backlight 2 (BL-2)

A backlight 2 (BL-2) is prepared in the same manner as in Production Example I-1 except that in Production Example I-1, β-SiAlON is used instead of BSON as a green emitting phosphor. The backlight 2 has one emission peak wavelength in each of the wavelength regions of 455 nm, 542 nm and 631 nm.

(2-3) Production Example I-3: Production of Backlight 3 (BL-3)

A backlight 3 (BL-3) is prepared in the same manner as in Production Example I-1 except that in Production Example I-1, $BaTiF_6$:Mn is used instead of KTF as a red emitting phosphor. Here, $BaTiF_5$:Mn is a phosphor disclosed in US2006/069998A1, and its emission spectrum is disclosed in the same document. As shown in the same document, the backlight 3 has one emission peak wavelength in each of the wavelength regions of 455 nm, 529 nm and 631 nm.

(2-4) Production Example I-4: Production of Backlight 4 (BL-4)

A backlight 4 (BL-4) is prepared in the same manner as in Production Example I-1 except that in Production Example I-1, as a green emitting phosphor, β-SiAlON is used, instead of BSON. The backlight 4 has one emission peak wavelength in each of the wavelength regions of 456 nm, 542 nm and 631 nm.

(2-5) Production Example I-5: Production of Conventional Backlight 5 (BL-5) as Comparative Example A light emitting device is prepared by the following procedure.

A blue color emitting diode having a peak emission wavelength of 460 nm is bonded to a cup bottom surface of a frame by die bonding, and then, the light emitting diode and frame electrodes are connected by wire bonding. As a yellow emitting phosphor, $Y_{2.8}Tb_{0.1}Ce_{0.1}Al_5O_{12}$ is prepared in accordance with the method disclosed in Example 1 of JP-A-2006-265542 and is used. This phosphor is kneaded to an epoxy resin to obtain a paste, which is applied and cured on the light emitting diode in the cup. For the subsequent process, the same method as in Preparation Example I-1 is used to obtain a conventional backlight 5 as Comparative Example.

(2-6) Production Example I-6: Production of Backlight 6 (BL-6)

As a near ultraviolet emitting LED to emit a dominant emission wavelength of from 390 nm to 400 nm, 290 μm square chip C395MB290 manufactured by Cree was used, and it was bonded to terminals at the bottom of a concave portion of a 3528SMD type PPA resin package by a silicone resin base transparent die bonding paste. Then, heating was carried out at 150° C. for two hours to cure the transparent die bonding paste, and then the near ultraviolet LED and the electrodes of the package were wire-bonded by using a gold wire having a diameter of 25 μm.

On the other hand, KSF prepared in Preparation Example I-5 for phosphor, GBAM prepared in Preparation Example I-6 and the SCA phosphor prepared in Preparation Example I-7 are used, and as binder resins, a silicone resin (SCR1011) manufactured by Shin-Etsu Chemical Co., Ltd. and AEROSIL (RX200) manufactured by Nippon Aerosil Co., Ltd, were weighed in the blend amounts as disclosed in Table 11, followed by mixing by an agitation defoaming device AR-100 manufactured by Thinky Corporation to obtain a phosphor-containing composition.

Then, using a dispenser, 4 μl of the phosphor-containing composition obtained as described above was injected into a concave portion of the SMD type resin package having the above near ultraviolet emitting LED mounted. Then, heating was carried out at 70° C. for one hour and then at 150° C. for 5 hours to cure the phosphor-containing composition thereby to prepare a backlight 6 (BL-6).

(2-7) Production Example I-7: Production of Backlight 7 (BL-7) for Comparative Example A backlight 7 (BL-7) is prepared in the same manner as in Production Example I-6 except that the red emitting phosphor to be used is changed to CASN660 having a long wavelength as the emission peak wavelength and a wide half-value width, and the amounts of the respective phosphors, the silicone resin and the AEROSIL are changed as shown in Table 11.

(2-8) Production Example I-8: Production of Backlight 8 (BL-8)

A backlight 8 (BL-8) is prepared in the same manner as in Production Example I-6 except that the amounts of the respective phosphors, the silicone resin and the AEROSIL are changed as shown in Table 11.

(2-9) Production Example I-9: Production of Backlight 9 (BL-9) for Comparative Example A backlight 9 (BL-9) is prepared in the same manner as in Production Example I-6 except that the red emitting phosphor to be used is changed to CASN1660 having a long wavelength as the emission peak wavelength and a wide half-value width, and the amounts of the respective phosphors, the silicone resin and the AEROSIL are changed as shown in Table 11.

TABLE 11

| | Blend amounts (g) | | | | | | | |
|---|---|---|---|---|---|---|---|---|
| | Blue emitting phosphor | | Green emitting phosphor | | Red emitting phosphor | | Silicone resin | AEROSIL |
| BL-7 | SCA | 0.030 | GBAM | 0.091 | CASN660 | 0.010 | 0.610 | 0.019 |
| BL-6 | SCA | 0.053 | GBAM | 0.088 | KSF | 0.304 | 0.793 | 0.025 |
| BL-9 | SCA | 0.040 | GBAM | 0.090 | CASN660 | 0.009 | 0.606 | 0.019 |
| BL-8 | SCA | 0.040 | GBAM | 0.065 | KSF | 0.150 | 0.602 | 0.019 |

(3) Production of Binder Resins (3-1) Production Example I-10: Binder Resin A

55 Parts by weight of benzyl methacrylate, 45 parts by weight of methacrylic acid and 150 parts by weight of propylene glycol monomethyl ether acetate are put into a 500 ml separable flask, and the interior of the flask is sufficiently replaced with nitrogen. Thereafter, 6 parts by weight of 2,2'-azobisisobutyronitrile is added, followed by stirring at 80° C. for 5 hours to obtain a polymer solution. The prepared polymer has a weight average molecular weight of 8,000 and an acid value of 176 mgKOH/g.

(3-2) Production Example I-11: Binder Resin B 145 parts by weight of propylene glycol monomethyl ether acetate is stirred while carrying out replacement with nitrogen, and the temperature is raised to 120° C. Then, 20 parts by weight of styrene, 57 parts of glycidyl methacrylate and 82 parts by weight of a monoacrylate having a tricyclodecane skeleton (FA-513M, manufactured by Hitachi Chemical Company, Ltd.) are dropwise added, followed by further stirring at 120° C. for two hours.

Then, the interior of the reactor is replaced with air, 27 parts by weight of acrylic acid, 0.7 part by weight of trisdimethylaminomethylphenol and 0.12 part by weight of hydroquinone are introduced, and the reaction is continued at 120° C. for 6 hours. Thereafter, 52 parts by weight of tetrahydrophthalic anhydride (THPA) and 0.7 part by weight of triethylamine are added, followed by a reaction at 120° C. for 3.5 hours.

The polymer thus obtained has a weight average molecular weight Mw of about 8,000.

(4) Production Example I-12: Production of Clear Resist Solution

A resist solution is obtained by mixing the following components in the following proportions and stirring the components with a stirrer until the components are completely dissolved.

Binder resin B prepared in Production Example I-11: 2.0 parts

Dipentaerythritol hexaacrylate: 1.0 part
Photopolymerization initiation system
2-(2'-chlorophenyl)-4,5-diphenylimidazole: 0.06 part
2-mercaptobenzothiazole: 0.02 part
4,4'-bis(diethylamino)benzophenone: 0.04 part
Solvent (propylene glycol monomethyl ether acetate): 9.36 parts
Surfactant ("F-475") manufactured by Dainippon Ink and Chemicals, Incorporated): 0.0003 part (5) Production of Color Filter (5-1) Production Example I-13: Production of Red Pixels (for Examples I-1 to 10 and Comparative Examples I-1 to 4)

75 parts of propylene glycol monomethyl ether acetate, 16.7 parts of a red pigment (hereinafter referred to as "P.R.") 254, 4.2 parts of acrylic dispersant "DB2000" manufactured by Big Chemie and 5.6 parts of binder resin A prepared in Production Example I-10 are mixed and stirred with a stirrer for three hours to prepare a mill base having a solid content concentration of 25% by weight. This mill base was subjected to a dispersion treatment at a peripheral velocity of 10 m/s for a residence time of three hours with a bead mill system using 600 parts of 0.5-mmφ zirconia beads, thereby to obtain a P.R.254 dispersed ink.

Another mill base is prepared in the same composition as in the above P.R.254 case except for a change of the pigment to an azo nickel complex yellow pigment prepared in accordance with the disclosure of Production Example of Example 2 (paragraph [0066]) of JP-A-2007-25687, and is subjected to a dispersion treatment under similar dispersion conditions for a residence time of two hours, thereby to obtain an azo nickel complex yellow pigment-dispersed ink as disclosed in JP-A-2007-25687. Further, another mill base is prepared in the same composition as in the above P.R.254 except for a change of the pigment to P.R.177, and is subjected to a dispersion treatment under similar dispersion conditions for a residence time of three hours, thereby to obtain a P.R.177 dispersed ink.

The dispersed inks obtainable as described above and the resist solution obtainable in the above Production Example I-12 are mixed and stirred in the compounding ratio as shown in the following Table 12, and a solvent (propylene glycol monomethyl ether acetate) is added thereto to bring the final solid content concentration to be 25 wt %, thereby to obtain a composition for a red color filter.

The composition for a color filter thus obtained is applied on a glass substrate of 10 cm×10 cm ("AN635" manufactured by Asahi Glass Company, Limited) by a spin coater, and dried. The entire surface of this substrate is irradiated with ultraviolet light with an exposure amount of 100 mJ/cm$^2$, followed by development with an alkali developer and then by post-baking in an oven at 230° C. for 30 minutes, thereby to prepare a red pixel sample for measurement. The thickness of the red pixel after the preparation is adjusted to be 2.5 μm.

TABLE 12

|  | R254 | R177 | Azo nickel complex | Clear resist |
|---|---|---|---|---|
| For Ex. I-1, 3, 5 and 7 | 18.5 | 10.7 | 0 | 70.8 |
| For Ex. I-2, 4, 6, 8 to 10 and Comp. Ex. I-3 and 4 | 24.1 | 13.9 | 0 | 62.0 |

TABLE 12-continued

|  | R254 | R177 | Azo nickel complex | Clear resist |
|---|---|---|---|---|
| For Comp. Ex. I-1 | 16.4 | 6.3 | 0 | 77.3 |
| For Comp. Ex. I-2 | 16.7 | 17.2 | 0 | 66.1 |

(5-2) Production Example I-14: Production of Green Pixels (for Examples I-1 to 10, and Comparative Examples I-1 to 4)

A mill base is prepared in the same composition as in the P.R.254 case in Production Example I-13 except for a change of the pigment to pigment green (hereinafter referred to as "P.G.") 36, and is subjected to a dispersion treatment under similar dispersion conditions for a residence time of one hour, thereby to obtain a P.G.36 dispersed ink.

A P.G.7 dispersed ink is prepared in the same manner as above except for changing the pigment to pigment green (hereinafter referred to as "P.G.") 7.

Here, the azo nickel complex yellow pigment-dispersed ink disclosed in JP-A-2007-25687 is prepared in the same manner as disclosed in Production Example I-13.

Similarly, a mill base is prepared in the same composition except for a change of the pigment to zinc phthalocyanine bromide and the dispersant to the acrylic dispersant "LPN6919" manufactured by Big Chemie and subjected to dispersion treatment under the same dispersion conditions for a residence time of 3 hours thereby to obtain a zinc phthalocyanine bromide-dispersed ink. Here, the zinc phthalocyanine bromide pigment was prepared by the method shown in the following (5-2-1).

(5-2-1) Preparation Example for Zinc Phthalocyanine Bromide

Zinc phthalocyanine was prepared by using phthalodinitrile and zinc chloride as raw materials. Its 1-chloronaphthalene solution had absorption of light at from 600 to 700 nm. The halogenation was carried out by mixing 3.1 parts of furfuryl chloride, 3.7 parts of anhydrous aluminum chloride, 0.46 part of sodium chloride and 1 part of zinc phthalocyanine and drop wise adding 4.4 parts of bromine. The reaction was carried out at 80° C. for 15 hours, and then, the reaction mixture was put into water to let zinc phthalocyanine bromide crude pigment precipitate. This aqueous slurry was subjected to filtration and washing with hot water of 80° C., followed by drying at 90° C. to obtain 3.0 parts of a refined zinc phthalocyanine bromide crude pigment.

One part of this zinc phthalocyanine bromide crude pigment, 12 parts of pulverized sodium chloride, 1.8 parts of diethylene glycol and 0.09 part of xylene were charged into a dual-armed kneader and kneaded at 100° C. for 6 hours. After the kneading, the mixture was taken into 100 parts of water at 80° C., followed by stirring for one hour and then by filtration, washing with hot water, drying and pulverization to obtain a zinc phthalocyanine bromide pigment.

The obtained zinc phthalocyanine bromide pigment was found to have an average composition of $ZnPcBr_{14}Cl_2$ (where Pc: phthalocyanine) and contains 14 bromine atoms per molecule on average, from the analysis of the halogen content by mass analysis. Further, the average value of the primary particle size measured by a transmission electron microscope (H-9000UHR, manufactured by Hitachi, Ltd.) was 0.023 μm. Here, the average primary particle size of the pigment was obtained in such a manner that the pigment was dispersed in chloroform by ultrasonic waves and dropped on a collodion membrane-bonded mesh and dried, followed by observation by a transmission electron microscope (TEM) to obtain an image of primary particles of the pigment, and from this image, the primary particle sizes were measured, and the average particle size was obtained.

A dispersed ink obtained as described above, and a resist solution prepared in the above Production Example I-12 are mixed and stirred in a blend ratio as shown in the following Table 13, and a solvent (propylene glycol monomethyl ether acetate) is added so that the final solid content concentration will be 25 wt % thereby to obtain a composition for a green color filter.

The composition for a color filter thus obtained is applied on a glass substrate of 10 cm×10 cm ("AN635", manufactured by Asahi Glass Company, Limited) by a spin coater, and dried. The entire surface of this substrate is irradiated with ultraviolet light with an exposure amount of 100 mJ/cm$^2$, followed by development with an alkali developer and then by post-baking in an oven at 230° C. for 30 minutes, thereby to prepare a green pixel sample for measurement. The thickness of the green pixel after the preparation is adjusted to be 2.5 μm.

TABLE 13

| Green pixel | Zinc phthalocyanine bromide pigment | G36 | G7 | Azo nickel complex | Clear resist |
|---|---|---|---|---|---|
| For Ex. I-1, 3, 5 and 7 | 21.3 | 0 | 0 | 20.1 | 58.6 |
| For Ex. I-2, 4, 6, 8 to 10 and Comp. Ex. I-3 and 4 | 22.4 | 0 | 0 | 21.1 | 56.5 |
| For Comp. Ex. I-1 | 0 | 0.0 | 13.0 | 14.4 | 72.6 |
| For Comp. Ex. I-2 | 0 | 60.4 | 0 | 2.9 | 36.7 |

(5-3) Production Example I-15: Production of Blue Pixel (for Examples I-1 to 10 and Comparative Examples I-1 to 4)

A mill base is prepared in the same composition as in the P.R.254 case in Production Example I-13 except for a change of the pigment to P.G.15:6, and is subjected to a dispersion treatment under similar dispersion conditions for a residence time of one hour, thereby to obtain a P.G.15:6 dispersed ink.

Further, a mill base is prepared in the same composition as in the P.R. case in Production Example I-13 except for a change of the pigment to pigment violet (hereinafter referred to as "P.V.") 23, and is subjected to a dispersion treatment under similar dispersion conditions for a residence time of two hours, thereby to obtain a P.V.23 dispersed ink.

Here, the P.V.23 dispersed ink is obtained in the same manner as disclosed in the above Production Example I-14.

The dispersed inks obtainable as described above, and the resist solution prepared in the above Production Example I-12 are mixed and stirred in the compounding ratio as shown in the following Table 14, and a solvent (propylene glycol monomethyl ether acetate) is added to bring the final solid content concentration to be 25 wt %, thereby to obtain a composition for a blue color filter.

The composition for a color filter thus obtained is applied on a glass substrate of 10 cm×10 cm ("AN100", manufactured by Asahi Glass Company, Limited) by a spin coater and dried. The entire surface of this substrate is irradiated with ultraviolet light with an exposure amount of 100 mJ/cm$^2$, followed by development with an alkali developer and then by post-baking in an oven at 230° C. for 30 minutes, thereby to prepare a blue pixel sample for measurement. The thickness of the blue pixel after the preparation is adjusted to be 2.5 μm.

TABLE 14

| Blue pixel | B15:6 | V23 | G36 | Clear resist |
|---|---|---|---|---|
| For Ex. I-1, 3, 5 and 7 | 8.0 | 2.7 | 0 | 89.3 |
| For Ex. I-2, 4, 6, 8 to 10 and Comp. Ex. I-3 and 4 | 14.4 | 4.9 | 0 | 80.7 |
| For Comp. Ex. I-1 | 7.7 | 2.7 | 0 | 89.6 |
| For Comp. Ex. I-2 | 16.4 | 1.4 | 9.7 | 72.5 |

(5-4) Color Filters

Figure 10:
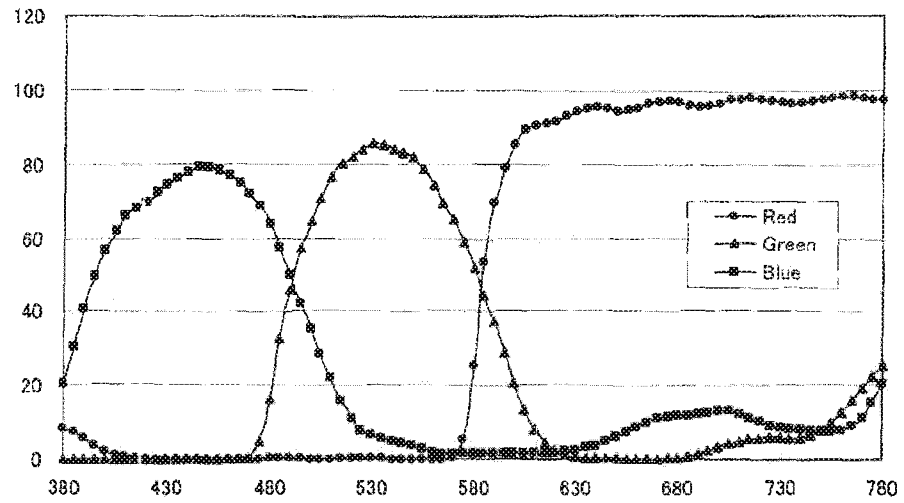
FIG. 10 is a transmittance spectrum of a color filter for Example I-1, 5 or 7.
Figure 11:
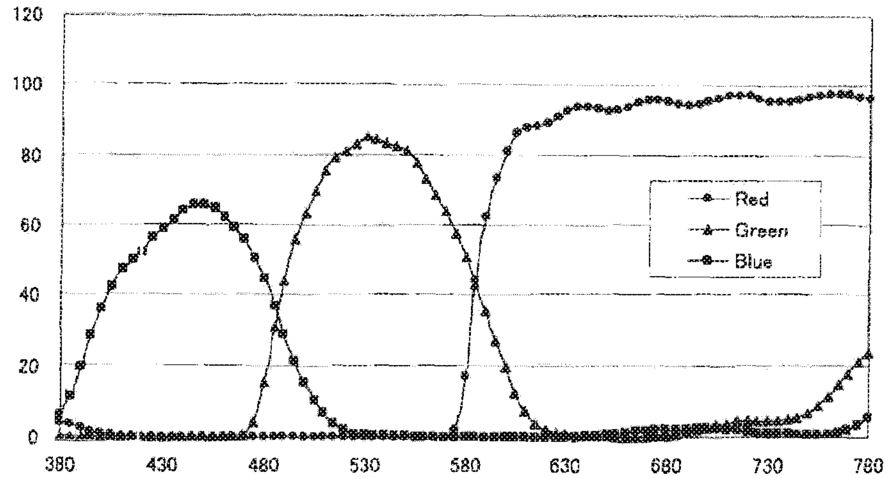
FIG. 11 is a transmittance spectrum of a color filter for Example I-2, 4, 6, 8 to 10 and Comparative Example I-3 or 4.

Color filters of Examples I-1 to 10 and Comparative Examples I-1 to 4 are prepared by combining the red, green and blue pixels shown in Tables 12 to 14. With respect to the respective color filters for Examples I-1, 3, 5 and 7, the transmittance spectrum of each of the red pixel sample, the green pixel sample and the blue pixel sample was calculated, and the results are shown in FIG. 10. With respect to the respective color filters for Examples I-2, 4, 6, 8 to 10 and Comparative Examples I-3 and 4, the transmittance spectrum of each of the red pixel sample, the green pixel sample and the blue pixel sample was calculated, and the results are shown in FIG. 11.

(6) Color Image Display Devices (6-1) Examples I-1 to 10 and Comparative Examples I-1 to 4

Color image display devices of Examples I-1 to 10 and Comparative Examples I-1 to 4 were prepared by combining the backlights (BL-1 to BL-9) shown in Production Examples I-1 to 9 and color filters for Examples I-1 to 10 and Comparative Examples I-1 to 4. With respect to these color image display devices, the chromaticity (x, y, Y) was measured, and also the color reproducibility (NTSC ratio) and the brightness (color temperature) were obtained. Here, the value Y corresponds to the use efficiency of light emitted from the backlight. The results are shown in Tables 15(a) and 15(b).

TABLE 15(a)

| | | Phosphor | | | | | | | | | |
|---|---|---|---|---|---|---|---|---|---|---|---|
| | | BSON + KTF | | β-SiAlON + KTF | | BSON + $BaTiF_6$ | | B-SiAlON + $BaTiF_6$ | | Yellow phosphor | |
| | | Backlight | | | | | | | | | |
| | | | | | | | | | | BL-5 | |
| | | BL-1 | | BL-2 | | BL-3 | | BL-4 | | Comp. | Comp. |
| | Color filter | Ex. I-1 | Ex. I-2 | Ex. I-3 | Ex. I-4 | Ex. I-5 | Ex. I-6 | Ex. I-7 | Ex. I-8 | Ex. I-1 | Ex. I-2 |
| Red | x | 0.679 | 0.682 | 0.675 | 0.679 | 0.680 | 0.684 | 0.676 | 0.680 | 0.645 | 0.660 |
| | y | 0.320 | 0.317 | 0.324 | 0.321 | 0.318 | 0.316 | 0.323 | 0.320 | 0.330 | 0.330 |
| | Y | 25.4 | 24.3 | 22.9 | 21.7 | 26.1 | 24.9 | 23.3 | 22.1 | 16.00 | 14.30 |
| Green | x | 0.262 | 0.260 | 0.289 | 0.287 | 0.261 | 0.259 | 0.289 | 0.287 | 0.275 | 0.250 |
| | y | 0.658 | 0.661 | 0.658 | 0.661 | 0.658 | 0.661 | 0.658 | 0.661 | 0.600 | 0.650 |
| | Y | 54.1 | 53.3 | 56.6 | 55.7 | 53.5 | 52.7 | 56.1 | 55.3 | 42.10 | 30.20 |
| Blue | x | 0.150 | 0.144 | 0.152 | 0.145 | 0.150 | 0.144 | 0.152 | 0.145 | 0.150 | 0.140 |
| | y | 0.073 | 0.044 | 0.065 | 0.039 | 0.072 | 0.044 | 0.064 | 0.039 | 0.060 | 0.080 |
| | Y | 10.4 | 4.8 | 9.0 | 4.2 | 10.4 | 4.8 | 9.1 | 4.2 | 5.10 | 5.80 |
| White | x | 0.318 | 0.333 | 0.317 | 0.330 | 0.321 | 0.336 | 0.318 | 0.332 | 0.311 | 0.310 |
| | y | 0.295 | 0.309 | 0.299 | 0.314 | 0.293 | 0.307 | 0.296 | 0.312 | 0.310 | 0.310 |
| | Y | 30.0 | 27.4 | 29.5 | 27.2 | 30.0 | 27.5 | 29.5 | 27.2 | 21.1 | 16.8 |
| Color temperature (K) | | 6454 | 5446 | 6522 | 5602 | 6269 | 5273 | 6458 | 5526 | 6781 | 6824 |
| NTSC ratio (%) | | 89.0 | 95.0 | 86.7 | 92.2 | 89.5 | 95.5 | 87.2 | 92.6 | 74 | 85 |

TABLE 15(b)

| | | Blue emitting phosphor | | | |
|---|---|---|---|---|---|
| | | SCA | SCA | SCA | SCA |
| | | Green emitting phosphor | | | |
| | | GBAM | GBAM | GBAM | GBAM |
| | | Red emitting phosphor | | | |
| | | KSF | CASN660 | KSF | CASN660 |
| | | Backlight | | | |
| | Color filter | BL-6 Ex. I-9 | BL-7 Comp. Ex. I-3 | BL-8 Ex. I-10 | BL-9 Comp. Ex. I-4 |
| Red | x | 0.70 | 0.687 | 0.694 | 0.688 |
| | y | 0.30 | 0.312 | 0.305 | 0.312 |
| | Y | 30.2 | 29.7 | 25.0 | 27.3 |
| Green | x | 0.170 | 0.210 | 0.162 | 0.204 |
| | y | 0.723 | 0.704 | 0.727 | 0.705 |
| | Y | 51.2 | 52.3 | 54.9 | 53.2 |
| Blue | x | 0.151 | 0.154 | 0.151 | 0.153 |
| | y | 0.042 | 0.038 | 0.039 | 0.036 |
| | Y | 3.9 | 3.5 | 4.7 | 4.4 |
| White | x | 0.361 | 0.363 | 0.314 | 0.329 |
| | y | 0.324 | 0.327 | 0.304 | 0.297 |
| | Y | 28.5 | 28.5 | 28.2 | 28.3 |
| Color temperature (K) | | 4236 | 4157 | 6649 | 5685 |
| NTSC ratio (%) | | 115.6 | 107 | 117 | 109 |

The value Y of white color in Tables 15(a) and 15(b) represents the light use efficiency of backlight as the entire color image display device. As shown in Tables 15(a) and 15(b), when a color image display device is designed to have a high color reproduction range with a NTSC ratio of 85% exceeding the EBU standard (NTSC ratio: 72%), a conventional backlight brings about a remarkable decrease of the value Y, while by using the technique of the present invention, a high level of the value Y can be accomplished. Namely, it becomes possible to obtain a higher luminance by a low power consumption.

Further, even a NTSC ratio exceeding Adobe-RGB (NTSC ratio: 94%) which was not accomplished by a conventional backlight, since the thickness of the color filter tended to be too thick (>10 μm), and the plate making property was not obtained, can be accomplished by using the technique of the present invention. Each of the coating films made of the compositions for the respective color filters prepared in the above Production Examples I-9 to 11 was exposed with 100 $mJ/cm^2$ by using a test pattern mask, followed by development, whereby it was confirmed that good patterns were obtained with respect to all samples. The film thickness after drying of the composition for each color filter actually prepared was 2.50 μm in each case.

Group II of Examples: $M^{I'}_2M^{IV'}$:R and Process for Producing Light Emitting Device Employing it Methods for Measuring Physical Property Values The physical property values of the phosphors obtained in the following Examples and Comparative Examples were measured and calculated by the following methods.

{Emission Characteristics}

<Emission Spectrum>

The emission spectrum was measured at room temperature (25° C.) by using a fluorometer (manufactured by JASCO Corporation) equipped with a 150 W xenon lamp as an excitation light source and a multichannel CCD detector C7041 (manufactured by Hamamatsu Photonics K.K.) as a spectrum-measuring apparatus.

More specifically, light from an excitation light source is passed through a diffraction grating spectroscope having a focal distance of 10 cm, so that a phosphor is irradiated with only excitation light with a wavelength of at most 455 nm via an optical fiber. Light generated from the phosphor under irradiation with the excitation light was spectroscopically separated by a diffraction grating spectroscope having a focal distance of 25 cm, and emission peak intensities of the respective wavelengths were measured by a spectrum-measuring apparatus within a wavelength range of from 300 nm to 800 nm, and an emission spectrum was obtained via signal treatment such as sensitivity correction by a personal computer. During the measurement, the slid width of the light-receiving side spectroscope was set to be 1 nm for the measurement.

<Luminance>

The relative luminance was calculated from the stimulus value Y in an XYZ color system calculated in accordance with JIS 28724 within a range having the excitation wavelength region removed from the emission spectrum in the visible region obtained by the above-described method, as a relative value (hereinafter sometimes referred to simply as "luminance") to 100% being the stimulus value Y obtained in the same manner within a range having the excitation wavelength removed from the emission spectrum obtained by exciting yellow-emitting phosphor $V_3Al_5O_{12}$:Ce (product number: P46-Y3) manufactured by Kasei Optonix, Ltd. with excitation light with a wavelength of 455 nm in the same manner.

<Excitation Spectrum>

The excitation spectrum was measured at room temperature (25° C.) by using Fluorescence spectrophotometer F-4500 manufactured by Hitachi, Ltd. More specifically, the red color emission peak at 631 nm was monitored to obtain an excitation spectrum within a wavelength range of from 300 nm to 550 nm.

{Particle Size}

<Weight-Average Median Diameter $D_{50}$ and Particle Size Distribution>

The particle size distribution of a phosphor was measured by a laser diffraction/scattering type particle size distribution-measuring apparatus LA-300 manufactured by HORIBA, Ltd. Here, prior to the measurement, the phosphor was dispersed by using ethanol as a dispersion solvent, then the initial transmittance on the optical axis was adjusted to be about 90%, and the measurement was carried out by suppressing the influence by aggregation to the minimum while stirring the dispersion solvent by a magnet stirrer.

The weight-average median diameter $D_{50}$ was calculated as a particle diameter value when the integrated value of the particle size distribution (corresponding to the weight base particle size distribution curve) obtained as described above was 50%.

<Quantile Deviation (QD) of Particle Size Distribution>

The quantile deviation (QD) of the particle size distribution was calculated by using the following formula, where $D_{25}$ and $D_{75}$ are weight-average median diameters when the integrated value of the measured particle size distribution was 25% and 75%, respectively.

$$QD=|D_{75}-D_{25}|/|D_{75}+D_{25}|$$

{Shape of Phosphor Particles}

<Scanning Electron Microscopic (SEM) Photograph>

In order to observe the shape, etc. of the phosphor particles, a SEM photograph was taken at 1,000-fold magnification (Examples II-1-2 and II-1-9) or 5,000-fold magnification (Example II-1-1, Comparative Example II-1-1) by using SEM (S-3400N, manufactured by Hitachi, Ltd.) in each Example or Comparative Example.

<Specific Surface Area>

The measurement of the specific surface area was carried out by a nitrogen adsorption BET 1 point method by means of a fully automatic specific surface area-measuring apparatus (fluid process) AMS1000A, manufactured by Ohkura Riken Co., Ltd.

{Analysis of Chemical Composition}

<SEM-EDX Method>

In the chemical composition analysis of the concentration of Mn contained in a phosphor, the measurement was carried out by a SEM-EDX method by using SEM (S-3400N, manufactured by Hitachi, Ltd.) as a measuring apparatus and an energy dispersion X-ray analyzer (EDX) EX-250 x-act manufactured by HORIBA, Ltd. Specifically, in the scanning electron microscopic (SEM) measurement, a phosphor was irradiated with an electron beam at an accelerating voltage of 20 kV, and characteristic X-rays discharged from the respective elements contained in the phosphor were detected to carry out the elemental analysis.

{Quantum Efficiency}

<Absorption Efficiency $\alpha_q$, Internal Quantum Efficiency $\eta_i$ and External Quantum Efficiency $\eta_o$>

In order to determine the quantum efficiency (absorption efficiency $\alpha_q$, internal quantum efficiency and external quantum efficiency $\eta_o$), firstly, a phosphor sample to be measured (e.g. a phosphor powder or the like) was treated to make the surface sufficiently smooth and packed into a cell so that the measurement accuracy be maintained, and it was attached to a light-concentrating device such as an integrating sphere.

To the light-concentrating device, a Xe lamp was attached as an emission light source to excite the phosphor sample. Further, in order to bring the emission peak wavelength of the emission light source to be a single color light of 455 nm, adjustment was carried out by using a filter or a monochlometer (diffraction grating spectroscope).

The phosphor sample to be measured was irradiated with the light from the emission light source having the emission peak wavelength thus adjusted, whereby the spectrum including the emission (fluorescence) and reflected light was measured by a spectroscopic apparatus (MCPD7000, manufactured by Otsuka Electrics Co., Ltd.).

<Absorption Efficiency $\alpha_q$>

The absorption efficiency ok, was calculated as a value obtained by dividing the photon number $N_{abs}$ of the excitation light absorbed by the phosphor sample, by the total photon number N of the excitation light.

A specific calculation procedure is as follows.

Firstly, the latter total photon number N of the excitation light was determined as follows.

That is, a substance having a reflectance R of substantially 100% to the excitation light, e.g. a white reflector plate such as "Spectralon" (having a reflectance R of 98% to excitation light of 455 nm) manufactured by Labsphere, was attached, as an object to be measured, to the above-mentioned light-concentrating device in the same disposition as the phosphor sample, and the reflection spectrum was measured (this reflection spectrum is hereinafter referred to as "$I_{ref}(\lambda)$") by means of the spectrophotometer.

From this reflection spectrum $I_{ref}(\lambda)$, a numerical value represented by the following formula I was obtained. Here, the integral interval of the following formula I was set to be from 435 nm to 465 nm. The numerical value represented by the following formula I is proportional to the total photon number N of the excitation light.

$$\frac{1}{R}\int \lambda \cdot I_{ref}(\lambda)d\lambda \quad \text{Formula I}$$

Further, from the reflection spectrum I(λ) when the phosphor sample as an object having an absorption efficiency $\alpha_q$ to be measured was attached to the light-concentrating device, a numerical value represented by the following formula II was determined. Here, the integral interval of the formula II was set to be the same as the integral interval set for the above formula I. The numerical value obtained by the following formula II is proportional to the photon number $N_{abs}$ of the excitation light absorbed by the phosphor sample.

$$\frac{1}{R}\int \lambda \cdot I_{ref}(\lambda)d\lambda - \int \lambda \cdot I(\lambda)d\lambda \quad \text{Formula II}$$

From the foregoing, the absorption efficiency $\alpha_q$ was calculated by the following formula.

$$\text{absorption efficiency } \alpha_q = N_{abs}/N = \text{Formula II/Formula I}$$

<Internal Quantum Efficiency $\eta_i$>

The internal quantum efficiency $\eta_i$ was calculated as the value obtained by dividing the photon number $N_{PL}$ derived from the fluorescence phenomenon, by the photon number $N_{abs}$ of light absorbed by the phosphor sample.

From the above I(λ), a numerical value represented by the following formula III was obtained. Here, the lower limit for the integral interval of the formula III was set to be from 466 nm to 780 nm. The numerical value obtainable by the following formula III is proportional to the photon number $N_{PL}$ derived from the fluorescence phenomenon.

$$\int \lambda \cdot I(\lambda) d\lambda \qquad \text{Formula III}$$

From the foregoing, the internal quantum efficiency $\eta_i$ was calculated by the following formula.

$$\eta_i = \text{Formula III/Formula II}$$

<External Quantum Efficiency $\eta_o$>

The external quantum efficiency $\eta_o$ was calculated as a product of the absorption efficiency $\alpha_q$ and the internal quantum efficiency $\eta_i$ obtained by the above procedure.

{Powder X-Ray Diffraction Measurement for Common Identification}

The powder X-ray diffraction was precisely measured by a powder X-ray diffraction apparatus X'Pert manufactured by PANalytical. The measurement conditions are as follows.

CuKα tube used

X-ray output=45 kV, 40 mA

Divergence slit=automatic, irradiation width: 10 mm×10 mm

Detector=semiconductor array detector X'Celerator used, Cu filter used

Scanning range 2θ=10 to 65°

Read width=0.0167°

Measuring time=10 sec.

Raw Materials Used

The raw materials used in the following Examples and Comparative Examples are shown in the following Table 16.

TABLE 16

| Name of raw material | Chemical formula | Purity (wt %) | Manufacturer | Notes |
|---|---|---|---|---|
| Potassium hexafluorosilicate | $K_2SiF_6$ | 99.9 | Morita Chemical Industries Co., Ltd. | |
| Potassium hexafluoromanganate (IV) | $K_2MnF_6$ | — | — | Prepared by the method disclosed in the following Preparation Example II-1 |
| Hydrofluoric acid | HF | 47.3 | Kanto Chemical Co., Inc. | |
| Potassium hydrogen fluoride | $KHF_2$ | 99 | Wako Pure Chemical Industries, Ltd. | |
| Hexafluorosilicic acid | $H_2SiF_6$ | 33 | Kanto Chemical Co., Inc. | |
| Acetone | $CH_3COCH_3$ | 99.5 | Junsei Chemical Co., Ltd. | |
| Ethanol | $C_2H_5OH$ | 99.5 | Junsei Chemical Co., Ltd. | |
| Acetic acid | $CH_3COOH$ | 99.9 | Kanto Chemical Co., Inc. | |

Preparation of $K_2MnF_6$

Preparation Example II-1

$K_2MnF_6$ can be obtained by the following reaction formula.

$$2KMnO_4 + 2KF + 10HF + 3H_2O_2 \longrightarrow 2K_2MnF_6\downarrow + 8H_2O + 3O_2$$

That is, KF powder or $KHF_2$ powder was dissolved in hydrofluoric acid (47.3 wt %) and then $KMnO_1$ powder was put into this solution and dissolved. While stirring the solution, an aqueous hydrogen peroxide solution was dropwise added, whereby a yellow precipitate was obtained when the molar ratio of $KMnO_4$ to $H_2O_2$ became 1.5. The precipitate was washed with acetone and dried at 130° C. for one hour to obtain $K_2MnF_6$. In the following Examples and Comparative Examples, $K_2MnF_6$ prepared as described above, was used.

Examples and Comparative Examples for Preparation of Phosphor ($K_2MnF_6$:Mn)

Example II-1-1

So that the feedstock composition for a phosphor would be $K_2Si_{0.9}Mn_{0.1}F_6$, as raw material compounds, $K_2SiF_6$ (1.7783 g) and $K_2MnF_6$ (0.2217 g) were added and dissolved in 70 ml of hydrofluoric acid (47.3 wt %) with stirring under atmospheric pressure at room temperature. After the respective raw material compounds were all dissolved, 70 ml of acetone was added at a rate of 240 ml/hr while stirring the solution to precipitate the solution in the poor solvent. The obtained phosphor was washed with ethanol and dried at 130° C. for one hour to obtain 1.7 g of a phosphor.

Figure 12:
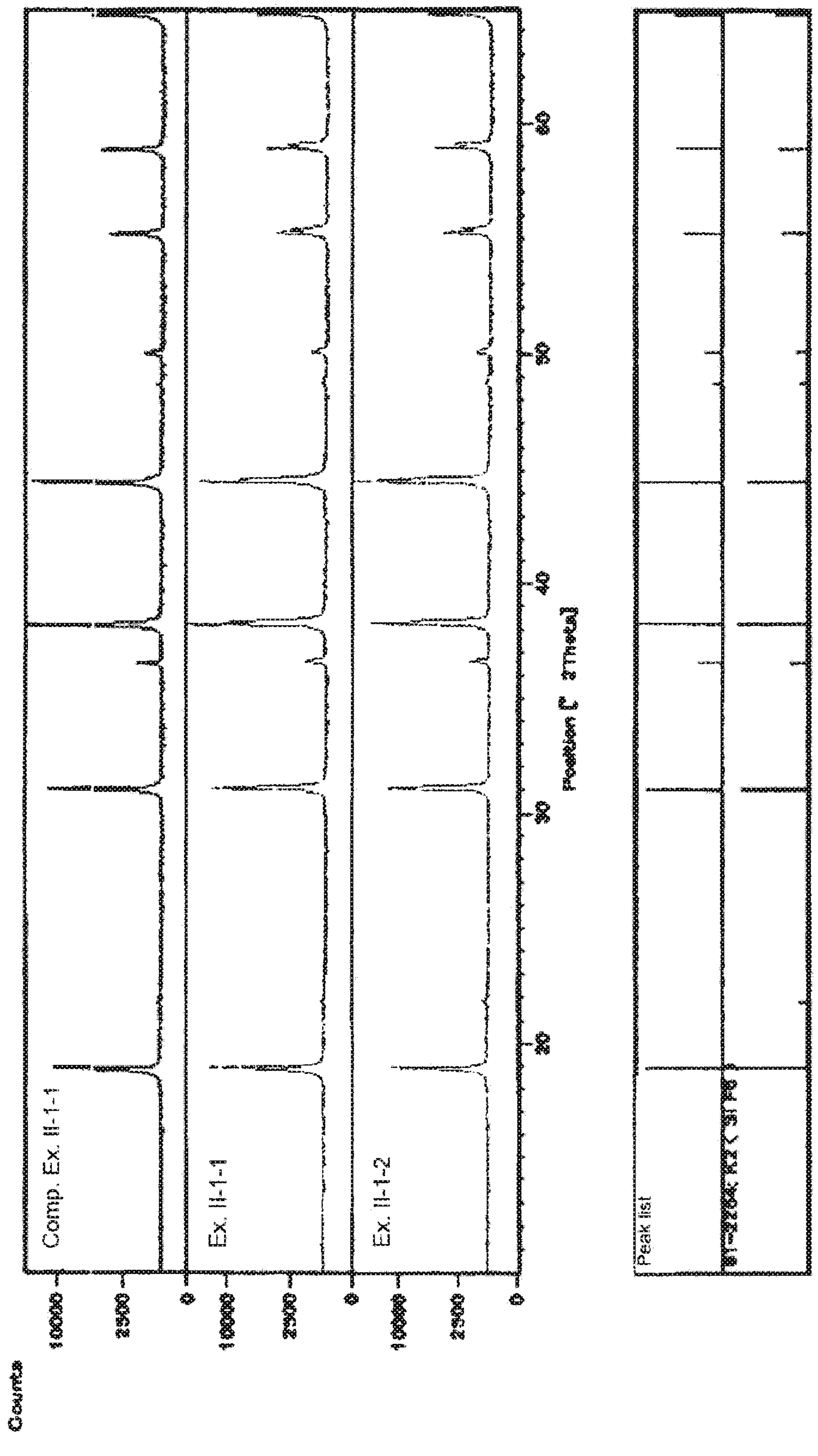
FIG. 12 is charts showing X-ray powder diffraction patterns of phosphors obtained in Examples II-1-1 and II-1-2 and Comparative Example II-1-1.

From the X-ray diffraction pattern of the obtained phosphor, it was confirmed that $K_2SiF_6$:Mn was prepared. The X-ray diffraction pattern of this $K_2SiF_6$:Mn is shown in FIG. 12.

Figure 13:
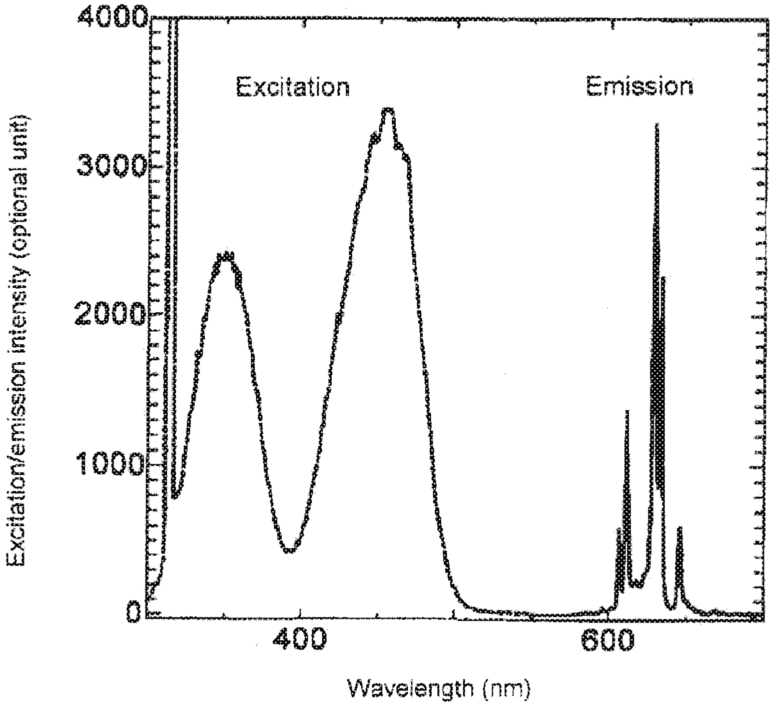
FIG. 13 is a chart showing an excitation/emission spectrum of a phosphor obtained in Example II-1-1.

Further, the excitation spectrum and the emission spectrum of the obtained phosphor are shown in FIG. 13. From the excitation spectrum, it is evident that the excitation is within a range of from 450 to 460 nm, and the excitation light from the blue emitting LED chip can efficiently be absorbed. Further, the emission peak of the phosphor obtained in this Example has the main emission peak wavelength at 631 nm and shows a narrow band red color with a half-value width of 6 nm, and it can be said that it shows fluorescent characteristics suitable for the purpose of the present invention.

Example II-1-2

4.9367 g of $KHF_2$ and 0.8678 g of $K_2MnF_6$ were weighed and dissolved in 20 ml of hydrofluoric acid (47.3 wt %). With stirring at 26'C, this solution was added to a solution mixture of 10 ml of a 33 wt % $H_2SiF_6$ aqueous solution and 10 ml of hydrofluoric acid (47.3 wt %) to let yellow crystals precipitate. The obtained crystals were subjected to filtration with filter paper No. 5C, then washed four times with 100 ml of ethanol and dried at 130° C. for one hour to obtain 6.2 g of a phosphor.

From the X-ray diffraction pattern of the obtained phosphor, it was confirmed that $K_2MnF_6$:Mn was prepared. The X-ray diffraction of this $K_2MnF_6$:Mn is shown in FIG. 12.

Example II-1-9

4.9367 g of $KHF_2$ was weighed and dissolved in 10 ml hydrofluoric acid (47.3 wt %).

On the other hand, 0.8678 g of $K_2MnF_6$ was weighed, and it was added and dissolved in a solvent mixture of 10 ml of a 33 wt % $H_2SiF_6$ aqueous solution and 40 ml of hydrofluoric acid (47.3 wt %) to prepare a solution. While stirring this solution at 26'C, the above hydrofluoric acid having $KHF_2$ dissolved, was added to this solution to let yellow crystals precipitate. The obtained crystals were subjected to filtration with filter paper No. 5C, then washed four times with 100 ml of ethanol and dried at 150° C. for two hour to obtain 5.9 g of a phosphor.

Comparative Example II-1-1

A phosphor was obtained in the same manner as in Example II-1-1 except that acetone as the poor solvent was added all at once.

From the X-ray diffraction pattern of the obtained phosphor, it was confirmed that $K_2SiF_6$:Mn was prepared. The X-ray diffraction pattern of this $K_2SiF_6$:Mn is shown in FIG. 12.

Comparison of Phosphors Obtained in Examples II-1-1, II-1-2 and II-1-9 and Comparative Example II-1-1

With respect to the phosphors obtained in Examples II-1-1, II-1-2 and II-1-9 and Comparative Example II-1-1, the Mn concentration ("analyzed Mn concentration (mol %)" in Table 17, the same applies hereinafter) obtained as a result of the composition analysis by SEM-EDX and the luminance (relative value to 100 of P46Y3), absorption efficiency, internal quantum efficiency and external quantum efficiency, determined from the emission spectrum obtained by excitation with light having a wavelength of 455 nm, are shown in Table 17.

Further, the results of the specific surface area measurement and the weight-average median diameter $D_{50}$ and the quantile deviation (QD) of the particle size distribution, obtained by the measurement of the particle size distribution are shown in Table 18.

Figure 14A:
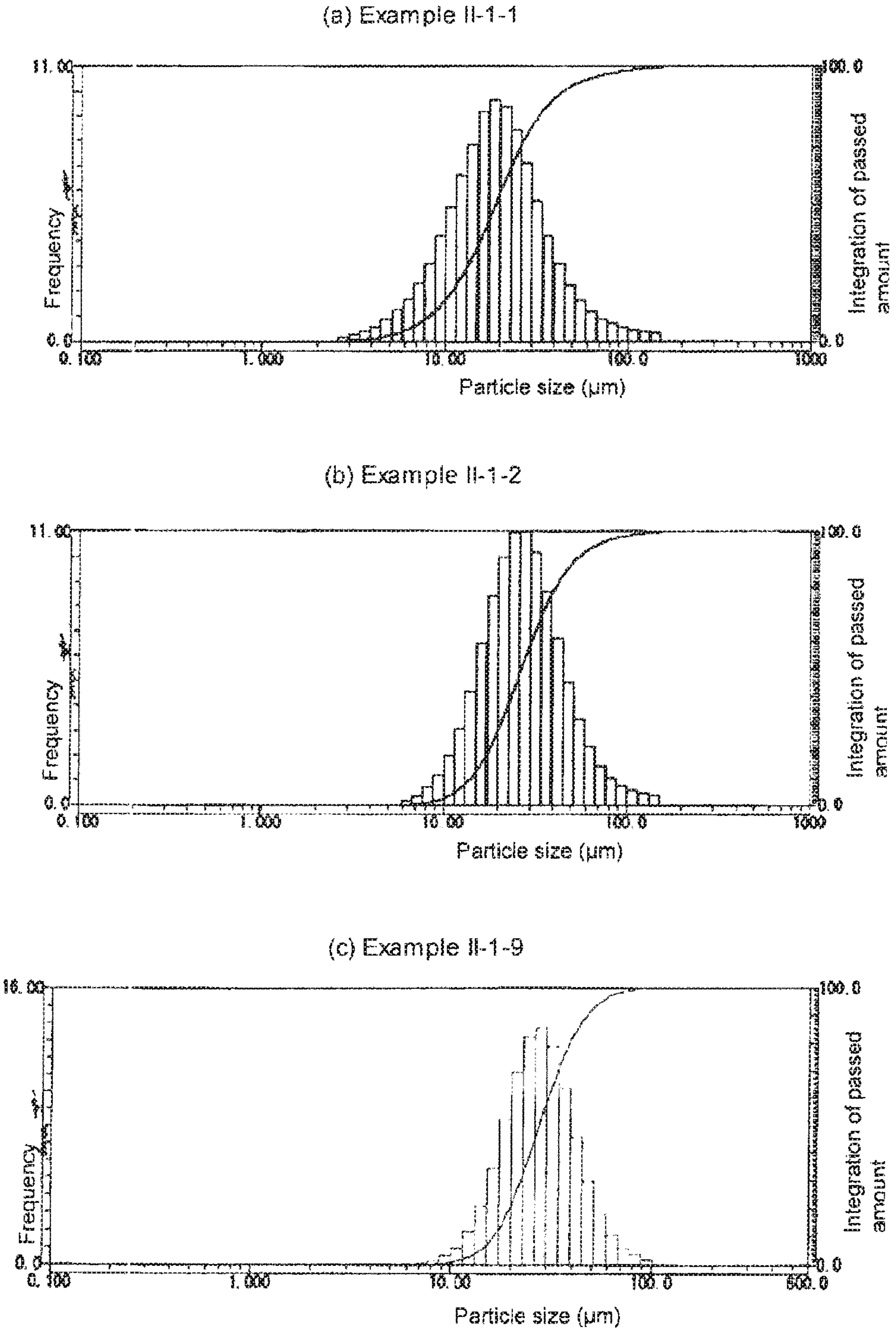
FIG. 14A is charts showing the particle size distribution curves of phosphors obtained in Examples II-1-1(a) and II-1-2(b) and II-1-9(c).
Figure 14B:
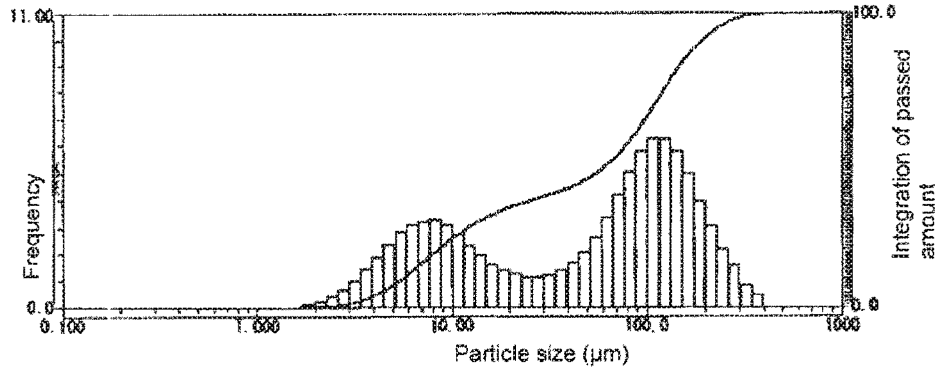
FIG. 14B is a chart showing the particle size distribution curve of a phosphor obtained in Comparative Example II-1-1.
Figure 15A:
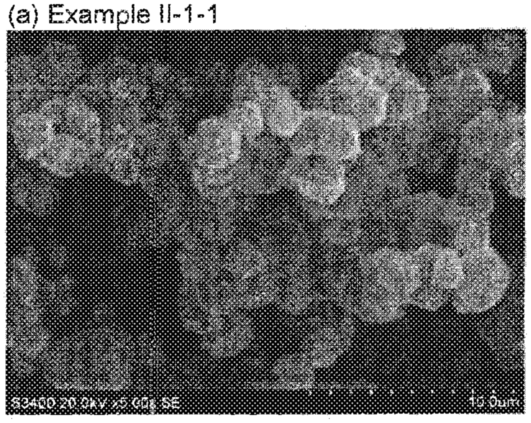
FIG. 15A is SEM photographs of phosphors obtained in Examples II-1-1(a), II-1-2(b) and II-1-9(c).
Figure 15A:
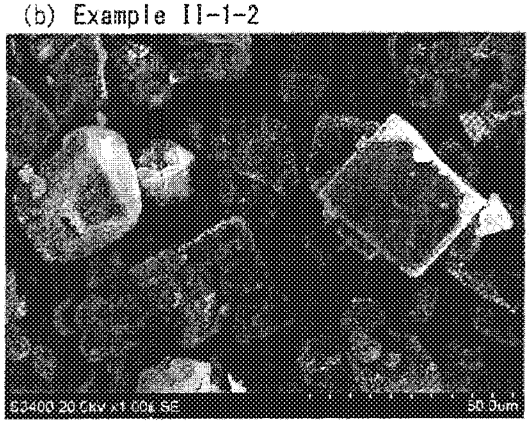
Figure 15A:
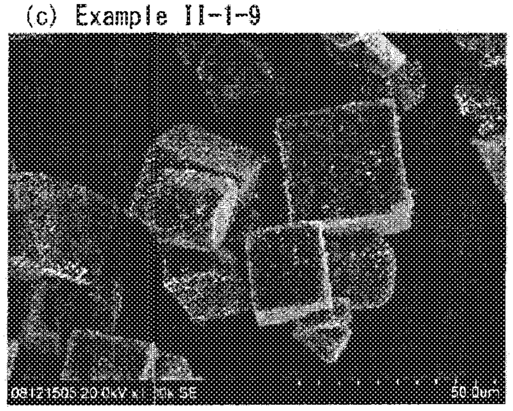
Figure 15B:
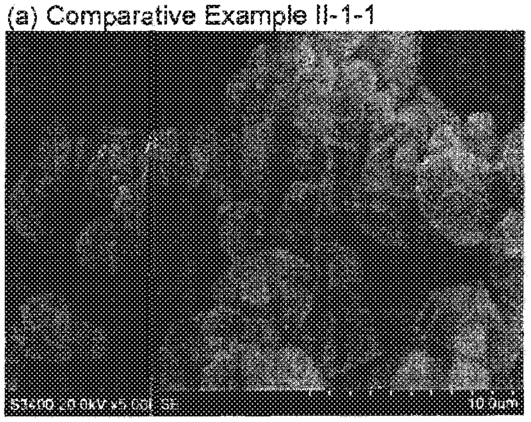
FIG. 15B is a SEM photograph of a phosphor obtained in Comparative Example II-1-1.

Further, the particle size distribution curves are shown in FIGS. 14A and 14B, and the SEM photographs are shown in FIGS. 15A and 15B, respectively,

TABLE 17

| | Charged Mn concentration (mol %) | Analyzed Mn concentration (mol %) | Luminance | Absorption efficiency (%) | Internal quantum efficiency (%) | External quantum efficiency (%) |
|---|---|---|---|---|---|---|
| Ex. II-1-1 | 10 | 2.5 | 24.4 | 39.6 | 91.8 | 36.4 |
| Ex. II-1-2 | 10 | 3.1 | 26.7 | — | — | — |
| Ex. II-1-9 | 10 | 6.3 | 31 | 85 | 46.2 | 39.3 |
| Comp. Ex. II-1-1 | 10 | 4.2 | 20.4 | 40.2 | 71.5 | 28.7 |

TABLE 18

| | Specific surface area ($m^2$/g) | Median diameter ($D_{50}$) in Examples (μm) | Quantile deviation (QD) of particle size distribution |
|---|---|---|---|
| Ex. II-1-1 | 0.91 | 18.9 | 0.374 |
| Ex. II-1-2 | 0.37 | 26.8 | 0.323 |
| Ex. II-1-9 | 0.43 | 27.4 | 0.263 |
| Comp. Ex. II-1-1 | 1.56 | 8.8 | 0.843 |

From the above results, the following is evident.

In Example II-1-1, as a result of slowing down the precipitation rate by addition of a poor solvent as compared with Comparative Example II-1-1, the luminance became high despite the concentration of Mn as an activated element (analyzed Mn concentration in Table 17) became low. The reason is considered to be such that by controlling the precipitation rate, activation of Mn ions was uniformly carried out, whereby the internal quantum efficiency became high.

In addition, from the particle size distribution curves in FIGS. 14A and 14B, the phosphor in Comparative Example II-1-1 has a double distribution, and it is considered that small particles are aggregated, while the phosphor in Example II-1-1 has many particles larger than the phosphor in Comparative Example II-1-1 and has little small particles, and thus it is evident that there is no aggregation or no double distribution, and there is only one peak. This is evident also from the results of measurement of the specific surface area and the weight-average median diameter $D_{50}$.

It is considered that the particles having a small specific surface area as obtained in Example II-1-1 have improved durability, since their contact area with exterior becomes small. On the other hand, the phosphors obtained by the methods of Examples II-1-2 and II-1-9 are free from a double distribution in their particle size and free from small particles, as evident from their SEM photographs, particle size distribution curves, specific surface areas and weight-average median diameters $D_{50}$, and thus they are obtained in the form of large particles free from aggregation. It is considered that the absorption efficiency thereby became substantially high, as a result, the luminance also became high.

Further, with the phosphors obtained in Examples II-1-2 and II-1-9, from their shapes, angular hexagonal particles are substantially observed (FIG. 15A). Their specific surface areas are also substantially small as compared with the phosphors in Example II-1-1 and Comparative Example II-1-1, and it is considered that the durability is also improved as the contact area with exterior become small.

Examples II-1-3 to II-1-6

Phosphors were obtained in the same manner as in Example II-1-1 except that the concentration of charged Mn was changed as identified in Table 19. With respect to the obtained phosphors, the analyzed Mn concentrations, the luminance (relative value to 100 of P46Y3) obtained from the emission spectra obtained by excitation with light having a wavelength of 455 nm, the absorption efficiencies, the internal quantum efficiencies and the external quantum efficiencies, as well as the quantile deviations (QD) in their particle size distributions, are shown in Table 19 together with the results of Example II-1-1.

Examples II-1-7, II-1-8, II-1-10 to II-1-15

Phosphors were obtained in the same manner as in Example II-1-2 except that the concentration of charged Mn was changed as identified in Table 19.

With respect to the obtained phosphors, the analyzed Mn concentrations, the luminance (relative value to 100 of P46Y3) obtained from the emission spectra obtained by excitation with light having a wavelength of 455 nm, the absorption efficiencies, the internal quantum efficiencies and the external quantum efficiencies, as well as the quantile deviations (QD) in their particle size distributions, are shown in Table 19 together with the results of Example II-1-2 and II-1-9.

From Table 19, it is evident that in the preparation by (1) a poor solvent separation method as represented by Examples II-1-1, -3, -4, -5 and -6, it is preferred that the charged Mn concentration is at least 10 mol % and at most 15 mol %, and the concentration in crystals i.e. the analyzed Mn concentration is at least 2 mol % and at most 4 mol %. It is also evident that in the preparation by (2-1) a method of mixing a solution containing at least Si and F with a solution containing at least K, Mn and F as represented by Examples II-1-2, -7 and -8, it is preferred that the charged Mn concentration is at least 5 mol % and at most 15 mol %, and the concentration in crystals i.e. the analyzed Mn concentration is at least 3 mol % and at most 5 mol %. Further, it is evident that in the preparation by (2-2) a method of mixing a solution containing at least Si, Mn and F with a solution containing at least KF as represented by Examples II-1-9, -11, -12, -13, -14 and -15, it is preferred that the charged Mn concentration is at least 3 mol % and at most 10 mol %, and the concentration in crystals i.e. the analyzed Mn concentration is at least 2 mol % and at most 6 mol %.

Comparative Examples II-1-2 and II-1-3

A phosphor was obtained in the same manner as in Comparative Example II-1-1 except that instead of acetone as a poor solvent, ethanol (Comparative Example II-1-2) or acetic acid (Comparative Example II-1-3) was used.

The quantile deviation (QD) of the particle size distribution obtained with respect to the obtained phosphor is shown in Table 20 together with the results in Comparative Example II-1-1.

TABLE 20

| | Poor solvent | Quantile deviation (QD) of the particle size distribution |
|---|---|---|
| Comparative Example II-1-1 | Acetone | 0.843 |
| Comparative Example II-1-2 | Ethanol | 0.773 |
| Comparative Example II-1-3 | Acetic acid | 0.688 |

Examples and Comparative Examples for Semiconductor Light Emitting Device

Example II-2-1

Using a 350 μm square chip GU35R460T manufactured by Showa Denko K.K. as a blue emitting diode (hereinafter

TABLE 19

| | Charged Mn concentration (mol %) | Analyzed Mn concentration (mol %) | Luminance | Absorption efficiency (%) | Internal quantum efficiency (%) | External quantum efficiency (%) | Quantile deviation (QD) of particle size distribution |
|---|---|---|---|---|---|---|---|
| Ex. II-1-3 | 3 | 1.1 | 16.3 | 26 | 95 | 25 | — |
| Ex. II-1-4 | 5 | 1.1 | 20.8 | 31 | 100 | 31 | — |
| Ex. II-1-1 | 10 | 2.5 | 24.4 | 40 | 92 | 36 | 0.374 |
| Ex. II-1-5 | 15 | 3.3 | 27.7 | 46 | 87 | 40 | — |
| Ex. II-1-6 | 20 | 5.2 | 23.7 | 57 | 55 | 31 | — |
| Ex. II-1-7 | 5 | 3.0 | 23.5 | — | — | — | — |
| Ex. II-1-2 | 10 | 3.1 | 26.7 | — | — | — | 0.323 |
| Ex. II-1-8 | 15 | 4.8 | 23.9 | — | — | — | — |
| Ex. II-1-10 | 1 | 0.4 | 23 | 45.5 | 73.0 | 33.2 | 0.331 |
| Ex. II-1-11 | 3 | 2.0 | 32 | 65.8 | 68.7 | 45.2 | 0.292 |
| Ex. II-1-12 | 5 | 3.8 | 34 | 75.1 | 59.5 | 44.6 | 0.301 |
| Ex. II-1-13 | 7.5 | 4.5 | 33 | 83.5 | 50.2 | 41.9 | 0.278 |
| Ex. II-1-9 | 10 | 6.3 | 31 | 85.0 | 46.2 | 39.3 | 0.263 |
| Ex. II-1-14 | 15 | 11.4 | 30 | 83.6 | 43.7 | 36.5 | 0.223 |
| Ex. II-1-15 | 20 | 19.6 | 28 | 88.8 | 38.7 | 34.4 | 0.217 |

sometimes referred to as "LED") which emits light with a dominant emission wavelength of from 455 nm to 465 nm (the emission peak wavelength of from 451 nm to 455 nm) and with a half-value width of the emission peak of 22 to 28 nm, it was bonded to the terminals at the bottom of a concave portion of a 3528SMD type PPA resin package by a silicone resin base transparent die bond paste. Then, it was heated at 150° C. for two hours to cure the transparent die bond paste, and then the blue emitting LED and the electrodes of the package were wire-bonded by a gold metal having a diameter of 25 μm.

On the other hand, 0.051 g of a green emitting phosphor $Ba_{1.36}Sr_{0.49}Eu_{0.15}SiO_4$ (identified by "BSS" in Table 21) having an emission peak wavelength of 528 nm and an emission peak half-value width of 68 nm prepared in the after-mentioned Preparation Example II-2 for phosphor, 0.189 g of a red emitting phosphor (identified by "KSF" in Table 21) having an emission peak wavelength of 631 nm and an emission peak half-value width of 6 nm, prepared in Example II-1-1, 0.880 g of a silicone resin (JCR6101up) manufactured by Dow Corning Toray Silicone Co., Ltd. and 0.026 g of AEROSIL (RX200) manufactured by Nippon Aerosil Co., Ltd., were weighed and mixed by an agitation defoaming apparatus AR-100 manufactured by Thinky Corporation to obtain a phosphor-containing composition.

Then, 4 μl of the phosphor-containing composition thus obtained was injected into a concave portion of the above-mentioned SMD type resin package having the blue emitting LED mounted. Then, heating was carried out at 70° C. for one hour and then at 150° C. for 5 hours to cure the phosphor-containing composition thereby to obtain a semiconductor light emitting device.

Figure 16:
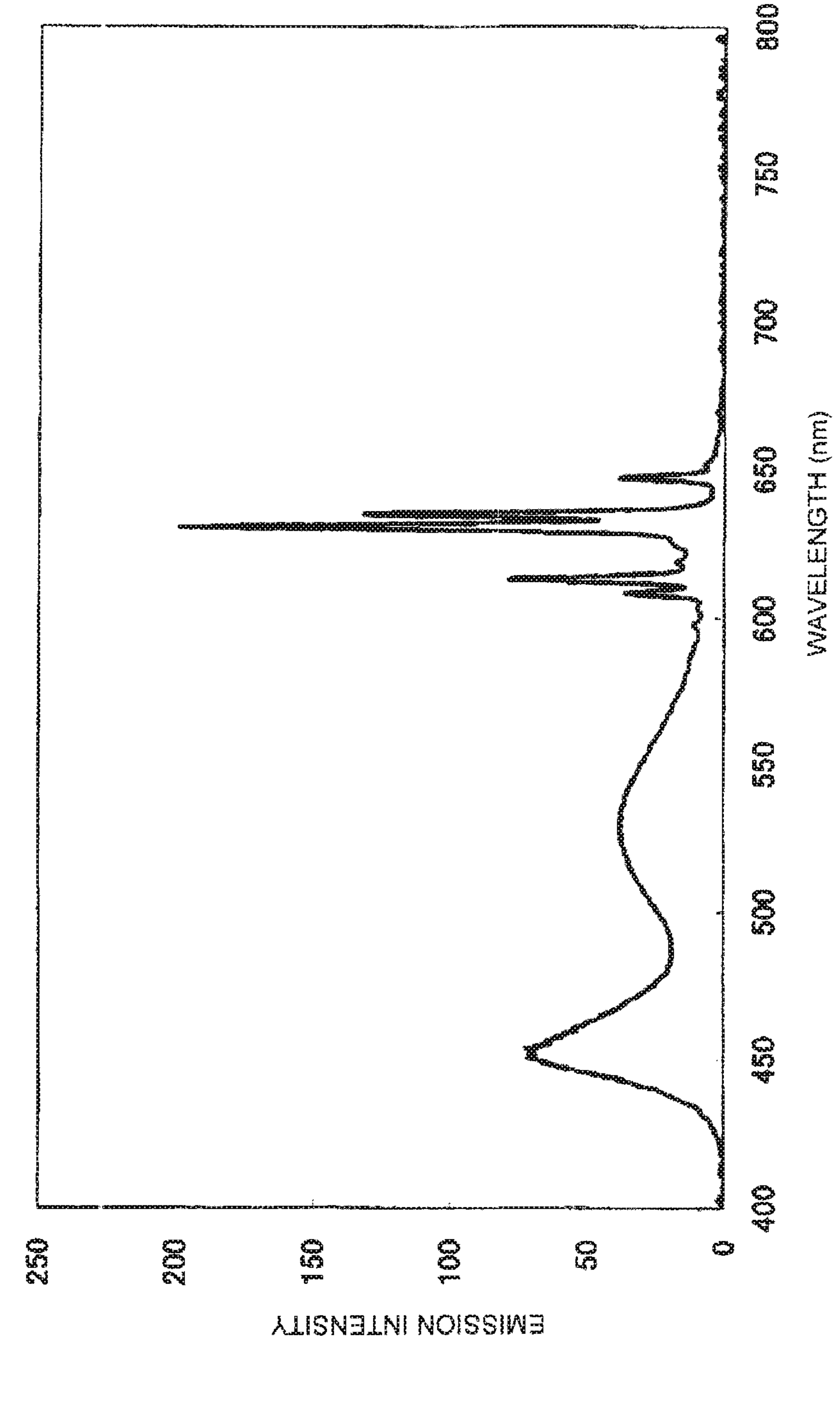
FIG. 16 is a chart showing an emission spectrum of a semiconductor light emitting device prepared in Example II-2-1.

A current of 20 mA was conducted to the blue emitting LED chip of the white color semiconductor light emitting device thus obtained to let it emit light. The CIE chromaticity coordinate values of the emission were measured, whereby x/y=0.319/0.327. The obtained emission spectrum is shown in FIG. 16. The white luminous flux from the semiconductor light emitting device to the light output from the blue emitting LED was 236 lumen/W.

Further, in a case where this semiconductor light emitting device is used as a liquid crystal backlight, with respect to a color image display device obtained by a combination of this with the optimized color filter obtained in Production Example II-1 given hereinafter, the chromaticity (x, y, Y) was found to be (0.321, 0.341, 27.3), and with respect to the color reproducibility (NTSC ratio) and the color tone (color temperature), they were found to be an NTSC ratio of 95 and a color temperature of 5999K. Here, value Y in the chromaticity (x, y, Y) corresponds to the use efficiency of the emission from the backlight.

Despite the same emission use efficiency, it was possible to obtain a higher NTSC ratio by using the semiconductor light emitting device in this Example obtained by using the red emitting phosphor of the present invention obtained in Example II-1-1 than the semiconductor light emitting device in the after-mentioned Comparative Example II-2-1 obtained by using known $CaAlSiN_3$:Eu.

Comparative Example II-2-1

A semiconductor light emitting device in Comparative Example II-2-1 was obtained by the same operation as in Example II-2-1 except that in the preparation of the semiconductor light emitting device in Example II-2-1, 0,060 g of a green emitting phosphor $Ba_{1.36}Sr_{0.49}Eu_{0.15}SiO_4$ (identified by "BSS" in Table 21), 0.010 g of a red emitting phosphor "BR-101A" ($CaAlSiN_3$:Eu, identified by "CASN" in Table 21) having an emission peak wavelength of 650 nm and an emission peak half-value width of 92 nm, manufactured by Mitsubishi Chemical Corporation, 0.618 g of a silicone resin (SCR1011) manufactured by Shin-Etsu Chemical Co., Ltd and 0.019 g of AEROSIL (RX200) manufactured by Nippon Aerosil Co., Ltd., were weighed.

Figure 17:
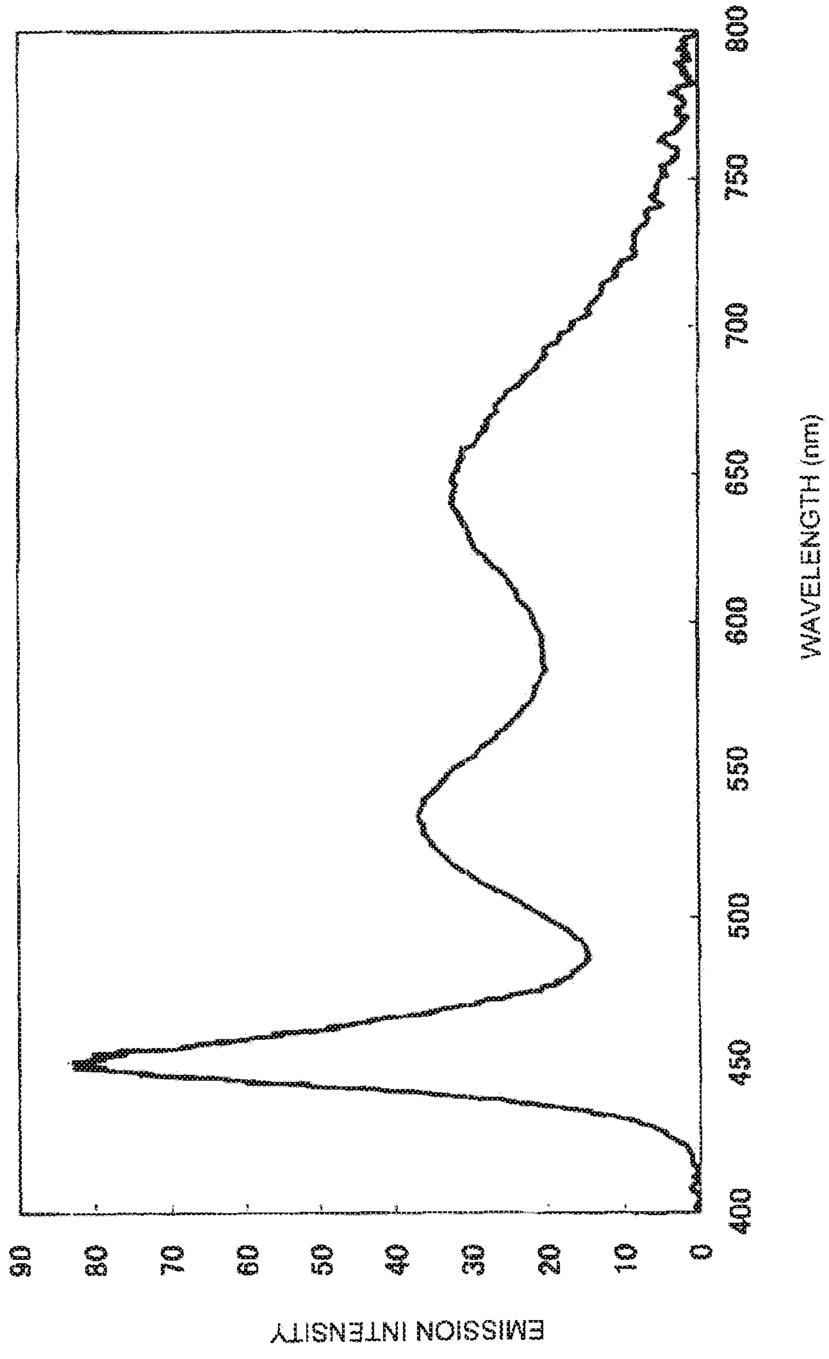
FIG. 17 is a chart showing an emission spectrum of a semiconductor light emitting device prepared in Comparative Example II-2-1.

A current of 20 mA was conducted to the blue emitting LED chip of the white color semiconductor light emitting device thus obtained to let it emit light. The CIE chromaticity coordinate values of the emission were measured, whereby x/y=0.312/0.319. The obtained emission spectrum is shown in FIG. 17. The white luminous flux from the semiconductor light emitting device to the light output from the blue emitting LED was 234 lumen/W.

Further, in a case where this semiconductor light emitting device is used as a liquid crystal backlight, with respect to a color image display device obtained by a combination of this with the optimized color filter obtained in Production Example II-1 given hereinafter, the chromaticity (x, y, Y) was found to be (0.330, 0.331, 27.3), and with respect to the color reproducibility (NTSC ratio) and the color tone (color temperature), they were found to be an NTSC ratio of 87 and a color temperature of 5611K.

Example II-2-2

Using a 290 μm square chip C395MB290 manufactured by Cree as a near ultraviolet emitting diode having a dominant emission wavelength of from 390 nm to 400 nm, it was bonded to the terminals at the bottom of a concave portion of a 3528SMD type PPA resin package by a silicone resin base transparent die bond paste. Then, it was heated at 150° C. for two hours to cure the transparent die bond paste, and then the near ultraviolet emitting LED and the electrodes of the package were wire-bonded by a gold metal having a diameter of 25 μm.

On the other hand, 0.038 g of $Sr_{10}(PO_4)_6Cl_2$:Eu (identified by "SCA" in Table 21) having an emission peak wavelength of 450 nm and an emission peak half-value width of 29 nm prepared in the above Preparation Example I-7 for phosphor, 0.083 g of $BaMgAl_{10}O_{17}$:Eu,Mn (identified by "GBAM" in Table 11-5) having an emission peak wavelength of 517 nm and an emission peak half-value width of 27 nm, prepared in the above Preparation Example I-6 for phosphor, 0.407 g of a red emitting phosphor (identified by "KSF" in Table 21) prepared in the above Example II-1-1 for phosphor and 0.634 g of a silicone resin (JCR6101up) manufactured by Dow Corning Toray Silicone Co., Ltd., were weighed and mixed by an agitation defoaming apparatus AR-100 manufactured by Thinky Corporation to obtain a phosphor-containing composition.

Then, 4 μl of the phosphor-containing composition thus obtained was injected into the concave portion of the above-mentioned SMD type resin package having the near ultraviolet emitting LED mounted. Then, heating was carried out at 70° C. for one hour and then at 150° C. for 5 hours to cure the phosphor-containing composition thereby to obtain a desired semiconductor light emitting device.

Figure 18:
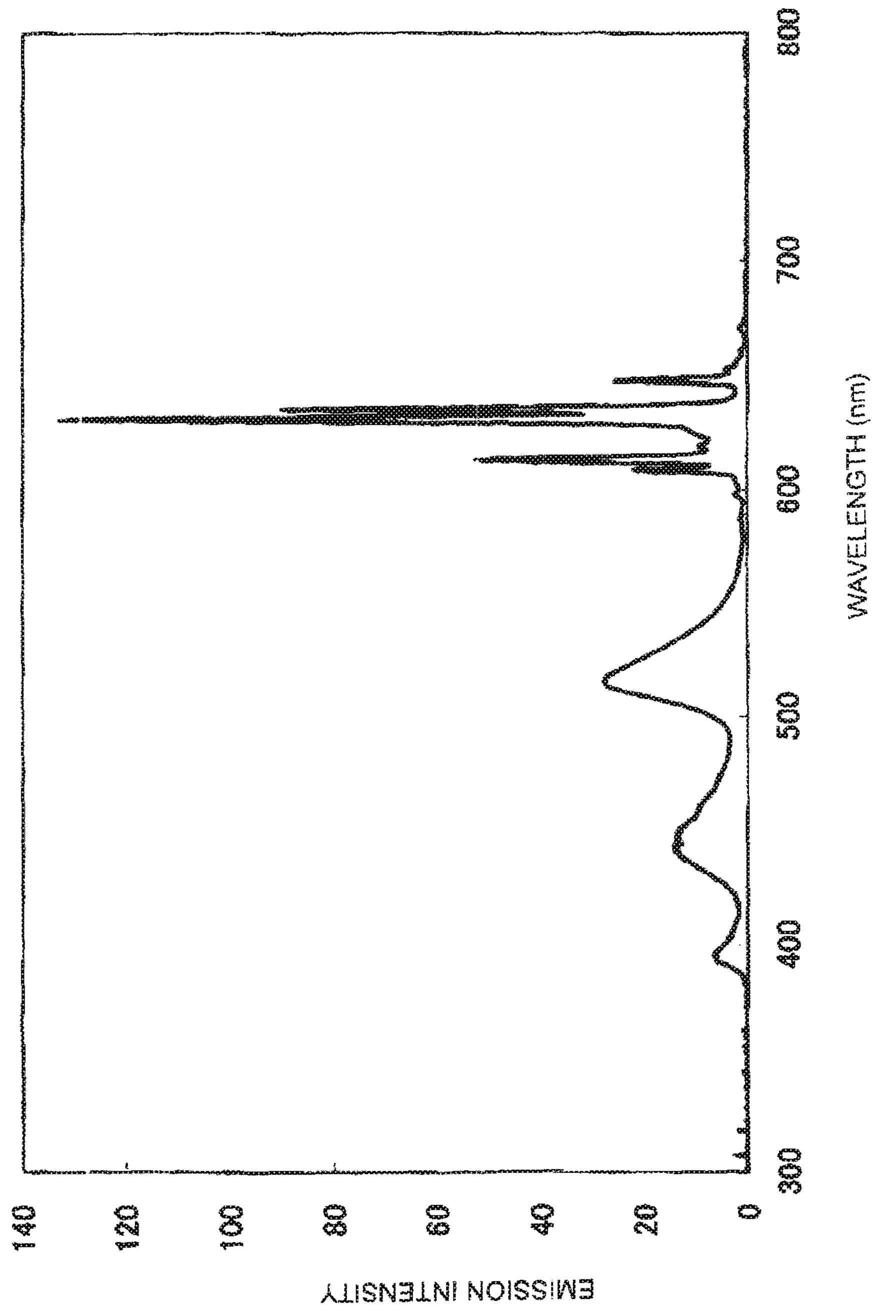
FIG. 18 is a chart showing an emission spectrum of a semiconductor light emitting device prepared in Example II-2-2.

A current of 20 mA was conducted to the near ultraviolet emitting LED of the white color semiconductor light emitting device thus obtained to drive and let it emit light. The CIE chromaticity coordinate values of the emission were measured, whereby x/y=0.339/0.339. The obtained emission spectrum is shown in FIG. 18. The white luminous flux from the semiconductor light emitting device to the light output from the near ultraviolet emitting LED was 230 lumen/W.

By the semiconductor light emitting device in this Example obtained by using the red emitting phosphor of the present invention obtained in Example II-1-1, it was possible to obtain a luminous flux per unit incident light energy remarkably higher than the semiconductor light emitting device in the after-mentioned Comparative Example II-2-2 obtained by using $CaAlSiN_3$:Eu having good color purity with an emission peak wavelength of 660 nm, although it was the semiconductor light emitting device having substantially the same chromaticity coordinate values.

Further, in a case where this semiconductor light emitting device is used as a liquid crystal backlight, with respect to a color image display device obtained by a combination of this with the optimized color filter obtained in Production Example 1 given hereinafter, the chromaticity (x, y, Y) was found to be (0.346, 0.374, 28.3), and with respect to the color reproducibility (NTSC ratio) and the color tone (color temperature), they were found to be an NTSC ratio of 116 and a color temperature of 5021K, respectively.

Despite substantially the same emission use efficiency, it was possible to obtain a distinctly higher NTSC ratio by using the semiconductor light emitting device in this Example obtained by using the red emitting phosphor obtained in Example II-1-1 than the semiconductor light emitting device in the after-mentioned Comparative Example II-2 obtained by using known $CaAlSiN_3$:Eu having good color purity and having an emission peak wavelength of 660 nm and an emission peak half-value width of 95 nm.

Example II-2-3 and Comparative Examples II-2-2 and II-2-3

Semiconductor light emitting devices of Example II-2-3 and Comparative Example II-2-2 and II-2-3 were obtained by the same operation as in Example II-2-2 except that in the preparation of the semiconductor light emitting device in Example II-2-2, the type and amount of the phosphor used and the amount of the silicone resin were changed as shown in Table 21. Here, in Example II-2-3 and Comparative Example II-2-3, as a blue emitting phosphor, $Ba_{0.7}Eu_{0.3}MgAl_{10}O_{17}$ (identified by "BAM" in Table 21) having an emission peak wavelength of 455 nm and an emission peak half-value width of 51 nm, prepared in the after-mentioned Preparation Example II-3 for phosphor, was used. Further, as the red emitting phosphor in Comparative Example II-2-2 and Comparative Example II-2-3, a red emitting phosphor "BR-101B" ($CaAlSiN_3$:Eu, identified by "CASN660" in Table 21) manufactured by Mitsubishi Chemical Corporation, having an emission peak wavelength of 660 nm, was used.

Figure 19:
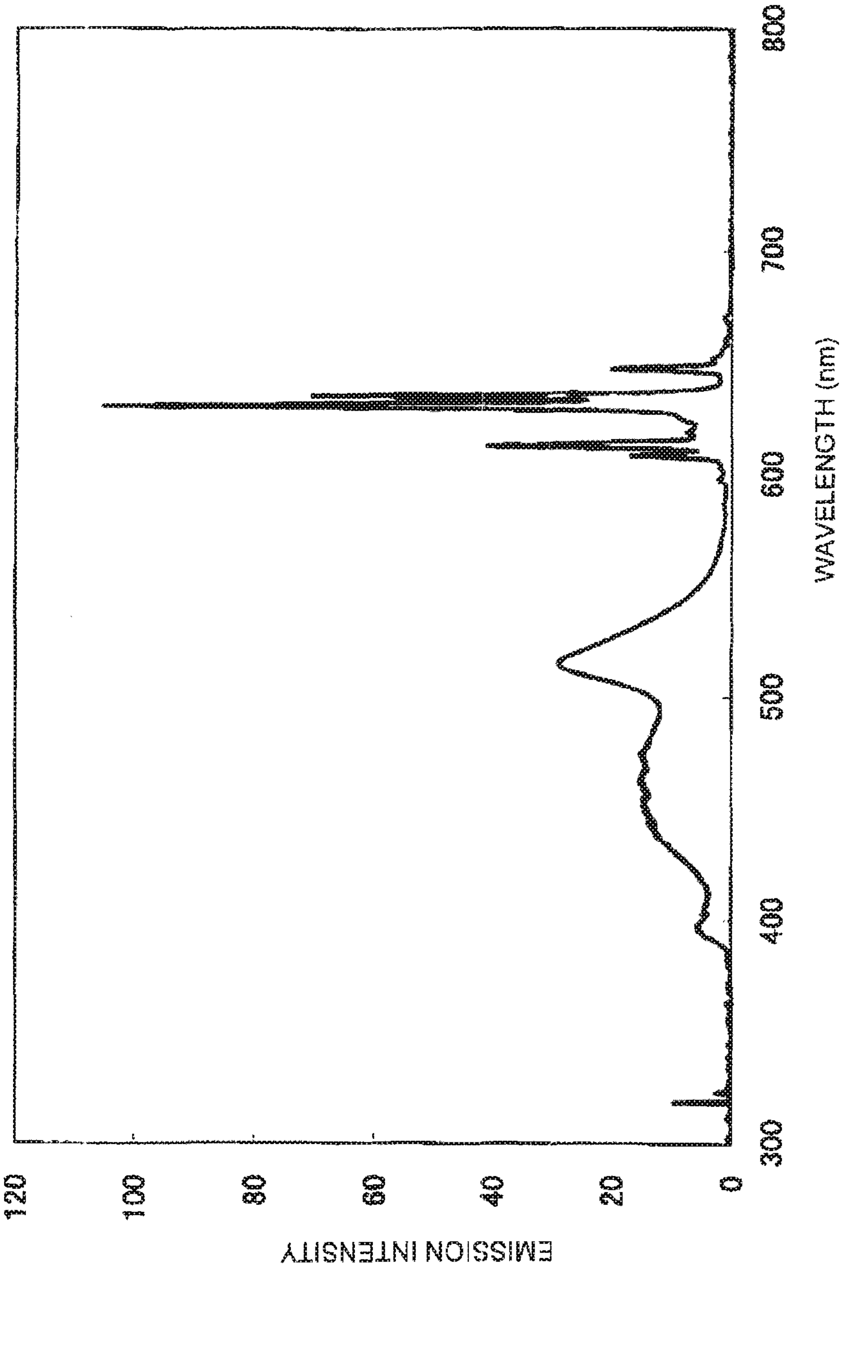
FIG. 19 is a chart showing an emission spectrum of a semiconductor light emitting device prepared in Example II-2-3.
Figure 20:
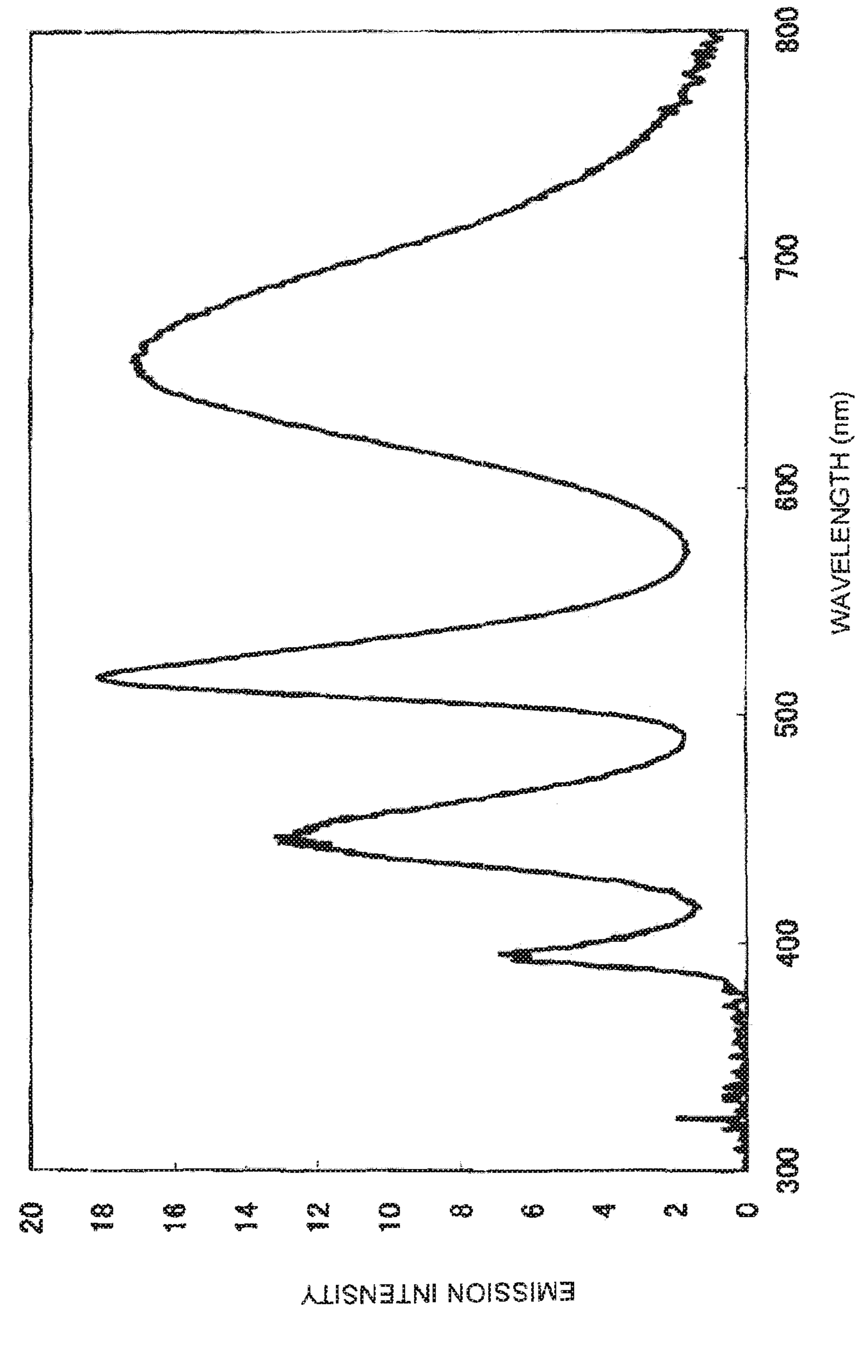
FIG. 20 is a chart showing an emission spectrum of a semiconductor light emitting device prepared in Comparative Example II-2-2.
Figure 21:
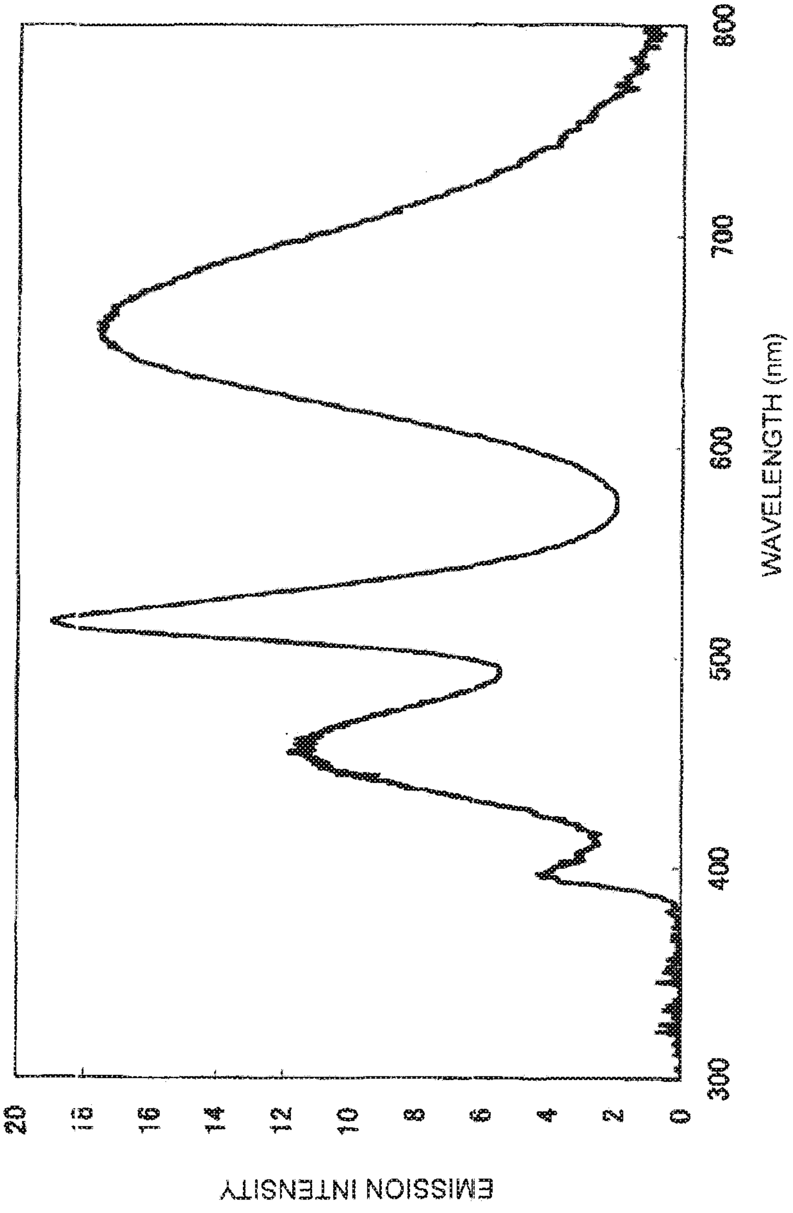
FIG. 21 is a chart showing an emission spectrum of a semiconductor light emitting device prepared in Comparative Example II-2-3.

A current of 20 mA was conducted to the ultraviolet emitting LED of the semiconductor light emitting device thus obtained to drive and let it emit light. The CIE chromaticity coordinate values of the emission were measured and found to have the numerical values as identified in Table 22. Further, the emission spectra of the semiconductor light emitting devices obtained in Example II-2-3, Comparative Example II-2-2 and Comparative Example II-2-3 are shown in FIGS. 19, 20 and 21, respectively.

Further, in a case where such a semiconductor light emitting device is used as a liquid crystal backlight, with respect to a color image display device obtained by a combination of this with the optimized color filter obtained in Preparation Example II-1 given hereinafter, the chromaticity (x, y, Y), the color reproducibility (NTSC ratio) and the color tone (color temperature), were calculated and shown in Table 22.

TABLE 21

|  |  | Types of phosphors | | | Blend amounts (g) | | | | |
| --- | --- | --- | --- | --- | --- | --- | --- | --- | --- |
|  | Type of LED | Blue emitting phosphor | Green emitting phosphor | Red emitting phosphor | Silicone resin | AEROSIL | Blue emitting phosphor | Green emitting phosphor | Red emitting phosphor |
| Example II-2-1 | Blue emitting LED | — | BSS | KSF | 0.880 | 0.026 | — | 0.051 | 0.189 |
| Comparative Example II-2-1 | | — | BSS | CASN | 0.618 | 0.019 | — | 0.060 | 0.010 |
| Example II-2-2 | Near ultraviolet emitting LED | SCA | GBAM | KSF | 0.634 | — | 0.038 | 0.083 | 0.407 |
| Comparative Example II-2-2 | | SCA | GBAM | CASN660 | 0.610 | — | 0.025 | 0.082 | 0.008 |
| Example II-2-3 | | BAM | GBAM | KSF | 1.083 | — | 0.135 | 0.096 | 0.331 |
| Comparative Example II-2-3 | | BAM | GBAM | CASN660 | 1.274 | — | 0.124 | 0.119 | 0.013 |

TABLE 22

|  | Emission characteristics of semiconductor light emitting device | | | Emission characteristics of color image display device | | | | |
| --- | --- | --- | --- | --- | --- | --- | --- | --- |
|  | x | y | Lumen/W | x | y | Y (%) | NTSC ratio (%) | Color temperature (K) |
| Example II-2-1 | 0.319 | 0.327 | 236 | 0.321 | 0.341 | 27.3 | 95 | 5999 |
| Comparative Example II-2-1 | 0.312 | 0.319 | 234 | 0.330 | 0.331 | 27.3 | 87 | 5611 |
| Example II-2-2 | 0.339 | 0.339 | 230 | 0.346 | 0.374 | 28.3 | 116 | 5021 |
| Comparative Example II-2-2 | 0.329 | 0.318 | 174 | 0.371 | 0.364 | 28.4 | 108 | 4168 |
| Example II-2-3 | 0.277 | 0.315 | 227 | 0.311 | 0.347 | 27.9 | 110 | 6493 |
| Comparative Example II-2-3 | 0.315 | 0.316 | 176 | 0.351 | 0.348 | 28.2 | 104 | 4744 |

Methods for Preparation of Phosphors

The phosphors used in the above Examples II-2-1 to II-2-3 and Comparative Examples II-2-1 to II-2-3 were prepared as follows.

Preparation Example II-2

As phosphor raw materials, powders of barium carbonate ($BaCO_3$), strontium carbonate ($SrCO_3$), europium oxide ($Eu_2O_3$) and silicon dioxide ($SiO_2$) were used. Each of these phosphor raw materials had a purity of at least 99.9%, a weight average median diameter $D_{50}$ of at least 0.01 μm and at most 5 μm.

These phosphor raw materials were weighed so that the composition of a phosphor to be obtained would be $Ba_{1.36}Sr_{0.49}Eu_{0.15}SiO_4$.

Such phosphor raw material powders were mixed by an automatic mortar until the mixture became sufficiently uniform, and the mixture was filled in an alumina crucible and fired at 1,000° C. for 12 hours under atmospheric pressure in a nitrogen atmosphere.

Then, the content of the crucible was taken out, and as flux, 0.1 mol of $SrCl_2$ and 0.1 mol of CsCl were added per mol of the phosphor, followed by mixing and pulverization by a dry system ball mill.

The obtained mixed pulverized product was again filled in an alumina crucible, and solid carbon (in block form) was placed thereon, and an alumina cover was placed. In a vacuum furnace, pressure was reduced to 2 Pa by a vacuum pump, and then a hydrogen-containing nitrogen gas (nitrogen:hydrogen=96:4 (volume ratio)) was introduced to atmospheric pressure. This operation was repeated again, and then heating was carried out at 1,200° C. for 4 hours under atmospheric pressure while circulating the hydrogen-containing nitrogen gas (nitrogen:hydrogen=96:4 (volume ratio)) to carry out firing.

The obtained fired product was pulverized by a ball mill, followed by sieving in the form of slurry to remove coarse particles, followed by washing with water and levigation to remove fine particles and then by drying and sieving to disintegrate aggregated particles thereby to obtain a phosphor (BSS).

The obtained green emitting phosphor (BSS) had an emission peak wavelength of 528 nm and an emission peak half-value width of 68 nm.

Preparation Example II-3

As phosphor raw materials, 0.7 mol of barium carbonate ($BaCO_3$), 0.15 mol of europium oxide ($Eu_2O_3$), 1 mol as Mg of basic magnesium carbonate (mass per mol of Mg: 93.17) and 5 mols of α-alumina ($Al_2O_3$) were weighed so that the chemical composition of a phosphor would be $Ba_{0.7}Eu_{0.3}MgAl_{10}O_{17}$ and mixed in a mortar for 30 minutes, then filled in an alumina crucible and fired at 1,200° C. for 5 hours in a box type furnace while circulating nitrogen, and after cooling, the fired product was taken out from the crucible and pulverized to obtain a precursor of a phosphor.

To this precursor, 0.3 wt % of $AlF_3$ was added, followed by pulverization and mixing for 30 minutes in a mortar. The mixture was filled in an alumina crucible and fired at 1,450° C. for 3 hours in a box type furnace in a nitrogen gas containing 4 wt % of hydrogen, and after cooling, the obtained fired product was pulverized to obtain a pale blue powder.

To this powder, 0.42 wt % of $AlF_3$ was added, followed by pulverization and mixing for 30 minutes in a mortar. The mixture was filled in an alumina crucible, and graphite in the form of beads was placed in a space around the crucible, followed by firing at 1,550° C. for 5 hours in a box type furnace by circulating nitrogen at a rate of 4 liter/min, and the obtained fired product was pulverized for 6 hours in a ball mill, classified by levigation and subjected to washing treatment with water to obtain a blue emitting phosphor (BAM).

The obtained blue emitting phosphor (BAM) had an emission peak wavelength of 455 nm and an emission peak half-value width of 51 nm.

<Temperature Dependency of Phosphors>

Among phosphors used in the above Examples II-2-1 to II-2-3 and Comparative Examples II-2-1 to II-2-3, with respect to KSF, CASH and BSS, the temperature dependency of the emission peak intensity was measured, and the results are shown in the following Table 23.

TABLE 23

| Red emitting phosphor | Type | Emission peak wavelength (nm) | Half-value width (nm) | Wavelength range of excitation band (nm) | Variation rate of emission peak intensity (%) | Notes |
|---|---|---|---|---|---|---|
| Ex. II-1-1 | KSF | 630 | 6 | 310-510 | 15 | 455 nm excitation |
| CASN | | 650 | 92 | 300-620 | 8 | 455 nm excitation |
| **Green emitting phosphor** | **Type** | **Emission peak wavelength (nm)** | **Half-value width (nm)** | **Wavelength range of emission (nm)** | **Variation rate of emission peak intensity (%)** | **Notes** |
| Prep. Ex. II-2 | BSS | 526 | 66 | 475-615 | 11 | 455 nm excitation |

With respect to BAM as the blue emitting phosphor prepared in the above Preparation Example II-3, the temperature characteristics under excitation with a wavelength of 400 nm were measured, whereby the variation rate of the emission peak intensity was 6%.

Method for Preparation of Optimized Color Filter

As the optimized color filter used in the above Examples II-2-1 to II-2-3 and Comparative Examples II-2-1 to II-2-3, the same one as "for Examples I-2, 4, 6, 8 to 10 and Comparative Examples I-3 and 4" disclosed in the above Production Example I-9 to 11, was used.

Group III of Examples: Study on Improvement of Durability

Using the following semiconductor light emitting device, phosphor and phosphor-containing layer-forming liquid, a semiconductor light emitting device in each of the following Examples and Comparative Examples was prepared, and evaluation of its durability was carried out by a lighting test.

Semiconductor Light Emitting Device

Production Example III-1-1 Vertical Semiconductor Light Emitting Device

As a semiconductor light emitting device (A), a 290 μm square chip "C460EZ290" manufactured by CREE was bonded to terminals at the bottom of a concave portion of a 3528SMD type PPA resin package by a silicone resin base transparent die bond paste. At that time, one bonding wire was used.

Production Example III-1-2 Horizontal Semiconductor Light Emitting Device

As a semiconductor light emitting device (A), a 350 μm square chip "GU35R460T" manufactured by Showa Denko K.K. was bonded to terminals at the bottom of a concave portion of a 3528SMD type PPA resin package by a silicone resin base transparent die bond paste. At that time, two bonding wires were used.

Phosphors

Preparation Example III-1 Red Emitting Phosphor $K_2TiF_6$:$Mn^{4+}$

As raw material compounds, 4.743 g of $K_2TiF_3$ and 0.2596 g of $K_2MnF_6$ were used so that the feedstock composition for phosphor would be $K_2Ti_{0.95}Mn_{0.05}F_6$. These raw material compounds were added, stirred and dissolved in 40 ml of hydrofluoric acid (concentration: 47.3 wt %) under atmospheric pressure at room temperature. After confirming that the respective raw material compounds were all dissolved, 60 ml of acetone was added at a rate of 240 ml/hr while stirring the solution to let a phosphor precipitate in the poor solvent. The obtained phosphor was washed with acetone and dried at 100° C. for one hour.

From the X-ray diffraction pattern of the obtained phosphor, it was confirmed that $K_2Ti_{1-x}Mn_xF_6$ was prepared. Further, the obtained red emitting phosphor had a main emission peak with a peak wavelength of 631 and a main emission peak half-value width of 7 nm, and the internal quantum efficiency was 65% as measured by the same method as described in the description in GROUP II of Examples.

Further, the thermally decomposed fluorine amount and the variation rate of the emission peak intensity of this phosphor were measured by the following method, and the results are shown in Table 24.

<Method for Measurement of Thermally Decomposed Fluorine Amount>

One gram of the phosphor was accurately weighed, then put in a platinum boat and set in an alumina core tube of a horizontal electric furnace. Then, the temperature in the furnace was raised while circulating argon gas at a flow rate of 400 ml/min, and when the temperature of the phosphor became 200° C., it was maintained for two hours.

Here, the entire amount of argon gas circulated in the furnace was absorbed in a KOH aqueous solution (concentration: 67 mM), and the absorbed liquid was analyzed by liquid chromatography to determine the thermally decomposed fluorine amount per minute per gram of the phosphor.

Preparation Example III-2 Red Emitting Phosphor $K_2SiF_6$:$Mn^{4+}$

As raw material compounds, 1.7783 g of $K_2SiF_6$ and 0.2217 g of $K_2MnF_6$ were used so that the feedstock composition for phosphor would be $K_2Si_{0.9}Mn_{0.1}F_6$. These raw material compounds were added, stirred and dissolved in 70 ml of hydrofluoric acid (47.3 wt %) under atmospheric pressure at room temperature. After confirming that the respective raw material compounds were all dissolved, 70 ml of acetone was added at a rate of 240 ml/hr while stirring the solution to let a phosphor precipitate in the poor solvent.

The obtained phosphor was washed with ethanol and dried at 130° C. for one hour to obtain 1.7 g of the phosphor. From the X-ray diffraction pattern of the obtained phosphor, it was confirmed that $K_2SiF_6$:Mn was prepared. Further, the obtained red emitting phosphor had a main emission peak with a peak wavelength of 630 and a half-value width of 7 nm, and the internal quantum efficiency was 94% as measured by the same method as described in the description in GROUP II of Examples.

Further, the thermally decomposed fluorine amount of this phosphor is shown in Table 24.

TABLE 24

THERMALLY DECOMPOSED FLUORINE AMOUNTS OF PHOSPHORS OBTAINED IN PREPARATION EXAMPLES III-1 AND 2

| | Composition | Thermally decomposed fluorine amount (μg/min) |
|---|---|---|
| Prep. Ex. 1 | $K_2Ti_{0.95}Mn_{0.05}F_6$ | 1.47 |
| Prep. Ex. 2 | $K_2Si_{0.9}Mn_{0.1}F_6$ | 0.07 |
| Reference Ex. | $CaF_2$ (reagent chemical) | 0.004 |

Production Example III-2 Production of Fluoride Complex Phosphor-Containing Layer (Material Layer B)-Forming Liquid 100 Parts by weight of a silicone resin SCR1016 manufactured by Shin-Etsu Chemical Co., Ltd. and 12 parts by weight of the phosphor prepared in the above Preparation Example III-1 or III-2 were mixed by an agitation defoaming apparatus AR-100 manufactured by Thinky Corporation to obtain a phosphor-containing layer-forming liquid (1) or (2).

Example III-1 Preparation of Semiconductor Light Emitting Device

Using a manually operated pipette, 4 μl of the phosphor-containing layer-forming liquid (1) obtained in the above Production Example III-2 was taken and injected to a semiconductor light emitting device having installed the vertical type semiconductor light emitting device as described in the above Production Example III-1-1. This semiconductor light emitting device was maintained in a desiccator box which can be evacuated, for 5 minutes under conditions of 25° C. and 1 kPa, thereby to remove air bubbles included during the injection or dissolved air or moisture. Thereafter, this semiconductor light emitting device was maintained at 70° C. for one hour and then at 150° C. for 5 hours to cure the forming liquid thereby to obtain a semiconductor light emitting device. With respect to the obtained semiconductor light emitting device, a lightning test was carried out by the method described hereinafter, to evaluate the durability.

Comparative Example III-1

A semiconductor light emitting device was obtained and evaluation of the durability was carried out in the same manner as in Example III-1 except that the semiconductor light emitting device was changed to the horizontal semiconductor light emitting device as disclosed in the above Production Example III-1-2, Example III-2

A semiconductor light emitting device was obtained, and evaluation of the durability was carried out in the same manner as in Example III-1 except that instead of the phosphor-containing layer-forming liquid (1), the phosphor-containing layer-forming liquid (2) was used.

Comparative Example III-2

A semiconductor light emitting device was obtained and evaluation of the durability was carried out in the same manner as in Example III-2 except that the semiconductor light emitting device was changed to the horizontal semiconductor light emitting device as disclosed in the above Production Example III-1-2.

<Lighting Test>

A current of 20 mA was conducted to a semiconductor device, and immediately after initiation of lighting (this point of time will be referred to as "0 hour"), the emission spectrum was measured by using a fiber multichannel spectrometer (USB2000 (integration wavelength range: 200 nm to 1,100 nm, light receiving system: integrating sphere (diameter: 1.5 inch) manufactured by Ocean Optics, Inc).

Then, using an aging apparatus, LED AGING SYSTEM 100 ch LED environmental test apparatus (YEL-51005 manufactured by Yamakatsu Electronics Industry Co., Ltd.), a driving current of 20 mA was continuously conducted to the semiconductor light emitting device under conditions of 85° C. and a relative humidity of 85%, and upon expiration of each of 50 hours, 100 hours, 150 hours and 200 hours, from the initiation of the current conduction, the emission spectrum was measured in the same manner as at the time of the above 0 hour. Simultaneously, the semiconductor light emitting device was stored without conducting any current under conditions of 85° C. and a relative humidity of 85%, and upon expiration of each of 50 hours, 100 hours, 150 hours and 200 hours, the emission spectrum was measured in the same manner as at the time of above 0 hour by conducting the current only at the time of the measurement.

The values of various emission characteristics (the entire luminous flux, luminance and chromaticity coordinates Cx, Cy) calculated from the emission spectrum obtained upon expiration of 200 hours are shown in Table 25, as relative values based on the measured value at 0 hour being 100%.

In the lighting test, the emission spectrum was measured by maintaining the spectrometer in a constant temperature tank of 25° C. to prevent data disturbance by a temperature change of the spectrometer itself.

TABLE 25

RESULTS OF DURABILITY TESTS OF SEMICONDUCTOR LIGHT EMITTING DEVICES OBTAINED IN EXAMPLES III-1 AND 2 AND COMPARATIVE EXAMPLES III-1 AND 2.

| | | Durability test results upon expiration of 200 hours | | | | | | | |
|---|---|---|---|---|---|---|---|---|---|
| | | Ex. III-1 | | Comp. Ex. III-1 | | Ex. III-2 | | Comp. Ex. III-2 | |
| | | Lighted | Not-lighted | Lighted | Not-lighted | Lighted | Not-lighted | Lighted | Not-lighted |
| Measured items | Entire luminous flux (μW) | 89% | 80% | 84% | 76% | 100% | 100% | 96% | 94% |
| | Luminance (lm) | 94% | 78% | 92% | 74% | 100% | 100% | 98% | 97% |
| | Cy | 94% | 101% | 89% | 94% | 105% | 100% | 95% | 99% |
| | Cx | 97% | 100% | 94% | 97% | 100% | 100% | 99% | 101% |

In Examples III-1 and III-2 wherein the vertical type semiconductor light emitting device was used, the decreases in the entire luminous flux and the luminance were small, and the color shift was little as compared with Comparative Examples III-1 and III-2 wherein the horizontal semiconductor light emitting device was used.

Further, from the comparison between Example III-1 and Example III-2, it was found that $K_2Si_{0.9}Mn_{0.1}F_6$ is superior in durability to $K_2Ti_{0.95}Mn_{0.05}F_6$ as a phosphor. The reason is considered to be such that $K_2Si_{0.9}Mn_{0.1}F_6$ has a lower solubility in water and its thermally decomposed fluorine amount is less.

Examples III-3 Preparation of Semiconductor Light Emitting Device 100 parts by weight of a two-pack type silicone resin SCR1016A manufactured by Shin-Etsu Chemical Co., Ltd. and 100 parts by weight of a curing agent SCR1016B were mixed and defoamed by an agitation defoaming apparatus AR-100 manufactured by Thinky Corporation. 2 μL of the obtained liquid mixture was injected to a light emitting device having the above-mentioned light emitting device installed and maintained in a desiccator box which can be evacuated, for 5 minutes under conditions of 25° C. and 1 kPa, thereby to remove air bubbles included during the injection or dissolved air or moisture. Thereafter, this semiconductor light emitting device was maintained under atmospheric pressure at 25° C. under a humidity of 50% to cure the above silicone resin layer thereby to form a material layer C.

Then, using a manually operated pipette, 2 μL of the above-mentioned fluoride complex phosphor-containing layer-forming liquid (1) was injected to the light emitting device and maintained at 100° C. for one hour and then at 150° C. for 5 hours to cure the material layer B thereby to obtain a semiconductor light emitting device.

Examples III-4 Preparation of Semiconductor Light Emitting Device

Using a manually operated pipette, 2 μL of the above-mentioned fluoride complex phosphor-containing layer-forming liquid (1) was injected to the semiconductor light emitting device and maintained at 100° C. for one hour and then at 150° C. for 5 hours to cure the material layer B.

100 parts by weight of a two-pack type silicone resin SCR1016A manufactured by Shin-Etsu Chemical Co., Ltd, and 100 parts by weight of a curing agent SCR1016B were mixed and defoamed by an agitation defoaming apparatus AR-100 manufactured by Thinky Corporation. 2 μL of the obtained liquid mixture was injected to the semiconductor light emitting device and maintained in a desiccator box which can be evacuated, for 5 minutes under conditions of 25° C. and 1 kPa, thereby to remove air bubbles included during the injection or dissolved air or moisture. Thereafter, this semiconductor light emitting device was maintained under atmospheric pressure at 25° C. under a humidity of 50% to cure the above silicone resin layer, to form a material layer D thereby to obtain a semiconductor light emitting device.

Examples III-5 Preparation of Semiconductor Light Emitting Device

Using a manually operated pipette, 0.5 μL of the above-mentioned fluoride complex phosphor-containing layer-forming liquid (1) was dropped on a fluorine-coated heat resistant sheet and maintained in a droplet shape at 100° C. for one hour and then maintained at 150° C. for 5 hours for curing thereby to form a material layer B.

A fluororesin (“EIGHT SEAL 3000” manufactured by Taihei Kasei Co., Ltd.) was dropped in an amount of 0.5 μL from above the material layer B and then maintained and cured at 120° C. for 20 minutes. Then, the fluorine coated heat resistant sheet contact side of the material layer B was faced upward, and 0.5 μL of the above fluororesin was dropped and cured in the same manner to form a material layer E around the material layer B.

100 parts by weight of a two-pack type silicone resin SCR1016A manufactured by Shin-Etsu Chemical Co., Ltd. and 100 parts by weight of a curing agent SCR1016B were mixed and defoamed by an agitation defoaming apparatus AR-100 manufactured by Thinky Corporation. 1 μL of the obtained liquid mixture was injected to the semiconductor light emitting device, then the material layer B coated by the above material layer E was put and further, 1 μL of the above liquid mixture was injected from above it and then maintained at 100° C. for one hour and then at 150° C. for 5 hours thereby to obtain a semiconductor light emitting device.

Examples III-6 Preparation of Semiconductor Light Emitting Device 100 parts by weight of a two-pack type silicone resin SCR1016A manufactured by Shin-Etsu Chemical Co., Ltd. and 100 parts by weight of a curing agent SCR1016B were mixed and defoamed by an agitation defoaming apparatus AR-100 manufactured by Thinky Corporation. 1 μL of the obtained liquid mixture was injected to a light emitting device having the above-mentioned light emitting device installed and maintained in a desiccator box which can be evacuated, for 5 minutes under conditions of 25° C. and 1 kPa, thereby to remove air bubbles included during the injection or dissolved air or moisture. Thereafter, this semiconductor light emitting device was maintained under atmospheric pressure at 25° C. under a humidity of 50% for 24 hours to cure the above silicone resin layer thereby to form a material layer C.

Then, using a manually operated pipette, 2 μL of the above-mentioned fluoride complex phosphor-containing layer-forming liquid (1) was injected to the light emitting device and maintained at 100° C. for one hour and then at 150° C. for 5 hours to cure the material layer B.

Further, on the material layer B, 1 μL of a liquid mixture of the above-mentioned SCR1016A and SCR1016B was injected and maintained in a desiccator box which can be evacuated, for 5 minutes under conditions of 25° C. and 1 kPa, to remove air bubbles included during the injection or dissolved air or moisture. Thereafter, this semiconductor light emitting device was maintained under atmospheric pressure at 25° C. under a humidity of 50% to cure the above silicone resin layer to form the material layer D thereby to obtain a semiconductor light emitting device.

Comparative Example III-3 Preparation of Semiconductor Light Emitting Device Using a manually operated pipette, 4 μL of the above-mentioned fluoride complex phosphor-containing layer-forming liquid (1) was injected to the semiconductor light emitting device and maintained in a desiccator box which can be evacuated, for 5 minutes under conditions of 25° C. and 1 kPa, to remove air bubbles included during the injection or dissolved air or moisture. Thereafter, it was maintained at 100° C. for one hour and then at 150° C. for 5 hours to obtain a semiconductor light emitting device.

With respect to the light emitting devices obtained in Examples III-3 to III-6 and Comparative Example III-3, the lighting test was carried out in the same manner as described above. The results are shown in Table 26.

TABLE 26

RESULTS OF DURABILITY TESTS OF SEMICONDUCTOR LIGHT EMITTING DEVICES OBTAINED IN EXAMPLES III-3 to III-6 AND COMPARATIVE EXAMPLE III-3.

| | | Durability test results upon expiration of 200 hours | | | | | | | | | |
|---|---|---|---|---|---|---|---|---|---|---|---|
| | | Ex. III-3 | | Ex. III-4 | | Ex. III-5 | | Ex. III-6 | | Comp. Ex. III-3 | |
| | | Lighted | Not-lighted | Lighted | Not-lighted | Lighted | Not-lighted | Lighted | Not-lighted | Lighted | Not-lighted |
| Measured items | Entire luminous flux (μW) | 89% | 92% | 90% | 84% | 76% | 95% | 103% | 97% | 84% | 76% |
| | Luminance (lm) | 97% | 97% | 100% | 92% | 74% | 95% | 96% | 93% | 92% | 74% |
| | Cy | 93% | 97% | 90% | 89% | 94% | 99% | 87% | 92% | 89% | 94% |
| | Cx | 99% | 99% | 97% | 94% | 97% | 99% | 96% | 97% | 94% | 97% |

From the foregoing results, it is evident that the light emitting devices having a material layer (material layer C to E) not containing a fluoride complex phosphor are excellent in that when stored in a non-lighted state under conditions of a temperature of 85° C. and a humidity of 85%, even upon expiration of 200 hours, the entire luminous flux and luminance maintaining rates are at least 80%, preferably at least 85%, more preferably at least 90%. Further, it has been found possible that by improving the layer structure, also the durability at the time of continuous lighting can be made to be at least 80%, preferably at least 85%, more preferably at least 90%.

INDUSTRIAL APPLICABILITY

According to the present invention, even with a LED backlight, it is possible to accomplish a broad color reproducibility as the entire image by adjustment with a color filter and at the same time, it is possible to provide a color image display device whereby red, green and blue emissions are carried out by one chip without impairing the productivity on mounting, and yet, adjustment of the white balance is easy, and thus, its industrial applicability is very high in the fields of the compositions for color filters, the color filters and the color image display devices.

In the foregoing, the present invention has been described with reference to specific embodiments, but it is apparent to those skilled in the art that various modifications are possible without departing from the concept and scope of the present invention.

The entire disclosures of Japanese Patent Application No. 2008-027506 filed on Feb. 7, 2008 and Japanese Patent Application No. 2008-227990 filed on Sep. 5, 2001 including specifications, claims, drawings and summaries are incorporated herein by reference in their entireties.

The invention claimed is:

1. A phosphor comprising a crystal phase having a chemical composition represented by the formula (1'):

$$M^{I'}_2M^{IV'}F_6:R \quad (1')$$

wherein $M^{I'}$ is at least one element selected from the group consisting of K and Na, $M^{IV'}$ is at least one metal element selected from the group consisting of Groups 4 and 14 of the Periodic Table comprising at least Si, and R is an activated element comprising at least $Mn^{4+}$, wherein the proportion of Mn based on the total cools of $M^{IV'}$ and Mn is at least 0.1 mol % and at most 6 mol %, and the specific surface area is at most 1.3 $m^2/g$, and wherein thermally decomposed F amount per 1 g of the phosphor is at most 2 μg/min.

2. The phosphor of claim 1, wherein the particle size distribution of the phosphor has one peak value.

3. The phosphor of claim 1, wherein the quantile deviation of the particle size distribution is at most 0.6.

4. The phosphor of claim 1, which has a weight-average median diameter $D_{50}$ of at least 10 μm and at most 30 μm.

5. The phosphor of claim 1, wherein the specific surface area is at most 1.0 $m^2/g$.

6. The phosphor of claim 1, wherein e quantile deviation of the particle size distribution is at most 0.25.

7. The phosphor of claim 1, which is a red emitting phosphor.

8. The phosphor of claim 1, which is a red emitting phosphor having at least one emission peak with a half-value width of at most 10 urn in a wavelength region of from 610 to 650 nm.

9. The phosphor of claim 1, which is a red emitting phosphor having a main emission peak with a half-value width of at most 10 nm in a wavelength region of from 610 to 650 nm.

10. The phosphor of claim 1, which is a red emitting phosphor and a fluoride complex phosphor.

11. The phosphor of claim 1, which has at least 0.01 μg/min thermally decomposed fluorine amount per 1 g of the phosphor at 200° C.

12. The phosphor of claim 1, which is a red emitting phosphor and comprises a crystal phase having a chemical composition represented by any one of the following formulae (1) to (8):

$$M^I_2[M^{IV}_{1-x}R_xF_6] \quad (1)$$

$$M^I_3[M^{III}_{1-x}R_xF_6] \quad (2)$$

$$M^{II}[M^{IV}_{1-x}R_xF_6] \quad (3)$$

$$M^I_3[M^{IV}_{1-x}R_xF_7] \quad (4)$$

$$M^I_2[M^{III}_{1-x}R_xF_5] \quad (5)$$

$$Zn_2[M^{III}_{1-x}R_xF_7] \quad (6)$$

$$M^I[M^{III}_{2-2x}R_{2x}F_7] \quad (7)$$

$$Ba_{0.65}Zr_{0.35}F_{2.70}:Mn^{4+} \quad (8)$$

wherein $M^I$ is at least one monovalent group selected from the group consisting of Li, Na, K, Rb, Cs and $NH_4$, $M^{II}$ is an alkaline earth metal element, $M^{III}$ is at least one metal element selected from the group consisting of Groups 3 and 13 of the Periodic Table, $M^{IV}$ is at least one metal element selected from the group consisting of Groups 4 and 14 of the Periodic Table, R is an activated element comprising at least Mn, and x is a numerical value of $0<x<1$.

13. A semiconductor light emitting device comprising the phosphor of claim 1.

* * * * *